(12) United States Patent
Ema

(10) Patent No.: US 7,253,525 B2
(45) Date of Patent: Aug. 7, 2007

(54) SEMICONDUCTOR DEVICE INCLUDING CONTACT HOLES BETWEEN ADJACENT CONDUCTOR PATTERNS AND METHOD FOR FABRICATING THE SAME

(75) Inventor: Taiji Ema, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/050,113

(22) Filed: Mar. 30, 1998

(65) Prior Publication Data

US 2001/0035544 A1 Nov. 1, 2001

(30) Foreign Application Priority Data

Oct. 20, 1997 (JP) .................................... 9-287466

(51) Int. Cl.
*H01L 23/52* (2006.01)
*H01L 29/40* (2006.01)

(52) U.S. Cl. ........................ 257/773; 257/758; 257/774; 257/900; 257/E23.142; 257/E23.145

(58) Field of Classification Search ................ 257/296, 257/301, 300, 344, 340, 773, 647, 648, 412, 257/413, 306, 309, 379, 532, 900, 758, 774, 257/E23.142, E23.144, E23.145
See application file for complete search history.

(56) References Cited

U.S. PATENT DOCUMENTS 5,498,889 A * 3/1996 Hayden ........................ 257/301
5,698,902 A * 12/1997 Uehara et al. ............... 257/773
5,728,595 A * 3/1998 Fukase ......................... 437/44
5,977,583 A * 11/1999 Hosotani et al. ............. 257/306
6,078,073 A * 6/2000 Habu et al. .................. 257/296
6,127,734 A * 10/2000 Kimura ........................ 257/774

FOREIGN PATENT DOCUMENTS

JP  8-37181       2/1996
JP  08037181 A  * 2/1996

* cited by examiner

*Primary Examiner*—Jerome Jackson
*Assistant Examiner*—Matthew E. Warren
(74) *Attorney, Agent, or Firm*—Westerman, Hattori, Daniels & Adrian, LLP.

(57) ABSTRACT

The semiconductor device comprises a semiconductor substrate 10, a conducting film 20 formed on the semiconductor substrate 10 and including two conductor patterns adjacent to each other; an etching stopper film covering the upper surface of the conducting film 20; an insulation film 28 which includes a contact hole which reaches the semiconductor substrate 10 between the two conductor patterns and the an end of which is positioned on the etching stopper film 22 on the two conductor patterns; and a sidewall insulation film 32 formed on the side walls of the conducting film 20 and of the etching stopper film 22 in the contact hole. The fluctuation of a contact hole size due to disalignment of the lithography can be restrained, and in the lithography step of opening the contact hole, the photoresist can have a large openings size, which facilitate the lithography step.

2 Claims, 53 Drawing Sheets

SEMICONDUCTOR DEVICE INCLUDING CONTACT HOLES BETWEEN ADJACENT CONDUCTOR PATTERNS AND METHOD FOR FABRICATING THE SAME

BACKGROUND OF THE INVENTION

The present invention relates to a semiconductor device and a method for fabricating the same, more specifically to a semiconductor device including contact holes which are micronized suitably to be used in a highly integrated DRAM and a method for fabricating the same.

As semiconductor devices are larger-scaled and higher-integrated, it is essential to micronize contact holes for interconnecting metallization layers. To this end various structures of semiconductor devices, which permit micronized contact holes to be formed, and various methods for fabricating semiconductor devices of the structures have been proposed.

Conventional semiconductor device fabricating methods which permit micronized contact holes to be formed will be explained with reference to FIGS. 47A-47C, 48A-48B, 49A-49C, 50A-50B, 51A-51D and 52A-52B. FIGS. 47A-47C and 48A-48B are views explaining a first conventional method. FIGS. 49A-49C and 50A-50B are views explaining a second conventional method. FIGS. 51A-51D and 52A-52B are views explaining a third conventional method.

In the first conventional method, two gate electrodes 204 are formed adjacent to each other on a silicon substrate 200 through a gate insulation film 202.

Then, ions are implanted into the silicon substrate 200 with the gate electrodes 204 as a mask to form an impurity diffused layer 206 in the silicon substrate 200 on both sides of the gate electrodes 204.

Then, a silicon oxide film is deposited on the entire surface by, e.g., CVD (Chemical Vapor Deposition) method, and the surface of the silicon oxide film is planarized to form an inter-layer insulation film 208 of the silicon oxide film (FIG. 47A).

A contact hole which reaches the impurity diffused layer 206 formed in the silicon substrate 200 between the gate electrodes 204 is formed in the inter-layer insulation film 208. First, the contact hole 210 is opened between the gate electrodes 204 by the usual lithography (FIG. 47B), and then a silicon oxide film is grown on the entire surface, and a sidewall insulation film 212 of the contact hole 210 is formed by anisotropic etching which vertically advances (FIG. 47C).

In the first conventional method the contact hole 210 which thus arrives at the impurity diffused layer 206 is formed, whereby the contact hole 210 can have a size of below a resolution size limit.

The state shown in FIG. 47C is based on the assumption that no disalignment takes place in the lithography step.

However, in the first conventional method when disalignment takes place in the lithography step for forming the contact hole, the gate electrode 204 is often exposed in the contact hole 210 as shown in FIG. 48A. In this case, the disalignment is small, the gate electrodes 204 are completely covered with the sidewall insulation film 212, but when the disalignment is large as shown in FIG. 48B, a surface of the gate electrode 204 is exposed in the contact hole 210, and a metallization layer (not shown) formed in the contact hole 210 short-circuits with the gate electrode 204.

In view of this, in the second conventional method, as shown in FIGS. 49A-49C, an etching stopper film 214 having etching characteristics different from those of the inter-layer insulation film 208 is in advance formed on the gate electrodes 204.

In the thus fabricated semiconductor device if the contact hole 210 is extended over the gate electrode 204 by disalignment (FIG. 50A), the gate electrodes 204 are completely covered with the sidewall insulation film 212 and the etching stopper film 214, whereby short-circuit between a metallization layer (not shown) formed in the contact hole 210 and the gate electrodes 204 can be prevented.

As means for forming a contact hole, the so-called SAC (self-aligned contact) technique for opening a contact hole in self-alignment with a gate electrode is known.

The third conventional method using the SAC technique will be explained.

First, a device isolation film 222 is formed on a silicon substrate 220. The device isolation film 222 is formed in, e.g., the staggered arrangement as exemplified in FIG. 52A.

Then, a gate insulation film 224 is formed on the surface of the silicon substrate 220 by thermal oxidation.

Subsequently, a polycrystalline silicon film to be a gate electrode, and a silicon nitride film to be an etching stopper film are deposited on the entire surface by, e.g., CVD method, and these films are processed in a pattern of the gate electrode. The gate electrode 226 with the upper surface covered with the etching stopper film 228 is thus formed (FIG. 51A).

Then, a silicon nitride film is deposited by, e.g., CVD method, and anisotropic etching in which the etching vertically advances is performed to form a sidewall insulation film 230 on the side walls of the gate electrode 228 and the of the etching stopper film 228 (FIG. 51B).

Next, a silicon oxide film is deposited by, e.g., CVD method, and then the surface of the silicon oxide film is planarized by, e.g., CMP (Chemical Mechanical Polishing) method to form an inter-layer insulation film 232 of the silicon oxide film (FIG. 51C).

Subsequently, a photoresist 234 having an opening having an opening on a device region defined by the device isolation film 222 as shown in FIG. 52B is formed, and the inter-layer insulation film 232 is etched with the photoresist 234 as a mask (FIG. 50D).

For this etching, etching conditions which make an etching rate of the silicon nitride film forming the etching stopper film 228 and the sidewall insulation film 230 sufficiently lower than an etching rate of the silicon oxide film forming the inter-layer insulation film 232 are selected, whereby the etching stopper film 228 and the sidewall insulation film 230 in the photoresist 234 are not etched with the inter-layer insulation film 232 alone etched. That is, the contact hole 236 can be opened in self-alignment with the gate electrode 224.

However, in the above-described first conventional method, as described above, the gate electrode 204 is often exposed in the contact hole 210 due to disalignment of the lithography.

In the first and the second conventional methods, the contact hole often has size fluctuations due to disalignment in the lithography step.

That is, without the disalignment, the ends of the contact hole is defined by the sidewall insulation film 212 formed on the side walls of the inter-layer insulation film 208 as shown in FIGS. 47C and 49C. When the disalignment takes place, however, as shown in FIGS. 48B and 50B, one end of the contact hole is defined by the sidewall insulation film 212 formed on the side walls of the inter-layer insulation film 208, and the other end of the contact hole is defined by the sidewall insulation film formed on the side walls of the gate electrode 204. Consequently, the contact hole often has a smaller size as the disalignment is larger.

In the third conventional method, the contact holes which are adjacent to each other with the gate electrode therebetween are formed in respective patterns different from each other (FIG. 52B). This is because in forming in one pattern a plurality of contact holes adjacent to each other, in a case that plugs are buried in the respective contact holes by polishing, there is a high risk that the respective plugs may be short-circuited with each other, and in isolating a conductor by lithography, there is an inconvenience that residues tend to take place on the step of the contact hole, and the etching is thus very difficult.

However, in a case that as in the third conventional method, contact holes are very adjacent to each other, it is necessary that a hole size in the photoresist formed by lithography is precise, and disalignment causes the above-described fluctuations of a contact hole size, and control of disalignments must be strict.

In the third conventional method, the sidewall insulation film is formed mainly of silicon nitride film, but there is an inconvenience that the sidewall insulation film of silicon nitride film deteriorates hot carrier immunity of a transistor than the sidewall insulation film of silicon oxide film.

It is empirically known that silicon nitride film formed on an inclined portion has a higher etching rate than that formed on a flat portion. In the third conventional method, in which the inter-layer insulation film is etched with the sidewall insulation film as a mask, an etching selectivity for the silicon nitride film of the inclined region where the upper surface of the sidewall insulation film cannot be sufficiently ensured with a result that the gate electrode is often exposed in the contact hole.

SUMMARY OF THE INVENTION

An object of the present invention is to provide a semiconductor device which allows an opening size of a photoresist to be less precise, has little fluctuation of a contact hole size due to disalignment of lithography, and has good resistance to hot carrier effect of a transistor, and a method for fabricating the semiconductor device.

The above-described object can be achieved by a semiconductor device comprising: a base substrate; a first conducting film formed on the base substrate and including two conductor patterns adjacent to each other; an etching stopper film covering an upper surface of the first conducting film; a first insulation film which is an insulation film formed on the etching stopper film and the base substrate and includes a contact hole which reaches the base substrate between the two conductor patterns and an end of which is positioned on the etching stopper film on the conductor patterns; and a sidewall insulation film formed on side walls of the two conductor patterns of the first conducting film and of the etching stopper film on the two conductor patterns in the contact hole, whereby fluctuation of a contact hole size due to disalignment of the lithography can be restrained, and in the lithography step of opening the contact hole, the photoresist can have a large openings size, which facilitate the lithography step.

The above-described object can be also achieved by a semiconductor device comprising: a base substrate; a first conducting film formed on the base substrate and including a plurality of conductor patterns adjacent to each other; an etching stopper film covering an upper surface of the first conducting film; a first insulation film which is an insulation film buried between said a plurality of conductor patterns and includes a contact hole which reaches the base substrate between the conductor patterns and having an end thereof defined by the conductor patterns; and a sidewall insulation film formed on side walls of the first conducting film and of the etching stopper film in the contact hole, whereby fluctuation of a contact hole size due to disalignment of the lithography can be restrained, and in the lithography step of opening the contact hole, the photoresist can have a large openings size, which facilitate the lithography step.

In the above-described semiconductor device, it is preferable that a plurality of the contact holes are formed adjacent to each other with the conductor patterns therebetween, whereby in a case that a plurality of contact holes which are adjacent to each other with the conductor patterns therebetween, it suffices to form a photoresist having one opening including the contact regions, which permits the photoresist to have a larger opening size in the lithography step of opening the contact holes with a result that the lithography step can be simple.

In the above-described semiconductor device, it is preferable that the device further comprises: a second insulation film having a lower dielectric constant than the etching stopper film between the first conducting film and the etching stopper film. By providing the second insulation film of a lower dielectric constant, a parasitic capacitance between metallization layers can be smaller.

In the above-described semiconductor device, it is preferable that the etching stopper film is formed of conducting film. The present invention can be realized by forming the etching stopper film not only of an insulation film but also a conducting film.

In the above-described semiconductor device, it is preferable that the device further comprises: a second conducting film formed on the first insulation film and connected to the base substrate in the contact hole, and wherein the etching stopper film is formed only in a region where the first conducting film intersects the second conducting film. In a case that the etching stopper film is formed in the conducting films, it is preferable that the etching stopper film is processed in the same pattern of the second conducting film so that the second conducting film formed thereon is not short-circuited. Consequently, the etching stopper film is left in regions where the first conducting film intersects the second conducting film.

In the above-described semiconductor device, it is preferable that the sidewall insulation film is formed of a material having etching characteristics substantially equal to those of the etching stopper film, and formed on an entire region of the side walls of the first conducting film and the etching stopper film. The present invention is applicable to the conventional semiconductor device having the conducting film covered with the etching stopper film, whereby the lithography step can be simple.

The above-described object can be also achieved by a semiconductor device comprising: a semiconductor substrate; a plurality of word lines formed on the semiconductor substrate and extended in a first direction; an etching stopper film covering upper surfaces of the word lines; a first insulation film which is an insulation film formed on the etching stopper film and the semiconductor substrate and includes a contact hole which reaches the semiconductor substrate between the word lines and having an end of which is positioned on the etching stopper film on the word lines; and a sidewall insulation film formed on side walls of the word lines and the etching stopper film in the contact hole. The contact hole structure of the present invention is applicable to bit line contact holes of a DRAM (Dynamic Random Access Memory). Accordingly, in fabrication process of the DRAM, fluctuation of a contact hole size due to disalignment of the lithography can be restrained. In the lithography step of opening the contact hole, the photoresist can have a large opening size. Accordingly, the lithography step can be simple.

In the above-described semiconductor device, it is preferable that the device further comprises: a plug buried in the contact hole. By burying the plug in the contact hole, especially the storage electrode contact hole can have a low aspect ratio, which simplifies the etching step of the contact hole forming process.

The above-described object can be also achieved by a semiconductor device comprising: a semiconductor substrate; a plurality of word lines formed on the semiconductor substrate and extended in a first direction; a first insulation film formed on the word lines and the semiconductor substrate; a plurality of bit lines formed on the first insulation film and extended in a second direction which intersects the first direction; an etching stopper film covering upper surfaces of the bit lines; a second insulation film which is an insulation film formed on the etching stopper film and the first insulation film, and includes a contact hole formed between the bit lines and having an end thereof positioned on the etching stopper film on the bit lines; a sidewall insulation film formed on side walls of the bit lines and the etching stopper film in the contact hole; and a capacitor having one electrode connected to the semiconductor substrate through the contact hole. The contact hole structure of the present invention is applicable to the storage electrode contact hole of a DRAM. Accordingly, in fabrication process of the DRAM, fluctuation of a contact hole size due to disalignment of the lithography can be restrained. In the lithography step of opening the contact hole, the photoresist can have a large opening size. Accordingly, the lithography step can be simple.

The above-described object can be also achieved by a semiconductor device comprising: a semiconductor substrate; a plurality of word lines formed on the semiconductor substrate and extended in a first direction; a first insulation film formed on the word lines and the semiconductor substrate; a plurality of bit lines formed on the first insulation film and extended in a second direction which intersects the first direction; an etching stopper film covering upper surfaces of the bit lines; a second insulation film which is an insulation film buried between said a plurality of bit lines, and includes a contact hole formed between the bit lines and having an end thereof defined by the bit lines; a sidewall insulation film formed on side walls of the bit lines and the etching stopper film in the contact hole; and a capacitor having one electrode connected to the semiconductor substrate through the contact hole. The contact hole structure of the present invention is applicable to the storage electrode contact hole of a DRAM. Accordingly, in fabrication process of the DRAM, fluctuation of a contact hole size due to disalignment of the lithography can be restrained. In the lithography step of opening the contact hole, the photoresist can have a large opening size. Accordingly, the lithography step can be simple.

In the above-described semiconductor device, it is preferable that said one electrode of the capacitor is connected to the semiconductor substrate through a plug buried in the first insulation film. By burying beforehand the plug in the first insulation film, the storage electrode contact hole can have a low aspect ratio, which simplifies the etching for forming the contact hole.

The above-described object can be achieved by a method for fabricating a semiconductor device comprising: a first conducting film forming step of forming on a base substrate a first conducting film including a plurality of conductor patterns adjacent to each other, and having an upper surface thereof covered with an etching stopper film; a first insulation film forming step of forming a first insulation film buried between said a plurality of conductor patterns; a contact hole forming step of etching the first insulation film with the etching stopper film as a mask to form a contact hole which reaches the base substrate between the conductor patterns and an end of which is defined by the conductor patterns; and a sidewall insulation film forming step forming a sidewall insulation film on side walls of the first conducting film and the etching stopper film in the contact hole, whereby fluctuation of a contact hole size due to disalignment of the lithography can be restrained, and in the lithography step of opening the contact hole, the photoresist can have a large openings size, which facilitate the lithography step.

In the above-described method for fabricating the semiconductor device, it is preferable that in the contact hole forming step the first insulation film is etched with a photoresist having an opening extended over said a plurality of conductor patterns and the etching stopper film as a mask to form a plurality of the contact holes in the opening. By the etching by using as a mask a photoresist having an opening extended over a plurality of conductor patterns, a plurality of contact holes can be formed with the opening, which allows the photoresist to have a large opening size in the lithography step of opening the contact holes. As a result, the lithography step can be simple.

In the method for fabricating the semiconductor device, it is preferable that the method further comprises before the first conducting film forming step, a device isolation film forming step of forming a device isolation film buried in the base substrate. By forming the device isolation film by such trench isolation technique, the substrate can be retained flat even after the device isolation film is formed, which is very effective to apply the contact hole forming technique of the present invention.

The above-described object can be also achieved by a method for fabricating a semiconductor device comprising: a word line forming step of forming on a semiconductor substrate a plurality of word lines extended in a first direction and having upper surfaces thereof covered with an etching stopper film; a first insulation film forming step of forming a first insulation film on the etching stopper film and the semiconductor substrate; a contact hole forming step of forming in the first insulation film a contact hole which reaches the semiconductor substrate between the word lines, and an end of which is positioned on the etching stopper film on the word lines; a sidewall insulation film forming step of forming a sidewall insulation film on side walls of the word lines and of the etching stopper film in the contact hole; and a bit line forming step of forming on the first insulation film a plurality of bit lines extended in a second direction which intersects the first direction and connected to the semiconductor substrate through the contact hole. The present invention is applicable to the forming method of bit line contact holes of a DRAM. Accordingly, in fabrication process of the DRAM, fluctuation of a contact hole size due to disalignment of the lithography can be restrained. In the lithography step of opening the contact hole, the photoresist can have a large opening size. Accordingly, the lithography step can be simple.

The above-described object can be achieved by a method for fabricating a semiconductor device comprising: a word line forming step of forming on a semiconductor substrate a plurality of word lines extended in a first direction and having upper surfaces thereof covered with an etching stopper film; a first insulation film forming step of forming a first insulation film buried between the word lines; a contact hole forming step of etching the first insulation film with the etching stopper film as a mask to form a contact hole which reaches the semiconductor substrate between the word lines and an end of which is defined by the word lines; a sidewall insulation film forming step of forming a sidewall insulation film on side walls of the word lines and the etching stopper film in the contact hole; and a bit line forming step of forming on the first insulation film a plurality of bit lines extended in a second direction which intersects the first direction and connected to the semiconductor substrate through the contact hole. The present invention is applicable to the method for fabricating the conventional semiconductor device having the conducting film covered with the etching stopper film, whereby the lithography step can be simple.

The above-described object can be achieved by a method for fabricating a semiconductor device comprising: a word line forming step of forming on a semiconductor substrate a plurality of word lines extended in a first direction and having upper surfaces thereof covered with an etching stopper film; a sidewall insulation film forming step of forming a sidewall insulation film having etching characteristics substantially equal to those of the etching stopper film on side walls of the word lines and of the etching stopper film; a first insulation film forming step of forming a first insulation film buried between the word lines with the sidewall insulation film formed on; a contact hole forming step of etching the first insulation film with the etching stopper film and the sidewall insulation film as a mask to form a contact hole which reaches the semiconductor substrate between the word lines and an end of which is defined by the sidewall insulation film; and a bit line forming step of forming on the first insulation film a plurality of bit lines extended in a second direction which intersects the first direction and connected to the semiconductor substrate through the contact hole. The present invention is applicable to the forming method of bit line contact holes of a DRAM. Accordingly, in fabrication process of the DRAM fluctuation of a contact hole size due to disalignment of the lithography can be restrained. In the lithography step of opening the contact hole, the photoresist can have a large opening size. Accordingly, the lithography step can be simple.

In the method for fabricating the semiconductor device, it is preferable that in the contact hole forming step, the first insulation film is etched with a photoresist including an opening extended over the word lines, and the etching stopper film as a mask to form a plurality of the contact holes in the opening. By the etching by using as a mask a photoresist having an opening extended over a plurality of word lines a plurality of contact holes can be formed in the opening, which allows the photoresist to have a large opening size in the lithography step of opening the contact holes. As a result, the lithography step can be simple.

In the method for fabricating the semiconductor device, it is preferable that the method further comprises before the bit line forming step, a plug forming step of forming a plug buried in the contact hole. With the surface of the substrate kept flat, the contact hole can be opened, which facilitates forming the buried plug in the contact hole.

The above-described object can be also achieved by a method for fabricating a semiconductor device comprising: a word line forming step of forming on a semiconductor substrate a plurality of word lines extended in a first direction; a first insulation film forming step of forming a first insulation film on the semiconductor substrate with the word lines formed on; a bit line forming step of forming on the fist insulation film a plurality of bit lines extended in a second direction which intersects the first direction and having upper surfaces thereof covered with an etching stopper film; a second insulation film forming step of forming a second insulation film on the etching stopper film and the first insulation film; a contact hole forming step of forming in the second insulation film a contact hole which is formed between the bit lines and an end of which is positioned on the etching stopper film on the bit lines; a sidewall insulation film forming step of forming a sidewall insulation film on side walls of the bit lines and of the etching stopper film in the contact hole; and a capacitor forming step of forming on the second insulation film a capacitor having one electrode connected to the semiconductor substrate through the contact hole. The present invention is applicable to the forming method of the storage electrode contact hole of a DRAM. Accordingly, in fabrication process of the DRAM fluctuation of a contact hole size due to disalignment of the lithography can be restrained. In the lithography step of opening the contact hole, the photoresist can have a large opening size. Accordingly, the lithography step can be simple.

The above-described object can be also achieved by a method for fabricating a semiconductor device comprising: a word line forming step of forming on a semiconductor substrate a plurality of word lines extended in a first direction; a first insulation film forming step of forming a first insulation film on the semiconductor substrate with the word lines formed on; a bit line forming step of forming on the first insulation film a plurality of bit lines extended in a second direction which intersects the first direction and having an upper surface thereof covered with an etching stopper film; a second insulation film forming step of forming a second insulation film buried between the bit lines; a contact hole forming step of etching the second insulation film with the etching stopper film as a mask to form a contact hole which is formed on between the bit lines and an end of which is defined by the bit lines; a sidewall insulation film forming step of forming a sidewall insulation film on side walls of the bit lines and of the etching stopper film in the contact hole; and a capacitor forming step of forming on the second insulation film a capacitor having one electrode connected to the semiconductor substrate through the contact hole. The present invention is applicable to the forming method of the storage electrode contact hole of a DRAM. Accordingly, in fabrication process of the DRAM fluctuation of a contact hole size due to disalignment of the lithography can be restrained. In the lithography step of opening the contact hole, the photoresist can have a large opening size. Accordingly, the lithography step can be simple.

In the above-described method for fabricating the semiconductor device, it is preferable that in the contact hole forming step, the second insulation film is etched with a photoresist having a pattern which alternately covers a region between the word lines, and the etching stopper film as a mask to form a plurality of the contact holes. In the storage electrode contact hole forming step, a plurality of contact holes can be opened by using the photoresist having stripe pattern which alternately covers the regions between the word lines, the photoresist can have a large opening size in the lithography step of opening the contact holes. Accordingly, the lithography step can be simple.

In the above-described method for fabricating the semiconductor device, it is preferable that in the contact hole forming step, the first insulation film and the second insulation film are etched to form a contact hole which reaches the semiconductor substrate and an end of which is defined by the bit lines and the word lines.

In the above-described method for fabricating the semiconductor device, it is preferable that in the bit line forming step, the etching stopper film is formed of a conductor; and in the capacitor forming step the etching stopper film is processed in the same pattern as said one electrode of the capacitor. In a case that the etching stopper film is formed of the conducting film, the etching stopper film is processed in the same pattern as the storage electrode so that the storage electrode formed thereon is not short-circuited.

BRIEF DESCRIPTION OF THE DRAWINGS

FIGS. 37A-37C, 38A-38B, 39A-30B, 40A-40C, 41A-41B and 42A-42B are sectional views of the semiconductor device according to the ninth embodiment of the present invention in the steps of the method for fabricating the semiconductor device, which show the method.

DETAILED DESCRIPTION OF THE INVENTION

A First Embodiment

The semiconductor device and the method for fabricating the semiconductor device according to a first embodiment of the present invention will be explained with reference to FIGS. 1 and 2A-2D.

Figure 1:
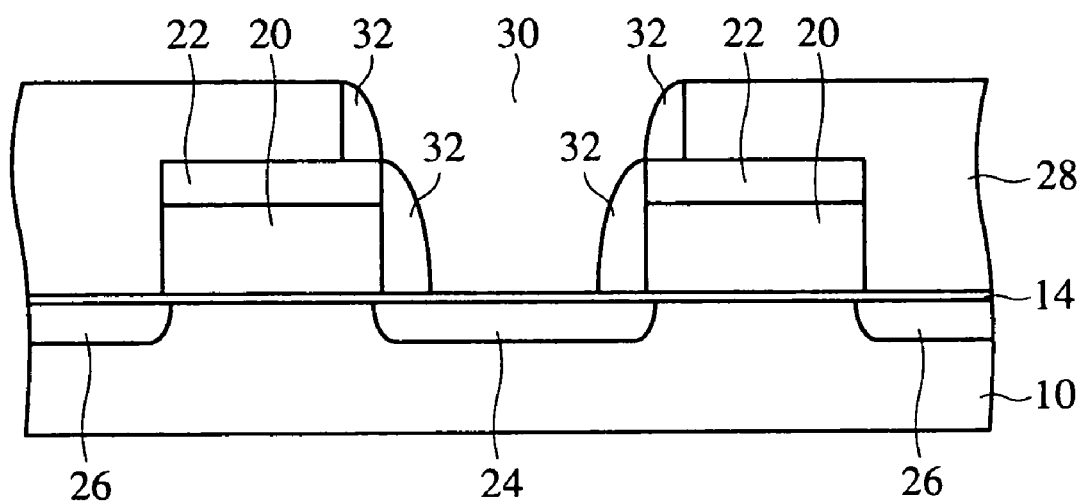
FIG. 1 is a diagrammatic sectional view of the semiconductor device according to a first embodiment of the present invention, which shows a structure thereof.

FIG. 1 is a diagrammatic sectional view of the semiconductor device according to the present embodiment, which shows a structure thereof. FIGS. 2A-2D are sectional views of the semiconductor device according to the present embodiment in the steps of the method for fabricating the same, which show the method.

First, the structure of the semiconductor device according to the present embodiment will be explained with reference to FIG. 1.

Two gate electrodes 20 are formed adjacent to each other on a silicon substrate 10 through a gate insulation film 14. An etching stopper film 22 of a silicon nitride film is formed on the gate electrodes 20. Impurity diffused layers 24, 26 are formed in the silicon substrate on both sides of the gate electrodes 20. An inter-layer insulation film 28 having a contact hole 30 opened on the impurity diffused layer 24 is formed on a MOSFET having this structure. A sidewall insulation film 32 of a silicon oxide film is formed on the side walls of the inter-layer insulation film 28 and the side walls of the gate electrode 20 and the etching stopper film 22 in the contact hole 30.

The semiconductor device according to the present embodiment is characterized in that the ends of the contact hole 30 formed in the inter-layer insulation film 28 are extended over the gate electrodes 20. Such contact hole provides various effects of facilitating the lithography step for forming the contact hole.

The semiconductor device according to the present embodiment is also characterized in that the sidewall insulation film 32 is formed of a silicon oxide film.

Following the steps of the method for fabricating the semiconductor device according to the present embodiment, the semiconductor device according to the present embodiment and the method for fabricating the same will be explained.

First the silicon substrate 10 thermally oxidized to form the gate insulation film 14 on the surface of the silicon substrate 10.

Then, a polycrystalline silicon film 16 is formed on the gate insulation film 14 by, e.g., CVD method. The polycrystalline silicon film 16 is to be the gate electrodes 20.

Figure 2A:
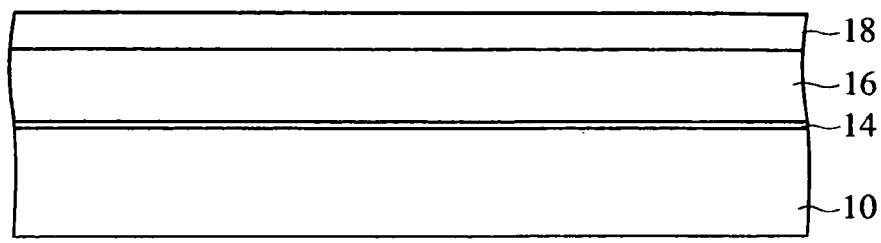
FIGS. 2A-2D are sectional views of the semiconductor device according to the first embodiment of the present invention in the steps of the method for fabricating the semiconductor device, which show the method.

Subsequently, a silicon nitride film 18 is deposited on the polycrystalline silicon film 16 by, e.g., CVD method (FIG. 2A). The silicon nitride film 18 is to be the etching stopper film 22.

Then, the silicon nitride film 18 and the polycrystalline silicon film 16 are processed in the same pattern to form the gate electrodes 20 having the upper surfaces covered with the etching stopper film 22.

Figure 2B:
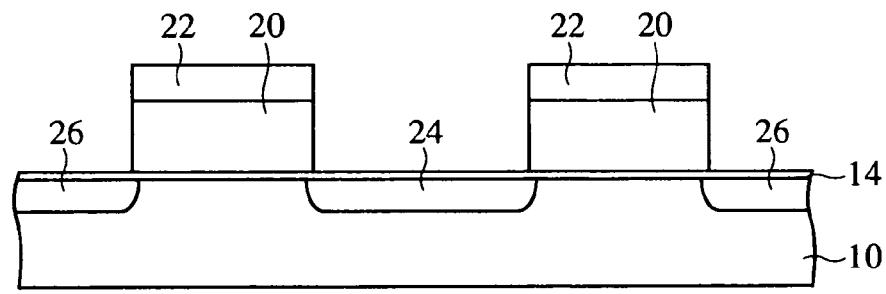

Then, e,g., phosphorus ions are implanted in the silicon substrate 10 with the gate electrodes 20 as a mask to form the impurity diffused layers 24, 26 (FIG. 2B).

Subsequently, a silicon oxide film is deposited on the entire surface by, e.g., CVD method to form the inter-layer insulation film 28.

Then, a photoresist (not shown) having a pattern of the contact hole for exposing the impurity diffused layer 24 is formed by the usual lithography technique.

At this time, the photoresist is formed so that the ends of the contact hole are extended over the gate electrodes 20. This permits the lithography step to have a large alignment allowance, and facilitates the lithography step because it is not necessary to expose a fine hole pattern.

Figure 2C:
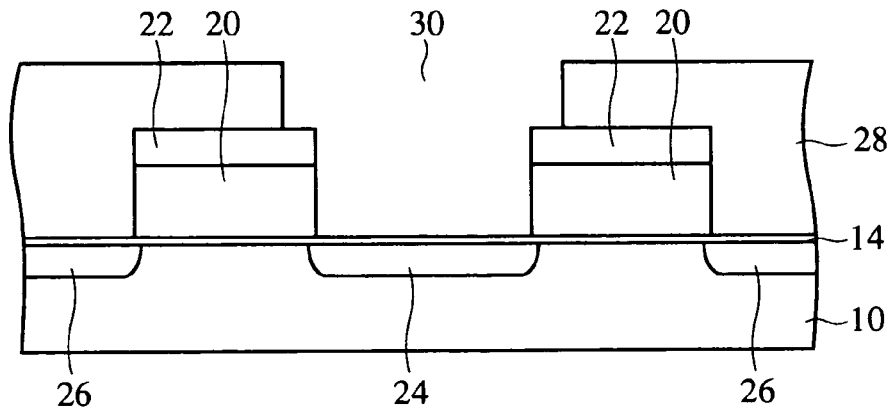

Then, the inter-layer insulation film 28 is etched with the thus-formed photoresist as a mask to open the contact hole 30 for exposing the impurity diffused layer 24 (FIG. 2C).

The inter-layer insulation film 28 is etched under conditions which provide etching selectivity with respect to the etching stopper film 22. Thus, the contact hole 30 can be opened without damaging the gate electrodes 20.

The photoresist is so arranged that the ends of the contact hole are extended over the gate electrodes 20 even when disalignment takes place, whereby even if disalignment takes place in forming the photoresist, an area of the impurity diffused layer 24 exposed in the contact hole 30 does not change. Accordingly, contact characteristics on the impurity diffused layer 24 can be formed stable.

Even when etching conditions which provide etching selectivity with respect to the etching stopper film 22, it has been empirically found that the reduction in the film thickness takes place on the etching stopper film, e.g., the sidewall insulation film, which are not formed on the flat portion. In the method for fabricating the semiconductor device according to the present embodiment, however, the etching stopper film 22 is formed only on the flat portions of the gate electrodes 20 and the etching stopper film at the side wall portion is not necessary, whereby the contact hole 30 can be opened while the etching stopper film 22 is prevented from the reduction in the film thickness.

Figure 2D:
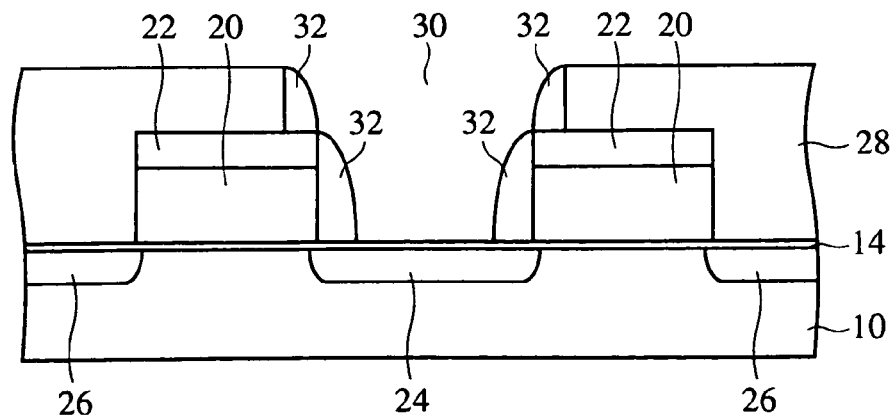

Subsequently, a silicon oxide film is deposited on the entire surface by, e.g., CVD method, and then anisotropic etching, in which the etching vertically advances, is used to form the sidewall insulation film 32 on the side walls of the inter-layer insulation film 28, the gate electrodes 20 and the etching stopper film 22 (FIG. 2D).

It is useful to grown an about 3 nm-thick oxide film by thermal oxidation before deposition of the above-described silicon oxide film to recover the gate oxide film on the ends of the gate electrodes from etching damages.

By thus forming the sidewall insulation film 32, the gate electrodes 20 are covered with the silicon nitride film 22 and the sidewall insulation film 32 without being exposed in the contact hole 30.

It is unnecessary that the contact hole is opened by the self-alignment in the sidewall insulation film 32, which allows the sidewall insulation film 32 to be formed of silicon oxide film. In comparison with the conventional semiconductor device in which the sidewall insulation film 32 is formed of a silicon nitride film, the transistor can have higher hot carrier immunity.

Then, a metallization layer or a plug (not shown) are formed in connection with the impurity diffused layer 24 through the contact hole 30.

As described above, according to the present embodiment, the contact hole 30 for exposing the ends of the gate electrodes 20 are opened, and then the sidewall insulation film 32 is formed on the side walls of the gate electrodes 20, whereby even if disalignment takes place in the lithography for opening the contact hole 30, an area of the contact on the upper surface of the impurity diffused layer 24 never changes. Accordingly, the contact characteristics on the impurity diffused layer 24 can be formed stable.

It is not necessary to form the contact hole by self-alignment with the sidewall insulation film formed on the side walls of the gate electrodes, which permits the sidewall insulation film to be formed of a silicon oxide film. Accordingly in comparison with the conventional semiconductor device, whose sidewall insulation film is formed of silicon nitride film, the transistor can have higher hot carrier immunity.

A Second Embodiment

The semiconductor device and a method for fabricating the same according to a second embodiment of the present invention will be explained with reference to FIGS. 3A-3B, 4, 5A-5C and 6A-6C.

Figure 3A:
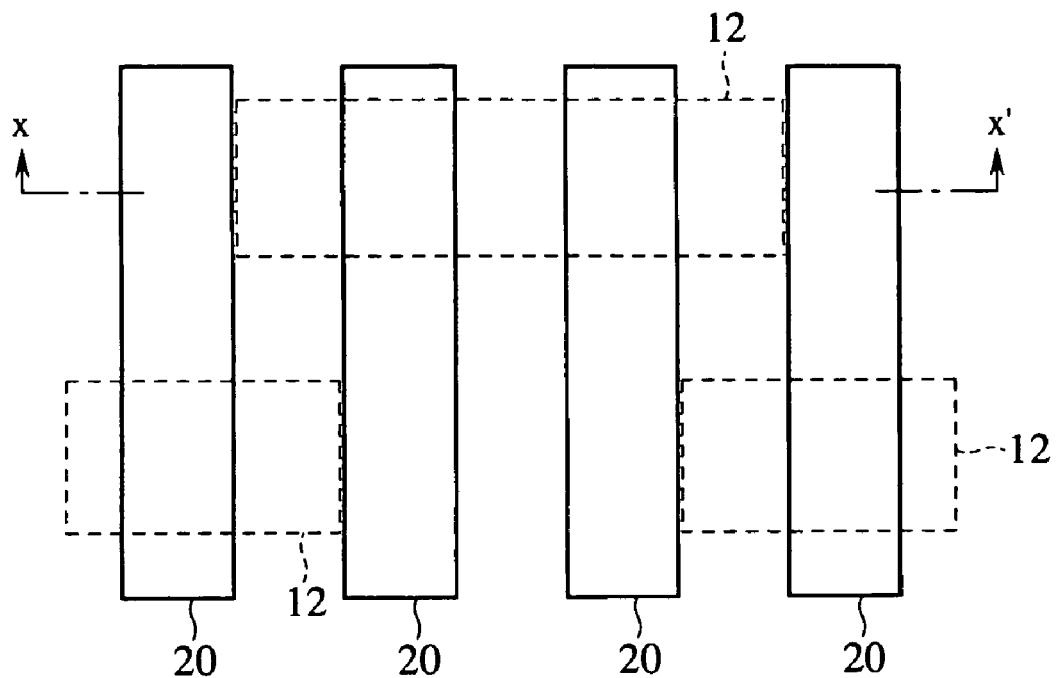
FIGS. 3A and 3B are plan views of the semiconductor device according to a second embodiment of the present invention, which show a structure thereof.
Figure 3B:
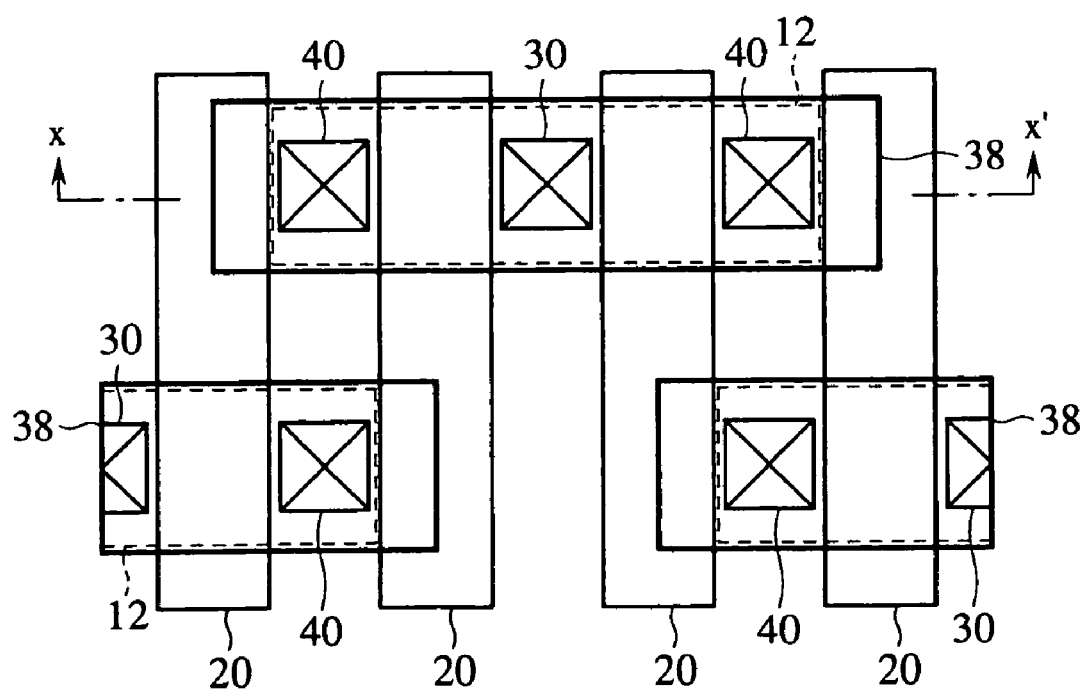
Figure 4:
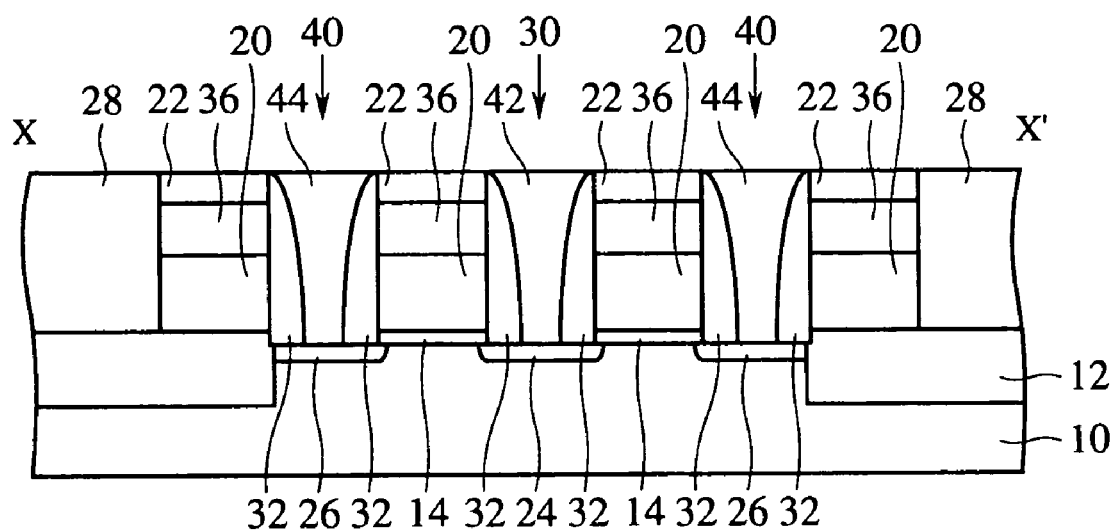
FIG. 4 is a diagrammatic sectional view of the semiconductor device according to the second embodiment of the present invention, which shows a structure thereof.

FIGS. 3A and 3B are plan views of the semiconductor device according to the present embodiment, which show a structure thereof. FIG. 4 is a diagrammatic sectional view of the semiconductor device according to the present embodiment, which shows the structure thereof. FIGS. 5A-5C and 6A-6C are sectional views of the semiconductor device according to the present embodiment in the steps of the method for fabricating the same, which explain the method.

First, with reference to FIGS. 3A-3B and 4, the structure of the semiconductor device according to the present embodiment will be explained.

A device isolation film 12 for isolating devices is formed on a silicon substrate 10. Gate electrodes 20 are formed through a gate insulation film 14 on the silicon substrate 10 with the device isolation film 12 formed on. The gate electrodes 20 are extended vertical of the sheet of the drawing, and as shown in FIG. 3A, two gate electrodes 20 are formed on each device region defined by the device isolation film 12. An insulation film 36 of a silicon oxide film, an etching stopper film 22 of a silicon nitride film are formed on the gate electrodes 20. Impurity diffused layers 24, 26 are formed in the silicon substrate 10 on both sides of the gate electrodes 20. An inter-layer insulation film 28 buried between the gate electrodes 20 having the upper surfaces covered with the insulation film 36 and the etching stopper film 22 to planarize the surface of the substrate. As shown in FIG. 3B, an opening 38 for surrounding the device region defined by the device isolation film 12 is formed in the inter-layer insulation film 28, and the inter-layer insulation film 28 in the opening is removed. Thus, a contact hole 30 is opened on the impurity diffused layer 24, and contact holes 40 are formed on the impurity diffused layer 26. A sidewall insulation film 32 is formed on the side walls of the contact holes 30, 40.

Then, the semiconductor device according to the present embodiment and the method for fabricating the semiconductor device will be detailed in accordance with the steps of the method for fabricating the semiconductor device according to the present embodiment.

First, trenches are formed by the usual lithography in device isolation region on, e.g., a p-type silicon substrate 10.

Then, a silicon oxide film is deposited by, e.g., CVD method, and then the surface of the silicon oxide film is polished to leave the silicon oxide film only in the trenches formed in the silicon substrate 10. Thus, the device isolation film 12 is formed, buried in the silicon substrate 10. The thus-formed device isolation film 12 is known as trench isolation. The device isolation film 12 may be formed by other device isolation film forming techniques, such as LOCOS (LOCal Oxidation of Silicon), but the above-described trench isolation technique can make the surface of the substrate flat, which facilitates burying plugs, for example, and provides various conveniences in the later steps.

The device isolation film 12 is so formed that the device regions are staggered arrangement as exemplified in FIG. 3A. The layout shown in FIG. 3A is one example of patterns applicable to memory cell regions of a DRAM.

Subsequently, the silicon substrate 10 with the device isolation film 12 formed on is thermally oxidized to form a gate insulation film 14 on the surface of the silicon substrate 10.

Then, a polycrystalline silicon film 16 to be the gate electrodes 20 is deposited on the gate insulation film 14 by, e.g., CVD method.

Next, an insulation film 36 of a silicon oxide film is deposited on the polycrystalline silicon film 16 by, e.g., CVD method. As will be detailed later, the insulation film 36 is not essential.

Figure 5A:
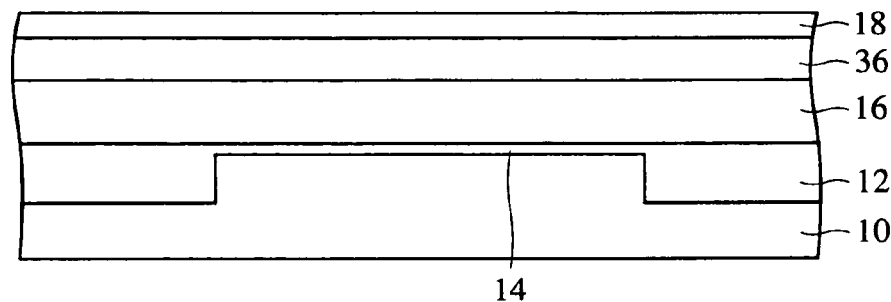
FIGS. 5A-5C and 6A-6C are sectional views of the semiconductor device according to the second embodiment in the steps of the method for fabricating the semiconductor device, which show the method.

Subsequently, a silicon nitride film 18 to be the etching stopper film 22 is deposited on the insulation film 16 by, e.g., CVD method (FIG. 5A).

Then, the laminated film of the silicon nitride film 18, the insulation film 36 and the polycrystalline silicon film 16 is patterned by the usual lithography and etching to form the gate electrodes 20 having the upper surfaces covered with the insulation film 36 and the etching stopper film 22.

Figure 5B:
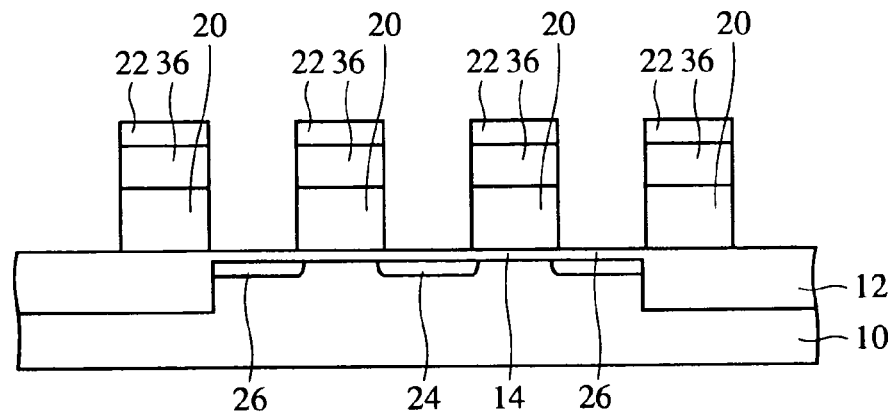

Then, phosphorus ions, for example, are implanted into the silicon substrate 10 with the gate electrodes 20 as a mask to form the impurity diffused layers 24, 26 (FIG. 5B).

Figure 5C:
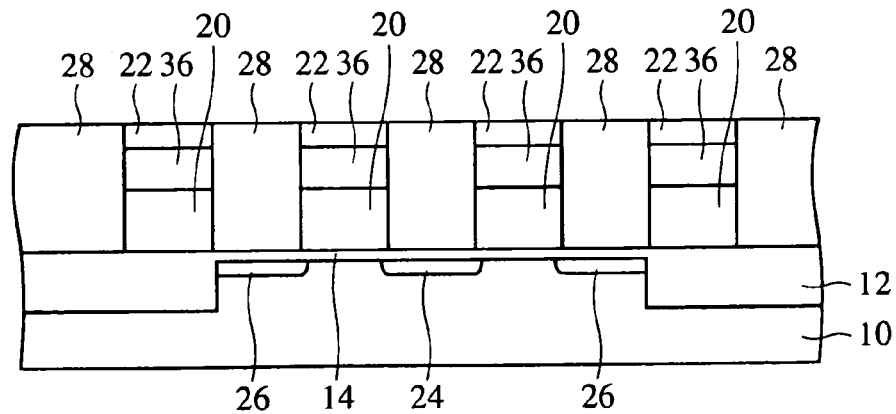

Subsequently, a silicon oxide film is deposited on the entire surface by, e.g., CVD method., and then the surface of the silicon oxide film is polished by, e.g., CMP method until the etching stopper film 22 is exposed, to form the inter-layer insulation film 28 buried between the gate electrodes 20 (FIG. 5C).

Then, a photoresist 46 for forming the contact holes for exposing the impurity diffused layers 24, 26 is formed on the inter-layer insulation film 28 by the usual lithography technique.

Figure 6A:
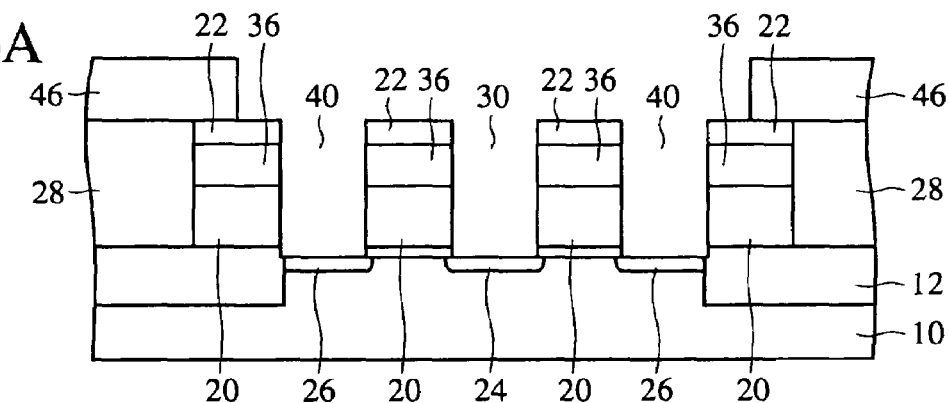

Then, the inter-layer insulation film 28 is anisotropically etched by using the photoresist 46 as a mask, and the etching stopper film 22 formed on the gate electrodes 20 to form the contact holes 30, 40 opened on the impurity diffused layers 24, 26 (FIG. 6A).

The semiconductor device and the method for fabricating the semiconductor device according to the present embodiment is characterized by a pattern of the photoresist 46.

It is possible that the photoresist 46 has respective openings on the impurity diffused layer 24 and the impurity diffused layer 26, but when the device is much micronized, there is a risk that the hole pattern opened on the impurity diffused layer 24 and the hole pattern opened on the impurity diffused layer 26 are so near each other that the lithography of the photoresist itself may become impossible.

However, in the semiconductor device and the method for fabricating the semiconductor device according to the present embodiment, the etching stopper film 22 is formed, covering the upper surfaces of the gate electrodes 20, and the surface of the etching stopper film 22 and the surface of the inter-layer insulation film 28 are substantially flush with each other, whereby by forming the photoresist 46 having the opening which includes the impurity diffused layers 24, 26 adjacent to each other with the gate electrodes 20 disposed therebetween and covering the gate electrodes 20, three contact holes for exposing the impurity diffused layers 24, 26 can be opened by self-alignment with the gate electrodes 20 while the surface of the substrate is retained flat.

Thus, according to the present embodiment, as exemplified in FIG. 3B, it is not necessary that the photoresist 46 has fine hole patterns, which facilitates the lithography step for forming the photoresist 46. Retaining the surface of the substrate flat provides conveniences in later steps of forming metallization from the impurity diffused layers 24, 26.

As is in the semiconductor device according to the first embodiment and the method for fabricating the same, the surface of the etching stopper film 22 is flat, which enables the contact holes 30, 40 to be opened while suppressing film thickness decrease of the etching stopper film 22 in etching the inter-layer insulation film 28.

Figure 6B:
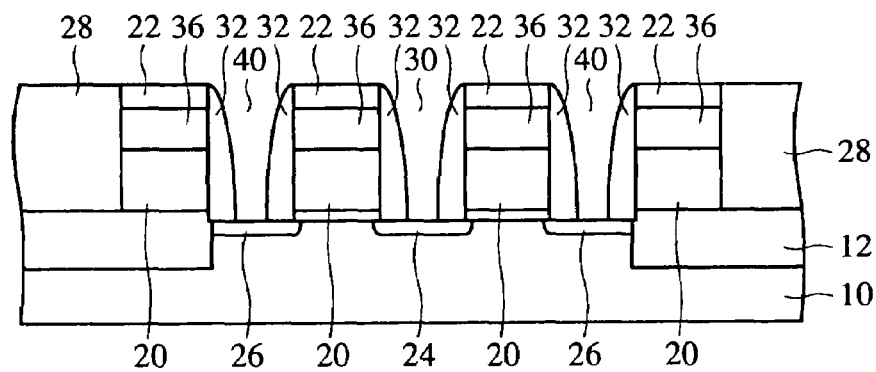

Then, a silicon oxide film is deposited on the entire surface by, e.g., CVD method, and then etched to form the sidewall insulation film 32 on the side walls of the interlayer insulation film 28 (FIG. 5B) and the side walls of the laminated film of the gate electrodes 20, the insulation film 36 and the etching stopper film 22 (FIG. 6B).

The sidewall insulation film 32 is thus formed, whereby the gate electrodes 20 are covered with the etching stopper film 22, the insulation film 36 and the sidewall insulation film 32 without being exposed in the contact holes 30, 40.

As in the semiconductor device according to the first embodiment and the method for fabricating the semiconductor device, it is not necessary to open the contact holes by self-alignment with the sidewall insulation film 32, which allows the sidewall insulation film 32 to be formed of silicon oxide film. Accordingly, in comparison with a conventional semiconductor device including the sidewall insulation film 32 of silicon nitride film, the transistor can have higher hot carrier immunity.

Figure 6C:
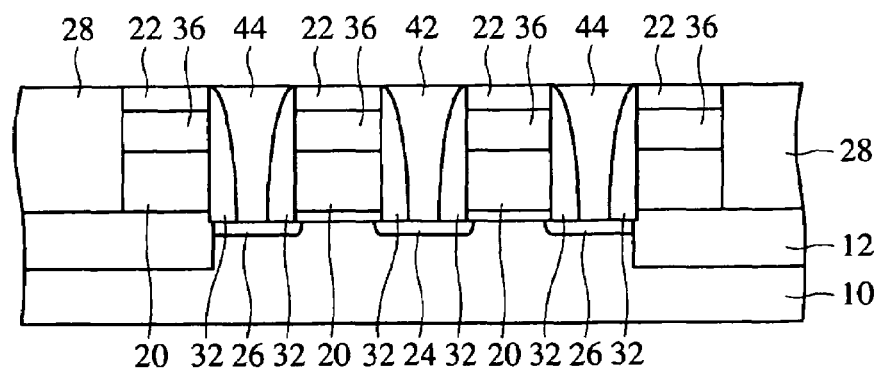

Next, a phosphorus-doped polycrystalline silicon film is deposited on the entire surface by, e.g., CVD method, and then the surface of the polycrystalline silicon film is polished by, e.g., CMP method until the surface of the etching stopper film 22 is exposed to leave the polycrystalline silicon film in the contact holes 30, 40. Thus, a plug 42 buried in the contact hole 30, and a plug 44 buried in the contact hole 40 are formed (FIG. 6C). Even when the reduction in the film thickness takes place on part of the etching stopper film 22 during the etching process for forming the contact hole 30 and 40, the surface of the etching stopper film 22 can be planarized by simultaneously polishing the projected portion of the etching stopper film 22 during CMP process for forming the plugs 42, 44.

As described above, according to the present embodiment, the gate electrodes 20 having the surfaces covered with the etching stopper film 22 are formed, then the inter-layer insulation film 28 is buried between the gate electrodes 20, and next the contact holes 30, 40 are opened in the inter-layer insulation film 28, whereby the contact holes 30, 40 which are adjacent to each other with the gate electrodes 20 therebetween can be opened by the use of the photoresist 46 having the single opening 38. As a result, the lithography step for forming the contact holes 30, 40 can be simple. As in the semiconductor device and the method for fabricating the same according to the first embodiment, fluctuation of the contact area due to lithographic disalignment can be eliminated.

Because the sidewall insulation film 32 is formed after the contact holes 30, 40 are opened, it is not necessary to open the contact holes 30, 40 by self-alignment with the sidewall insulation film 32, which allows the sidewall insulation film 32 to be formed of silicon oxide film. As a result, in comparison with a conventional semiconductor device including the sidewall insulation film 32 formed of silicon nitride film, the transistor can have higher hot carrier immunity.

However, the sidewall insulation film may be formed of silicon nitride film.

In the present embodiment, the insulation film 36 and the etching stopper film 22 are formed on the gate electrodes 20, but the insulation film 36 is not essential. In the present embodiment, the insulation film 36 of silicon oxide film is provided between the gate electrodes 20 and the etching stopper film 22 for a purpose of reducing inter-layer dielectric constant. That is, the insulation film on the gate electrodes 20 is preferably thick to reduce parasitic capacitance, but the effect is made higher by using a laminated film with silicon oxide film, whose dielectric constant is lower, than by thickening the insulation film of silicon nitride film alone. Accordingly, the insulation film 36 is not necessary in a case, for example, that influence of parasitic capacitance is allowable, or the parasitic capacitance can be sufficiently restrained by other means.

In the semiconductor device and the method for fabricating the same according to the present embodiment is applied to the memory cell regions of a DRAM but is applicable to other semiconductor devices.

In the above-described first and second embodiments the contact holes which arrive at the semiconductor substrate are formed by self-alignment between the gate electrodes, but the present invention is applicable not only to contacts to semiconductor substrates but also to other contacts. The present invention is applicable to a case that a viahole which reaches a first interconnection of a first metallization layer is formed between second interconnections of a second metallization layer by self-alignment.

That is, the present invention is applicable to opening contact holes arriving at a base substrate between conductor patterns formed adjacent to each other on the base substrate having a prescribed structure.

A Third Embodiment

The semiconductor device and the method for fabricating the same according to a third embodiment of the present invention will be explained with reference to FIGS. 7A-7B, 8A-8B, 9A-9E, 10A-10C, 11A-11D, 12A-12C, 13A-13B and 14A-14B.

Figure 7A:
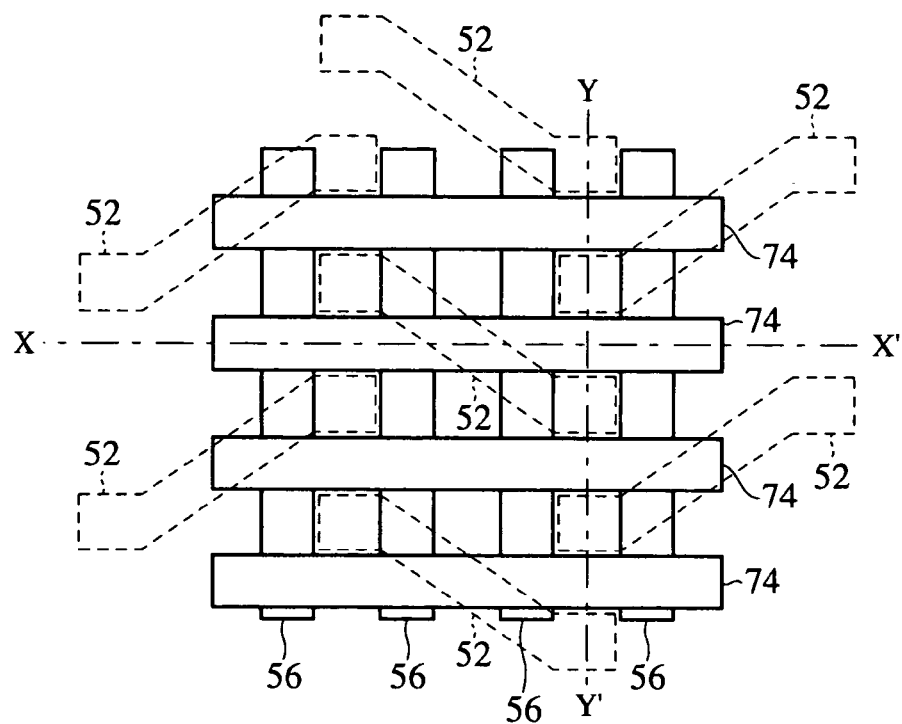
FIGS. 7A and 7B are plan views of the semiconductor device according to a third embodiment of the present invention, which show a structure thereof.
Figure 7B:
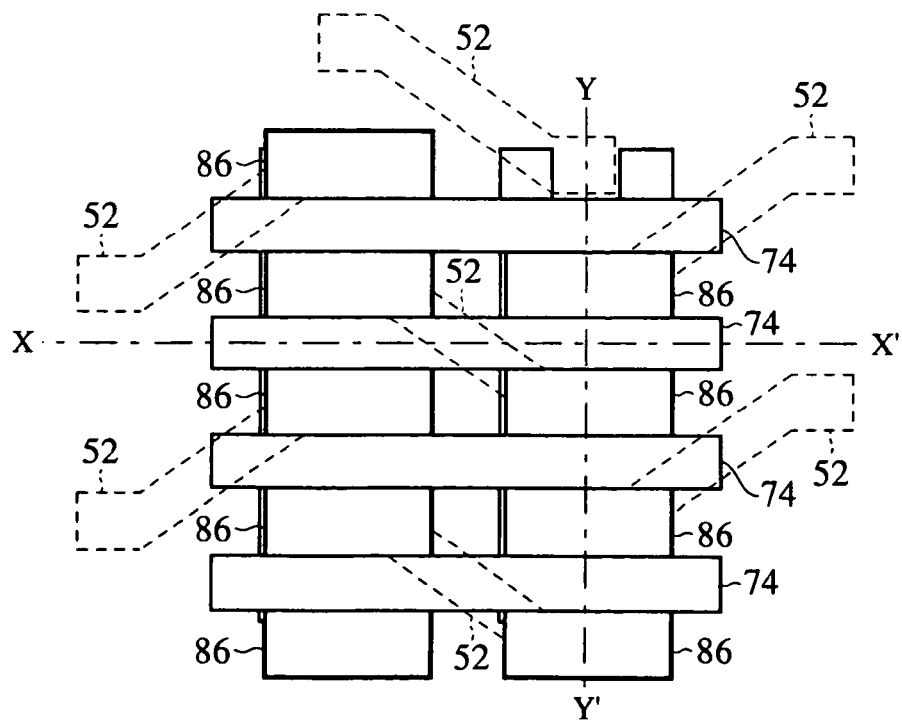
Figure 8A:
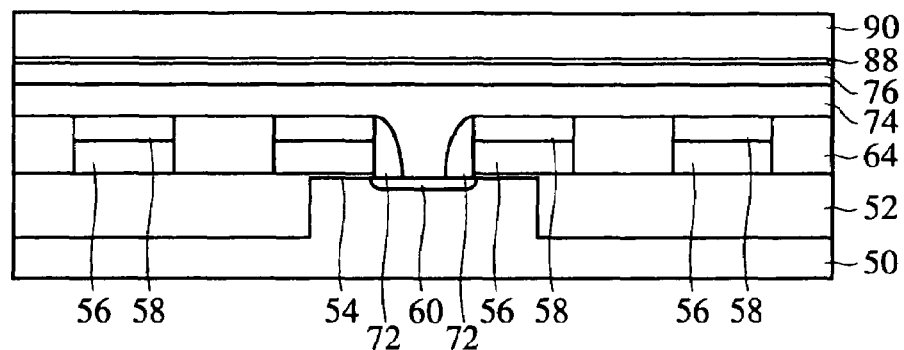
FIGS. 8A and 8B are diagrammatic sectional views of the semiconductor device according to the third embodiment of the present invention, which show a structure thereof.
Figure 8B:
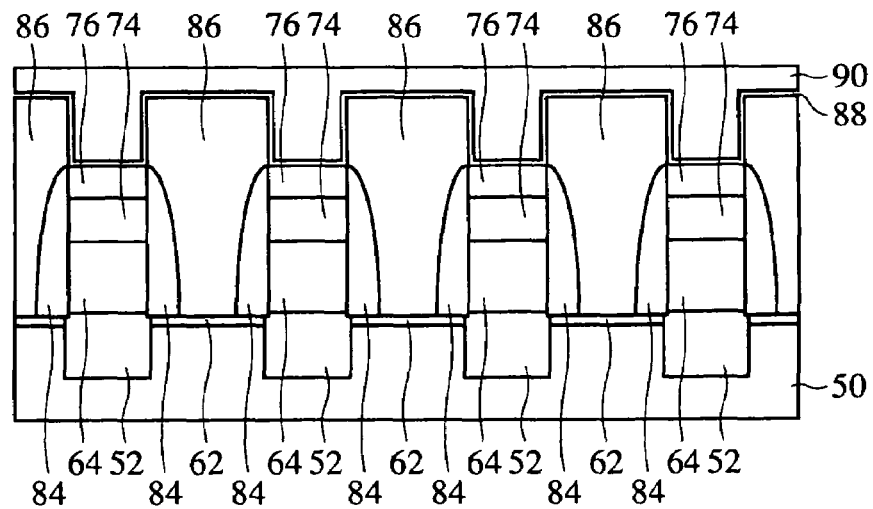
Figure 13A:
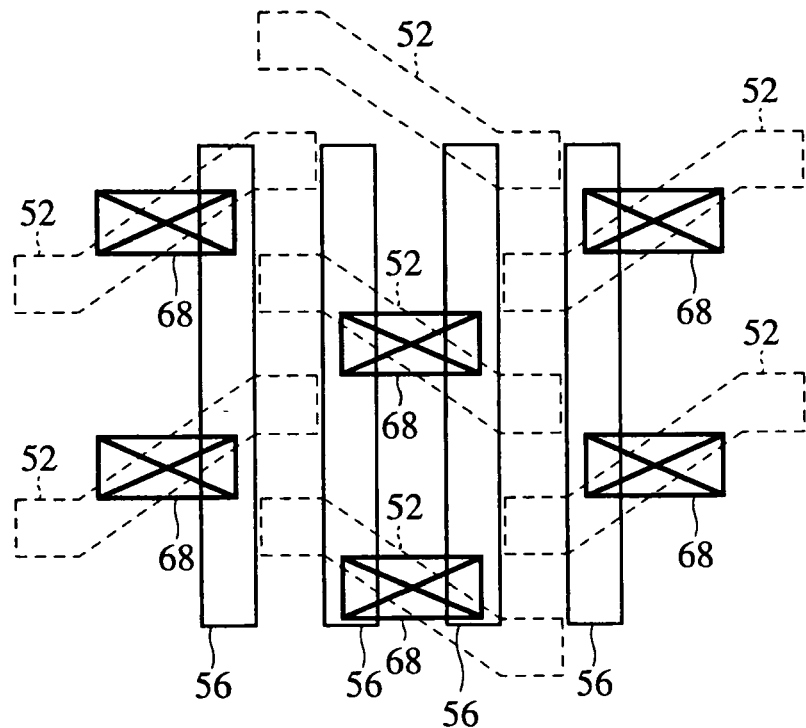
FIGS. 13A and 13B are plan views of a resist pattern for forming bit line contact holes of the semiconductor device according to the third embodiment of the present invention, and the opened contact holes.
Figure 13B:
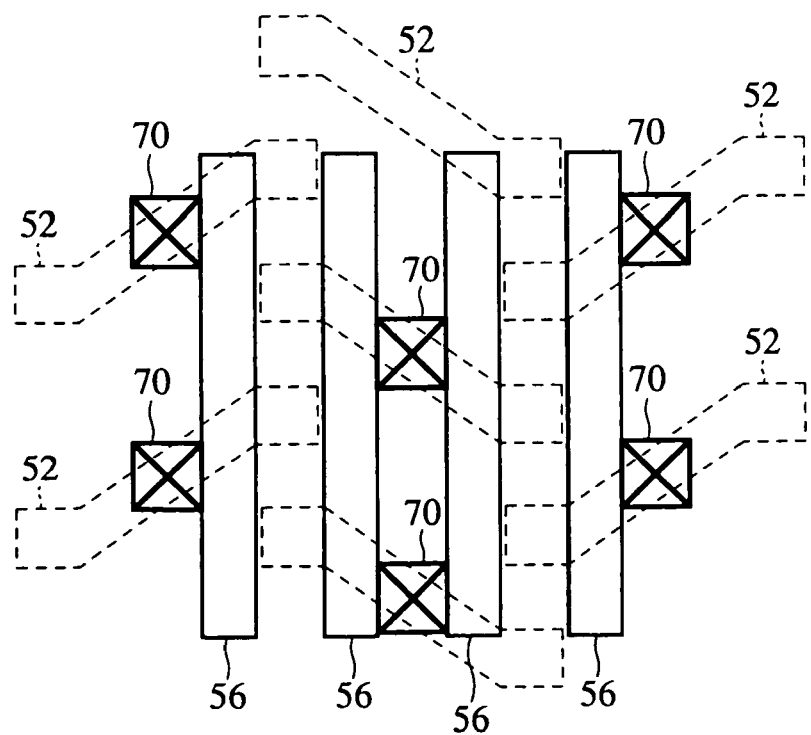
Figure 14A:
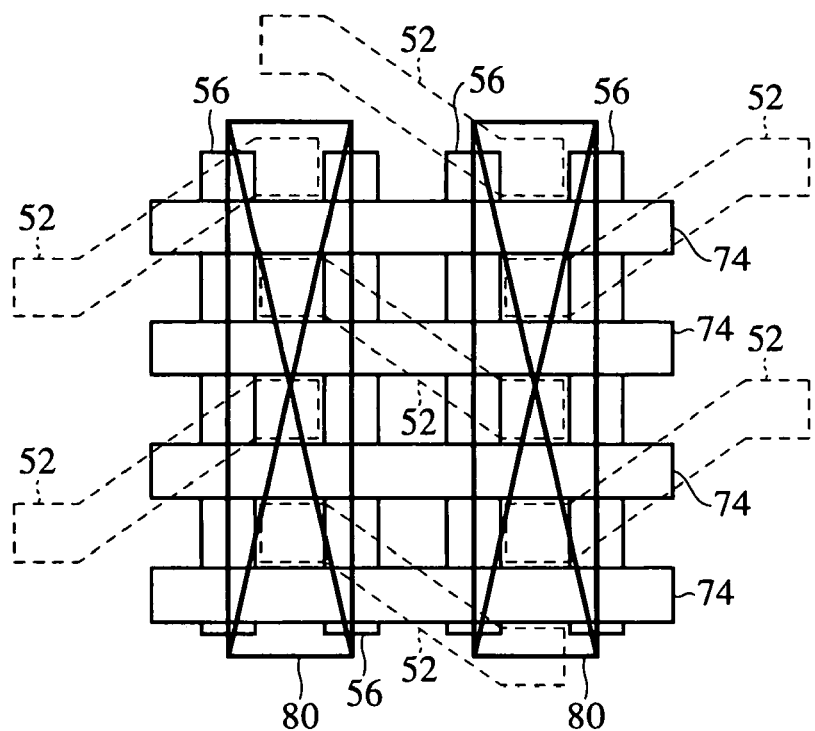
FIGS. 14A and 14B are plan views of a resist pattern for forming storage electrode contact holes of the semiconductor device according to the third embodiment of the present invention, and the opened contact holes.
Figure 14B:
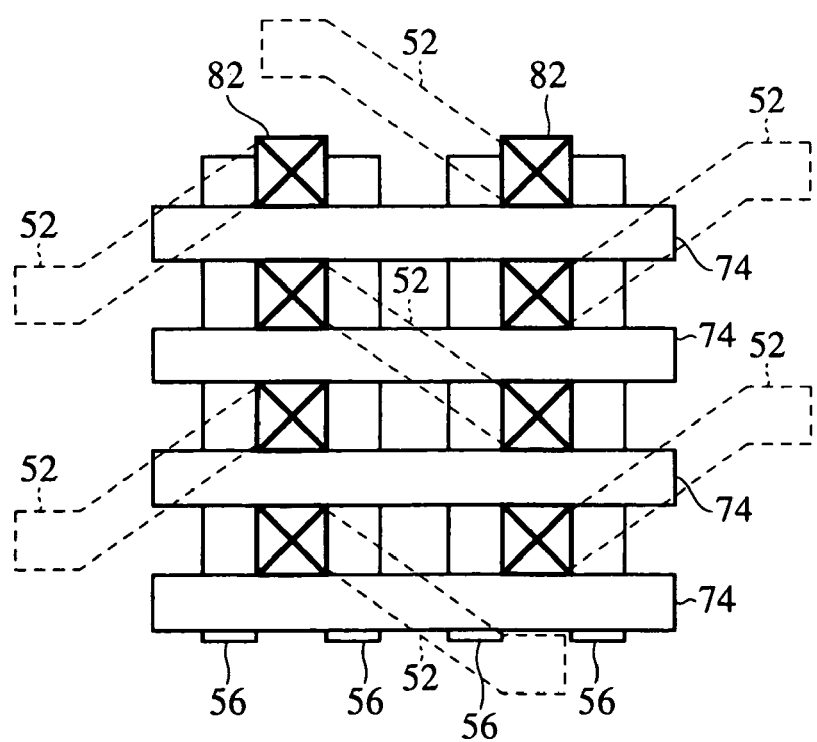

FIGS. 7A and 7B are plan views of the semiconductor device according to the present embodiment, which shows a structure thereof. FIGS. 8A and 8B are diagrammatic sectional views of the semiconductor device according to the present embodiment, which show the structure thereof. FIGS. 9A-9E, 10A-10C, 11A-11D and 12A-12C are sectional views of the semiconductor device according to the present embodiment in the steps of the method for fabricating the semiconductor device, which explain the method. FIGS. 13A and 13B are plan views of a resist pattern for forming a bit line contact holes of the semiconductor device according to the present embodiment, and of the opened contact hole. FIGS. 14A and 14B are plan views of a resist pattern for forming a storage electrode contact hole of the semiconductor device according to the present embodiment and of the opened contact hole.

The present embodiment shows an example in which the semiconductor device and the method for fabricating the same according to the second embodiment is applied to a DRAM.

First, the structure of the semiconductor device according to the present embodiment will be explained with reference to FIGS. 7A-7B and 8A-8B. FIGS. 7A and 7B are plan views of the semiconductor device according to the present embodiment, which show the structure of the semiconductor device. FIG. 8A is a diagrammatic sectional view along the line X-X' in FIG. 7A. FIG. 8B is a diagrammatic sectional view along the line Y-Y' in FIG. 7B.

A device isolation film 52 for isolating devices is formed, buried in a silicon substrate 50. A plurality of word lines 56 are formed, through a gate insulation film 54, on the silicon substrate 50 with the device isolation film 52 formed on, extended vertically of the drawing and parallel with each other. An etching stopper film 58 is formed on the word lines 56. Impurity diffused layers 60, 62 are formed in the silicon substrate 50 on both sides of the word lines 56. The gate electrodes provided by the word lines 56 and the impurity diffused layers 60, 62 constitute transfer transistors. An inter-layer insulation film 64 having substantially the same height as the etching stopper film 58 is buried between the word lines 56. A plurality of bit lines 74 are formed on the etching stopper film 58 and the inter-layer insulation film 64, extended transversely of the drawing and parallel with each other. The bit lines 74 are connected to the impurity diffused layers 60 in places where the bit lines intersect an active region defined by the device isolation film 52. A storage electrode 86 is formed on the impurity diffused layers 62. An opposed electrode 90 is formed on the storage electrode 86 through a dielectric film 88. The storage electrode 86, the dielectric film 88 and the opposed electrode 90 constitute a capacitor.

The semiconductor device according to the present embodiment is characterized in that in a DRAM comprising memory cells each thus including one transistor and one capacitor, the step of opening a contact hole for connecting the impurity diffused layer 60 to the bit lines 74, and the step of opening a contact hole for connecting the impurity diffused layer 62 with the storage electrode 86 use the self-alignment contact used in the second embodiment.

The semiconductor device and the method for fabricating the semiconductor device according to the present embodiment will be detailed in accordance with the steps of the method for fabricating the semiconductor device according to the present embodiment. FIGS. 9A-9E and 10A-10C are sectional views of the semiconductor device according to the present embodiment along the line X-X' in FIG. 7A in the steps of the method for fabricating the same, and FIGS. 11A-11D and 12A-12C are sectional views of the semiconductor device along the line Y-Y' in FIG. 7B in the steps of the method for fabricating the same.

First, trenches are formed in regions to be the device isolation regions in, e.g., a p-type silicon substrate 50 are formed by the usual lithography and etching.

Next, a silicon oxide film is deposited by, e.g., CVD method, and then the surface of the silicon oxide film is polished by, e.g., CMP method to leave the silicon oxide film only in the trenches formed in the silicon substrate 50. Thus, the device isolation film 52 is formed, buried in the silicon substrate 50.

The thus-formed device isolation film 52 is known as the so-called trench isolation. The device isolation film 52 may be formed by other device isolation techniques, e.g., LOCOS method, but the use of the above-described trench isolation technique enables the surface of the substrate to be retained flat, which provides various conveniences of facilitating burying plugs by polishing in later steps, etc.

Subsequently, the silicon substrate 50 with the device isolation film 52 formed in is thermally oxidized to form the gate insulation film 54 of, e.g., an about 6 nm-thick.

Then, an about 100 nm-thick polycrystalline silicon film and an about 100 nm-thick WSi (tungsten silicide) film are deposited on the gate insulation film 54. The polycide film of the thus-deposited polycrystalline silicon film and WSi film is to be the word lines 56.

Then an about 200 nm-thick silicon nitride film is deposited on the polycide film by, e.g., CVD method. The silicon nitride film is to be the etching stopper film for etching the inter-layer insulation film.

Subsequently, the laminated film of the silicon nitride film and the polycide film is patterned by the usual lithography and etching to form the word lines 56 of the polycide structure having the upper surface covered with the etching stopper film 58 formed of the silicon nitride film. The word lines 56 have, e.g., a 0.2 μm-line width and are spaced from each other by 0.2 μm. The word lines 56 are so formed that two of the word lines are extended in one active region.

Figure 9A:
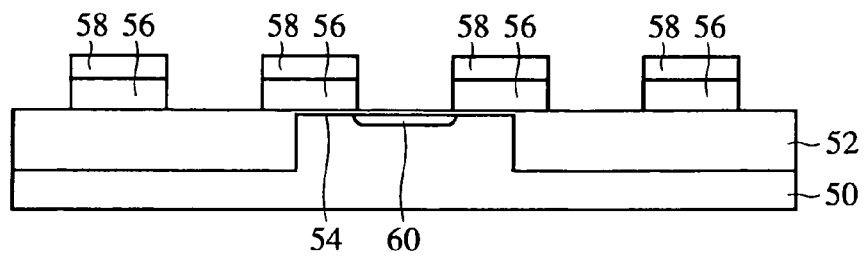
FIGS. 9A-9E, 10A-10C, 11A-11D and 12A-12C are sectional views of the semiconductor device according to the third embodiment of the present invention in the steps of the method for fabricating the semiconductor device, which show the method.
Figure 11A:
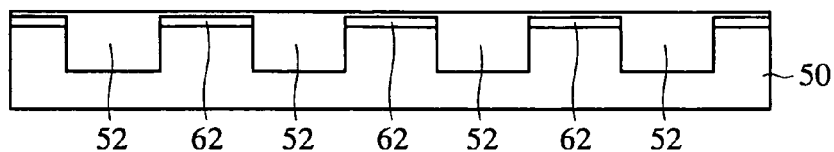

Then, phosphorus ions, for example, are implanted into the silicon substrate 50 with the word lines 56 as a mask to form the impurity diffused layers 60, 62 in the active region (FIGS. 9A, FIG. 11A). For example, phosphorus ions are implanted under conditions of a 30 keV acceleration energy and a $2\times10^{13}$ cm$^{-2}$ dose to form the impurity diffused layers 60, 62.

Then, an about 50 nm-thick silicon oxide film and an about 200-nm BPSG (Boro-Phospho Silicate Glass) film are deposited on the entire surface by, e.g., CVD method, and then thermal treated for 10 minutes at 850° C. in a nitrogen atmosphere to reflow the BPSG film. The thus-formed silicon oxide film and BPSG film are to be the inter-layer insulation film.

It is possible that the thermal oxidation is performed before growing the silicon oxide film to form an about 2 nm-thick silicon oxide film on the side walls of the word lines 56. It is preferable that the sidewall insulation film is formed on the side walls of the word lines 56 and the gate electrodes of transistors for a peripheral circuit before the growth of the silicon oxide film, to form a high-concentration source/drain diffused layer of the peripheral circuit transistor.

Figure 9B:
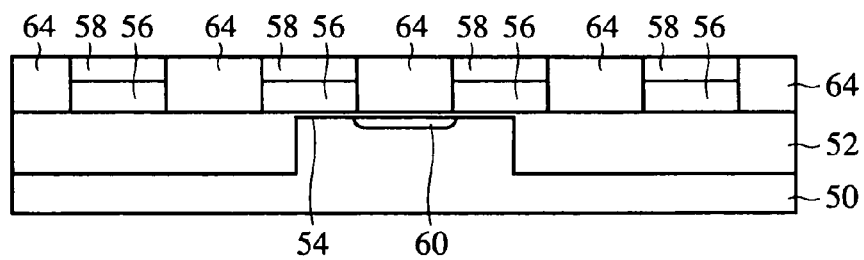
Figure 11B:
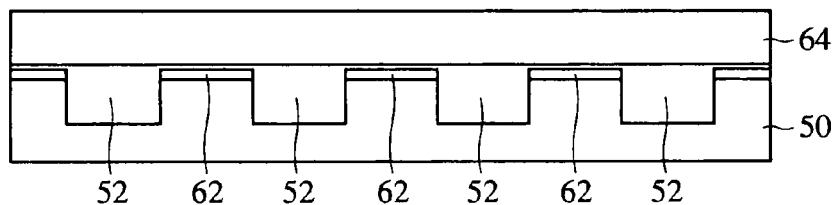

Subsequently, the BPSG film and the silicon oxide film are polished by, e.g., CMP method until the etching stopper film 58 is exposed to leave the silicon oxide film and the BPSG film only between the word lines 56. Thus, the inter-layer insulation film 64 is formed, buried between the word lines 56 (FIG. 9B, FIG. 11B).

Figure 9C:
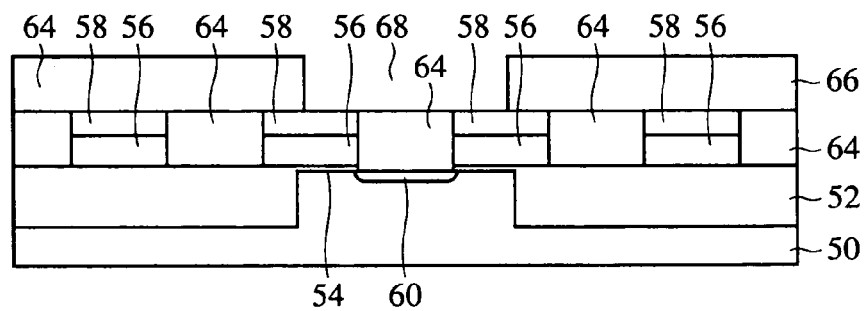
Figure 11C:
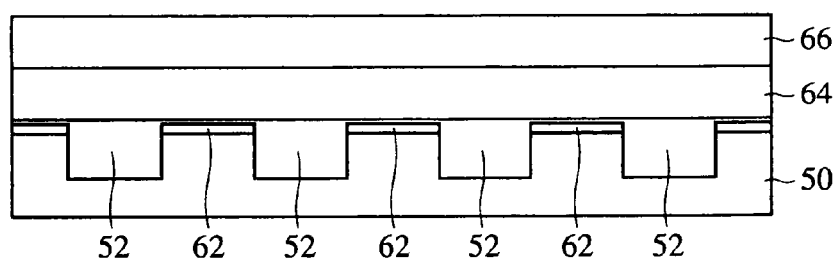

A photoresist 66 for forming a contact hole for exposing the impurity diffused layer 60 is formed on the inter-layer insulation film 64 by the usual lithography technique (FIG. 9C, FIG. 11C). As shown in FIG. 13A, the photoresist 66 has an opening 68 in a region where the bit lines and the impurity diffused layer 60 are connected to each other. The opening 68 can be extended over the word lines 56 because the etching stopper film 58 is disposed on the word lines 56.

Then, the inter-layer insulation film 64 is anisotropically etched with the photoresist 66 and the etching stopper film 58 as a mask under conditions which allow the silicon nitride film to have a sufficiently low etching rate to form the contact hole 70 opened on the impurity diffused layer 60. As shown in FIG. 13B, by using the photoresist 66 and the etching stopper film 58 as a mask, the contact hole 70 can be opened only upon the impurity diffused layer 60. Any steps are not formed in the contact hole 70.

Next, a thermal treatment follows at 800° C. in a dry oxygen atmosphere for oxidation by an about 3 nm-film thickness to recover the gate insulation film 54 on the ends of the word lines 56 from etching damages.

Figure 9D:
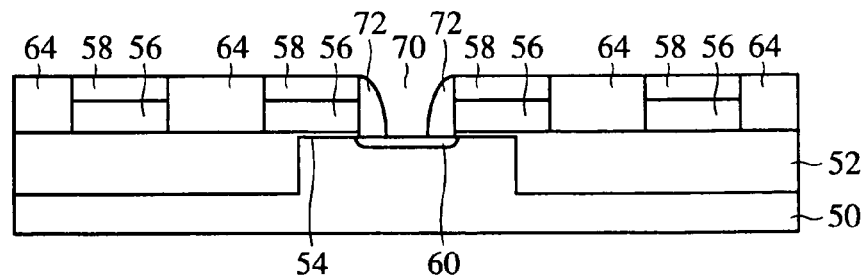

Subsequently, an about 80 nm-thick silicon oxide film is deposited on the entire surface by, e.g., CVD method and then is anisotropically etched to form the sidewall insulation film 72 on the side walls of the contact holes 70 (FIG. 9D). The word lines 56 are covered with the etching stopper film 58 and the sidewall insulation film 72, and are not exposed in the contact hole 70.

By thus forming the sidewall insulation film 72, the sidewall insulation film 72 is formed on the side walls of the word lines 56 in an about 60 nm-width, and a final size of the bit line contact hole 70 is about 0.08 µm.

It is also possible that when the contact hole 70 is formed, the peripheral circuit transistor is exposed, and the highly doped source/drain diffused layer of the peripheral circuit is formed after the sidewall insulation film 72 is formed. Thus, the sidewall insulation film for forming the LDD structure of the peripheral circuit transistor and the sidewall insulation film 72 in the contact hole 70 can be concurrently formed, which has a merit that the number of the steps can be decreased.

Next, an about 50 nm-thick phosphorus-doped polycrystalline silicon film, an about 100 nm-thick WSi film and an about 200 nm-thick silicon nitride film are deposited by, e.g., CVD method.

It is preferable that the polycrystalline silicon film has a film thickness which is above a half a size of a bit line contact hole 70. A film thickness of the polycrystalline silicon film is above a half 0.08 µm which is a size of the bit line contact hole 70, whereby the polycrystalline silicon film is completely buried in the contact holes 70, and the surface of the substrate can be substantially flat.

The laminated film of the silicon nitride film, the WSi film and the polycrystalline silicon film is patterned to form the bit lines 74 of the polycide structure having the upper surface covered with the etching stopper film 76 formed of the silicon nitride film.

Then, an about 50 nm-thick silicon oxide film and an about 200 nm-thick BPSG film are deposited on the entire surface by, e.g., CVD method, and then are thermal treated for 10 minutes at 850° C. in a nitrogen atmosphere to reflow the BPSG film. The thus-formed silicon oxide film and the BPSG film are to be the inter-layer insulation film.

Figure 9E:
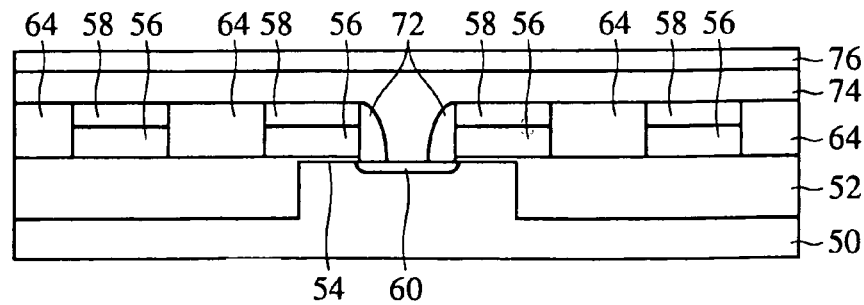
Figure 11D:
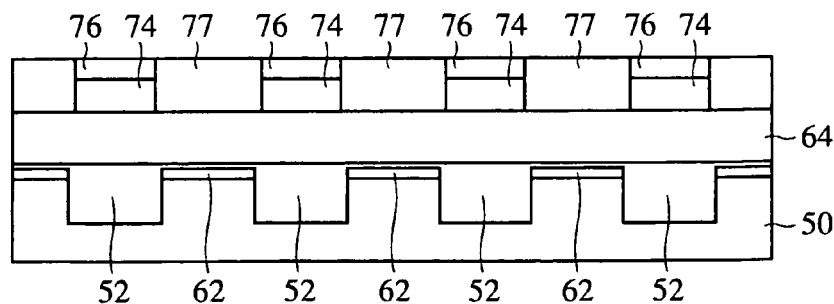

Next, the BPSG film and the silicon oxide film are polished by, e.g., CMP method to leave the silicon oxide film and the BPSG film only between the bit lines 74. The inter-layer insulation film 77 is thus formed, buried between the bit lines 74 (FIG. 9E, FIG. 11D).

Figure 10A:
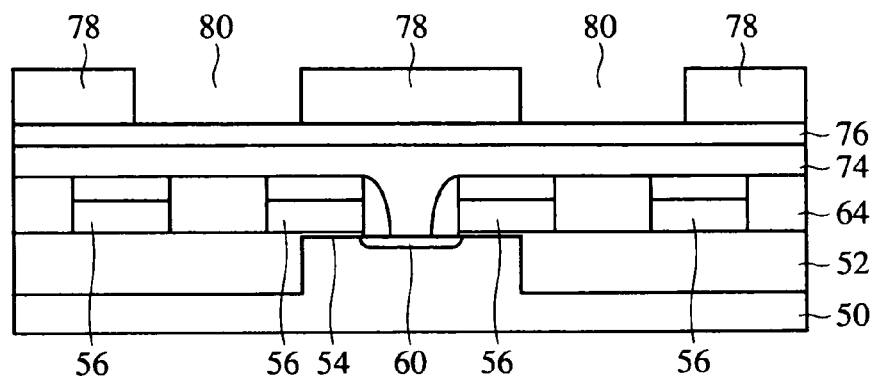

Subsequently, a photoresist 78 for forming a contact hole for exposing the impurity diffused layer 62 on the inter-layer insulation film 77 and the etching stopper film 76 is formed by the usual lithography technique (FIG. 10A). As shown in FIG. 14A, the photoresist 78 has a pattern having an opening 80 in a region where the storage electrode and the impurity diffused layer 62 are connected to each other. The opening 80 can be extended over the bit lines 74 because the etching stopper film 76 is disposed on the bit lines 74. As shown in FIG. 14A, the photoresist 78 can have a stripe pattern in which the region between the word lines 56 is covered alternately by the photoresist 78. The stripe pattern of the photoresist 78 makes fine alignment and sizing unnecessary, which can simplify the lithography step.

Figure 12A:
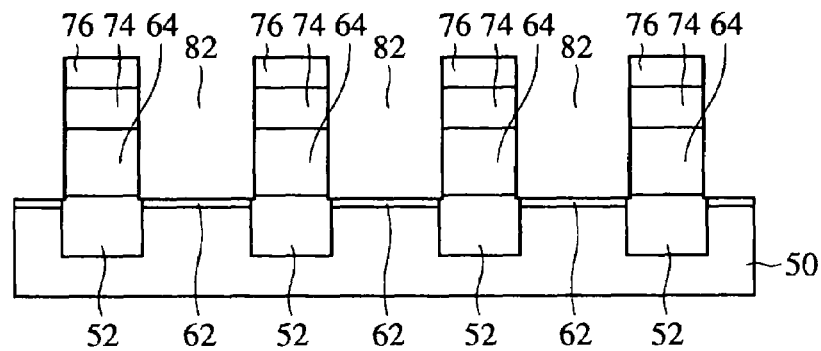

The inter-layer insulation films 77, 64 are anisotropically etched with the photoresist 78 and the etching stopper film 76 as a mask under conditions which allow the silicon nitride film to have a sufficiently low etching rate to form the contact hole 82 opened on the impurity diffused layer 62 (FIG. 12A). By using the photoresist 78 and the etching stopper film 76 as a mask, the contact hole 82 can be opened as shown in FIG. 14B.

Next, a thermal treatment follows at 800° C. in a dry oxygen atmosphere for oxidation by an about 3 nm-film thickness to recover the gate insulation film 54 on the ends of the word lines 56 from etching damages.

Figure 10B:
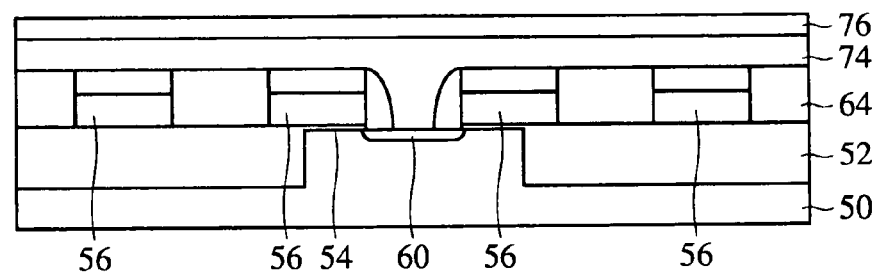
Figure 12B:
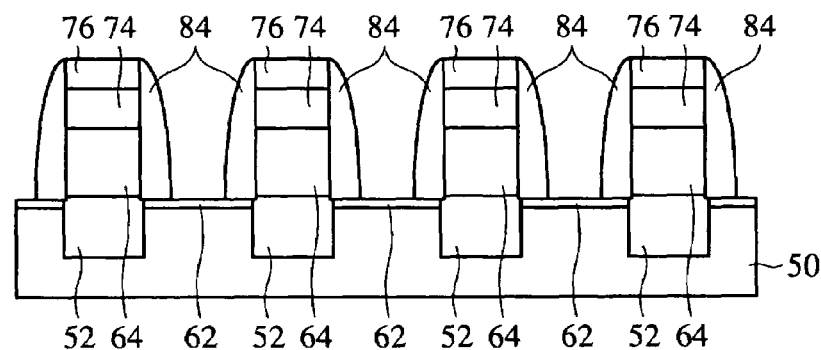

Subsequently, an about 80 nm-thick silicon oxide film is deposited on the entire surface by, e.g., CVD method and then is anisotropically etched to form the sidewall insulation film 84 on the side walls of the contact holes 82 (FIG. 12B, FIG. 10B). The bit lines 74 are covered with the etching stopper film 76 and the sidewall insulation film 84, and are not exposed in the contact hole 82.

By thus forming the sidewall insulation film 84, the sidewall insulation film 84 is formed on the side walls of the bit lines 74 in an about 60 nm-width, and a final size of the storage electrode contact hole 82 is about 0.08 µm.

An about 1500 nm-thick phosphorus-doped polycrystalline silicon film is deposited by, e.g., CVD method and is patterned by the usual lithography to form the storage electrode 86 connected to the impurity diffused layer 62 through the contact hole 82. As shown in FIG. 7B, the storage electrode 86 can be formed in the region between the bit lines 74.

Then, an about 4 nm-thick silicon nitride film is deposited by, e.g., CVD method, and then is thermal-treated for 10 minutes at 800° C. in a wet oxygen atmosphere to oxidize the surface of the silicon nitride film to form the dielectric film 88 of the silicon oxynitride film of an about 4 nm-thick converted to a thickness of the silicon oxide film. This dielectric film can provide an about 22 fF cell capacitance. The capacitor can have a reduced height by the use of a high dielectric film, such as tantalum oxide film or others.

Figure 10C:
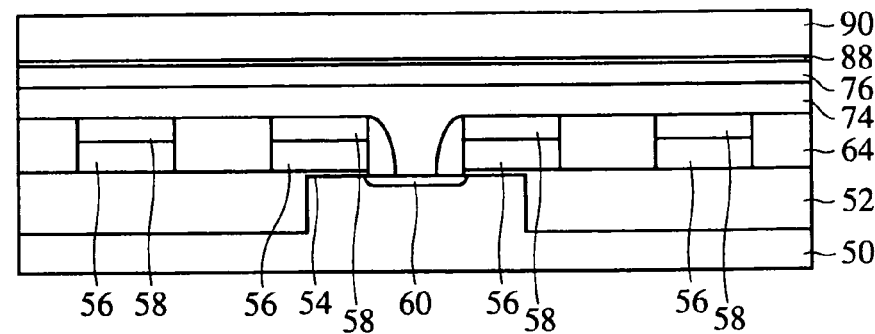
Figure 12C:
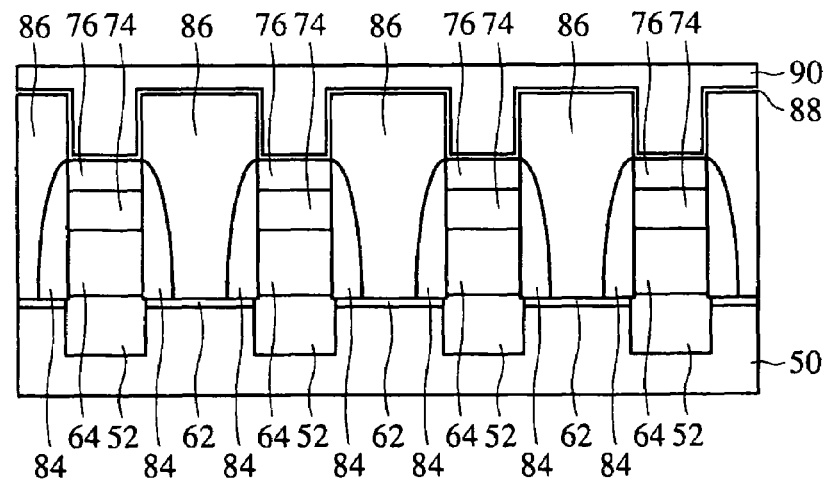

Subsequently, an about 100 nm-thick phosphorus-doped polycrystalline silicon film is deposited by, e.g., CVD method and is patterned by the usual lithography to make the opposed electrode 90 for the capacitor (FIG. 10C, FIG. 12C).

Thus, a DRAM comprising memory cells each including one transistor and one capacitor is constituted.

As described above, according to the present embodiment, the word lines or the bit lines having the surfaces covered with the etching stopper film are formed, then the inter-layer insulation film is buried between the word lines or the bit lines, and then the contact holes are formed in the inter-layer insulation film, whereby the lithography step for forming the contact holes does not require fine hole patterns, and alignment can have large allowance. As a result, the lithography step for forming the contact holes can be simple.

The ends of the opening in the photoresist for forming the contact holes are extended over the word lines or the bit lines, whereby even disalignment takes place in the lithography, no fluctuation takes place in a contact hole size.

The sidewall insulation film 72 is formed after the contact hole 70 is opened, whereby it is not necessary to open the contact hole 70 by self-alignment with the sidewall insulation film 72, which permits the sidewall insulation film 72 to be formed of silicon oxide film. Accordingly, in comparison with the conventional semiconductor device including the sidewall insulation film 72 formed of silicon nitride film, the transistor can have higher hot carrier immunity.

In the present embodiment, the method for fabricating the semiconductor device according to the second embodiment is applied to the step of forming the bit line contact hole and the step of forming the storage electrode contact hole, but may be applied to either of the steps.

A Fourth Embodiment

The semiconductor device and the method for fabricating the same according to a fourth embodiment of the present invention will be explained with reference to FIGS. 15, 16A-16D and 17A-17B. The same members of the semiconductor device according to the present embodiment and the method for fabricating the semiconductor device as the semiconductor device and the method for fabricating the same according to the third embodiment shown in FIGS. 7A to 14B are represented by the same reference numbers not to repeat or to simplify their explanation.

Figure 15:
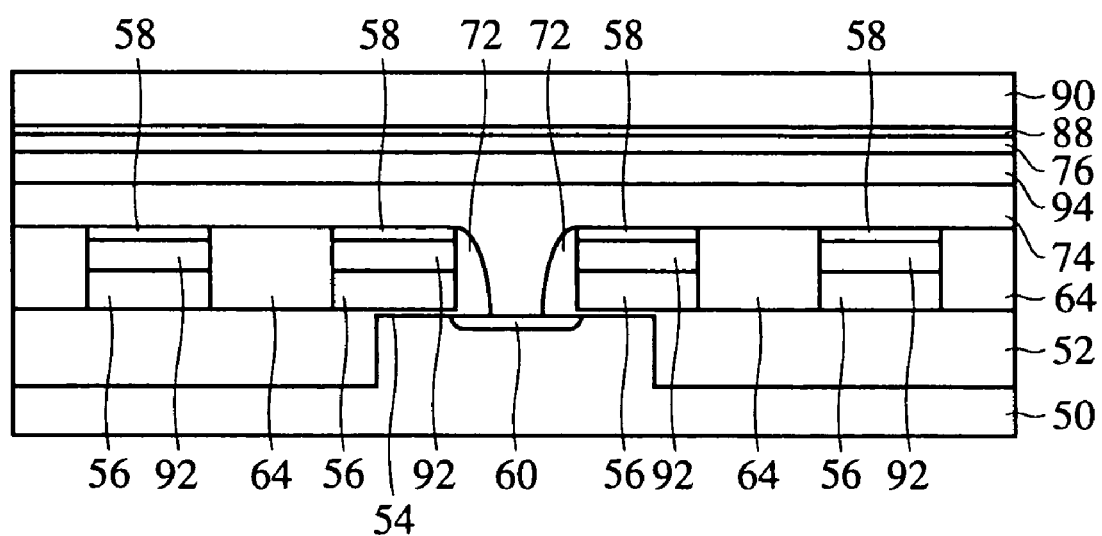
FIG. 15 is a diagrammatic sectional view of the semiconductor device according to a fourth embodiment of the present invention, which shows a structure thereof.

FIG. 15 is a diagrammatic sectional view of the semiconductor device according to the present embodiment, which shows a structure thereof. FIGS. 16A-16D and 17A-17B are sectional views of the semiconductor device according to the present embodiment in the steps of the method for fabricating the same, which explain the fabrication method.

In the semiconductor device and the method for fabricating the same according to the third embodiment, the etching stopper film 58 is disposed directly on the word lines 56 to be used as the inter-layer insulation film with respect to the above bit lines 74, etc. The etching stopper film 76 is disposed directly on the bit lines 74 to be used as the inter-layer insulation film with respect to the above opposed electrode 90, etc. However, as described in the second embodiment, silicon nitride film used as the etching stopper film 58, 76 has high dielectric constant, and there is a risk that a parasitic capacitance between metallization layers may be larger.

The semiconductor device according to the present embodiment has a structure and the method fabricating the same which can reduce parasitic capacitance between metallization layers.

First, the structure of the semiconductor device according to the present embodiment will be explained with reference to FIG. 15. The plane layout of the semiconductor device according to the present embodiment is the same as that the semiconductor device according to the third embodiment shown in FIGS. 7A and 7B. FIG. 15 is a diagrammatic sectional view along the line X-X' in FIG. 7A.

The semiconductor device according to the present embodiment is characterized in that the semiconductor device according to the third embodiment shown in FIG. 8A includes an insulation film 92 of a silicon oxide film between the word line 56 and the etching stopper film 58, and an insulation film 94 of a silicon oxide film between the bit line 74 and the etching stopper film 76. That is, an inter-layer insulation film for insulating the word line 56 from the bit line 74 is formed of the etching stopper film 58 and the insulation film 92, and an inter-layer insulation film for insulating the bit line 74 from the opposed electrode 90 is formed of the etching stopper film 76 and the insulation film 94.

Because silicon oxide film forming the insulation films 92, 94 has a lower dielectric constant than silicon nitride film forming the etching stopper films 58, 76, in place of thickening the etching stopper films 58, 76 to reduce parasitic capacitance, the etching stopper films 58, 76 have film thicknesses which allow them to function as the stopper, and the insulation films 92, 94 are disposed below the etching stopper films 58, 76, whereby the parasitic capacitance can be reduced without extremely thickening the inter-layer insulation films.

Accordingly, the semiconductor device has this structure, whereby a bit line contact hole 70 and a storage electrode contact hole 82 have mitigated aspect ratios while the parasitic capacitance can be reduced.

Then, the method for fabricating the semiconductor device according to the present embodiment will be explained with reference to FIGS. 16A-16D and 17A-17B. FIGS. 16A-16D and 17A-17B are sectional views of the semiconductor device according to the present embodiment in the steps of the method for fabricating the semiconductor device along the line X-X' in FIG. 7A.

First, trenches are formed by the usual lithography and etching in regions on, e.g., p-type silicon substrate 50 which are to be device isolation regions.

Then, a silicon oxide film is deposited by, e.g., CVD method, and then the surface of the silicon oxide film is polished to leave the silicon oxide film only in the trenches formed in the silicon substrate 50. Thus, a device isolation film 52 formed buried in the silicon substrate 50 is formed.

Subsequently, the silicon substrate 50 with the device isolation film 52 formed in is thermally oxidized to form the gate insulation film 54 of, e.g., an about 6 nm-thick on the surface of the silicon substrate 50.

Then, an about 10 nm-thick polycrystalline silicon film and an about 100 nm-thick WSi film are deposited on the gate insulation film 54 by, e.g., CVD method. The polycide film of the thus-deposited polycrystalline silicon film and WSi film is to be word lines.

Next, the insulation film 92 of an about 200 nm-thick silicon oxide film is deposited on the polycide film by, e.g., CVD method.

Subsequently, an about 50 to 100 nm-thick silicon nitride film is deposited on the insulation film 92 by, e.g., CVD method. The silicon nitride film is to be the etching stopper film 58 used in etching the inter-layer insulation film.

The thus-formed insulation film 92 and silicon nitride film function to be finally the inter-layer insulation film for insulating the word lines 56 from the bit lines 74. In the present embodiment the insulation film 92 is formed of silicon oxide film having a low dielectric constant, whereby a low inter-layer capacitance can be obtained.

The laminated film of the silicon nitride film, the insulation film 92 and the polycide film is patterned by the usual lithography and etching to form the word lines 56 of polycide structure having the upper surface covered with the etching stopper film 58 of silicon nitride film and the insulation film 92.

Figure 16A:
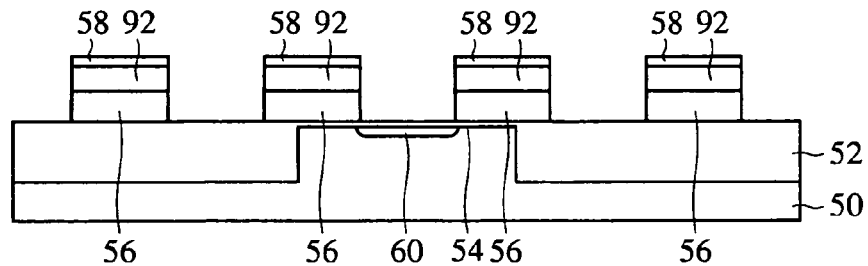
FIGS. 16A-16D and 17A-17B are sectional views of the semiconductor device according to the fourth embodiment of the present invention in the steps of the method for fabricating the semiconductor device, which show the method.
Figure 16B:
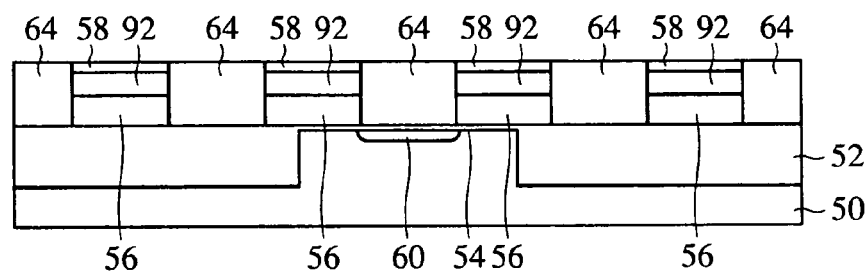
Figure 16C:
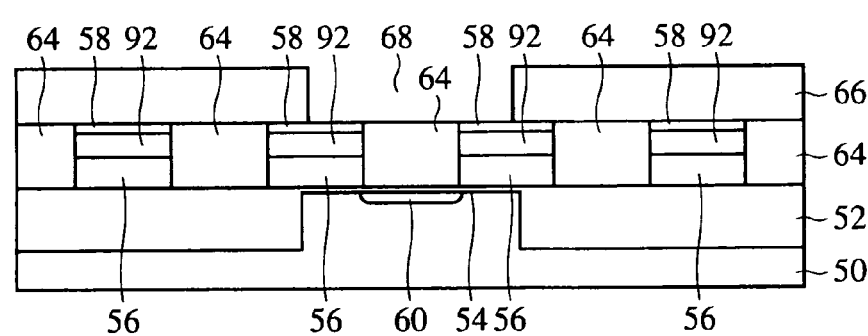
Figure 16D:
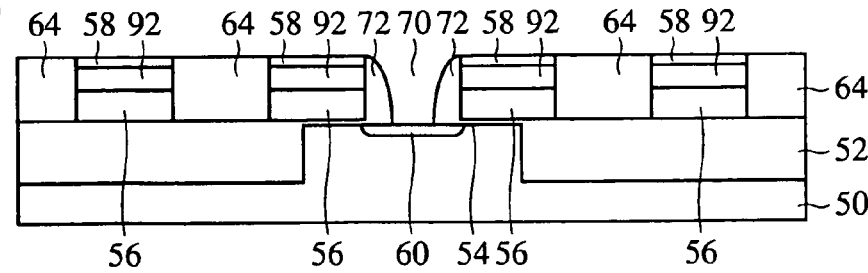

Then, phosphorus ions, for example, are implanted into the silicon substrate 50 with the word lines 56 as a mask to form impurity diffused layers 60, 62 in an active region (FIG. 16A).

Subsequently, the inter-layer insulation film 64, the bit line contact hole 70 and the sidewall insulation film 72 are formed in the same way as in the semiconductor device according to, e.g., the third embodiment and the method for fabricating the same shown in FIGS. 9B-9D, and FIGS. 11B-11C (FIGS. 16A-16D).

Then, an about 50 nm-thick phosphorus-doped polycrystalline silicon film, an about 100 nm-thick WSi film, the insulation film 94 of an about 100 nm-thick silicon oxide film, and an about 50 to 100 nm-thick silicon nitride film are continuously deposited by, e.g., CVD method.

The thus-formed insulation film 94 and silicon nitride film function to be finally the inter-layer insulation film for insulating the bit lines 74 from the opposed electrode 90. In the present embodiment, the insulation film 94 is formed of silicon oxide film having a low dielectric constant, whereby a low inter-layer capacitance can be obtained.

Figure 17A:
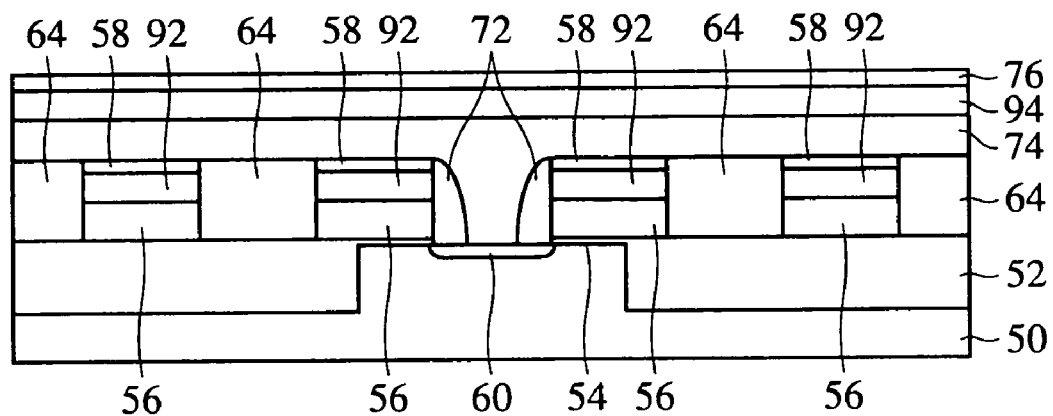

Then, the laminated film of the silicon nitride film, the insulation film 94, the WSi film and the polycrystalline silicon film is patterned by the usual lithography and etching to form the bit lines 74 of the polycide structure having the upper surfaces covered with the etching stopper film 76 of the silicon nitride film and the insulation film 94 (FIG. 17A).

Figure 17B:
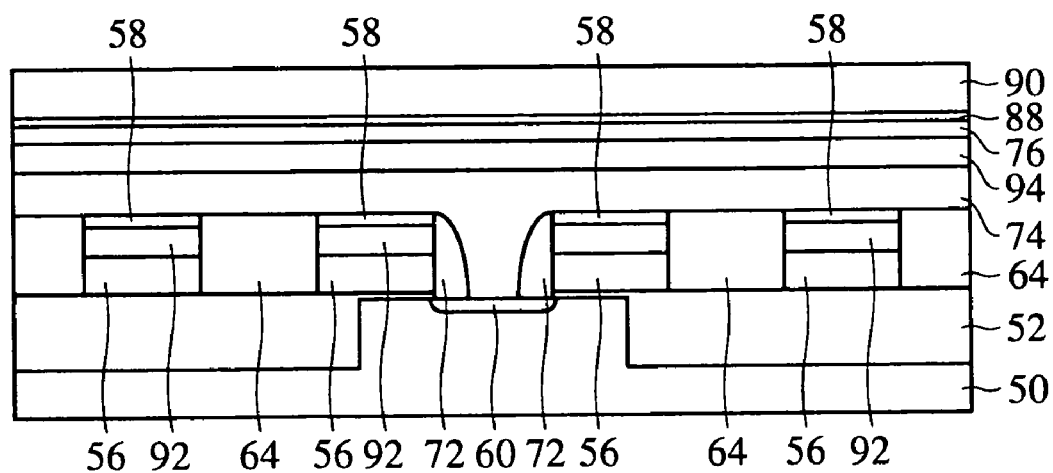

A capacitor connected to the impurity diffused layer 62 is formed in the same way as in the semiconductor device and the method for fabricating the same according to, e.g., the third embodiment shown in FIGS. 10A-10C and FIGS. 12A-12C, and a DRAM comprising memory cells each including 1 transistor and 1 capacitor is formed (FIG. 17B).

As described above, according to the present embodiment, the insulation film 92 of silicon oxide film is disposed between the etching stopper film 58 and the word lines 56, and the insulation film 94 of silicon oxide film is disposed between the etching stopper film 76 and the bit lines 74, whereby parasitic capacitance between metallization layers can be reduced.

To the end of achieving the same inter-layer capacitance, in the present embodiment the inter-layer insulation film can be thinner in comparison with a case that the inter-layer insulation film is formed of the etching stopper film alone of silicon nitride film, whereby the bit line contact hole 70 and the storage electrode contact hole 82 can have smaller aspect ratios. This facilitates formation of the contact holes.

A Fifth Embodiment

The semiconductor device and the method for fabricating the same according to a fifth embodiment of the present invention will be explained with reference to FIGS. 18, 19A-19D and 20A-20C. The same members of the present embodiment as the semiconductor device and the method for fabricating the same according to the third and the fourth embodiments of the present invention shown in FIGS. 7A-17B are represented by the same reference numbers not to repeat or to simplify their explanation.

Figure 18:
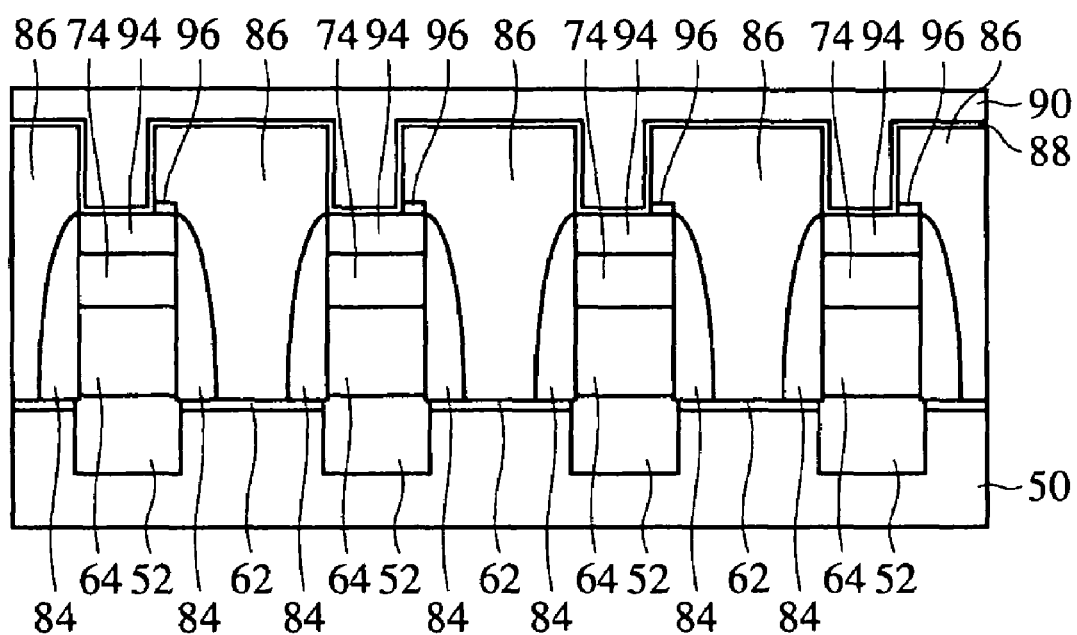
FIG. 18 is a diagrammatic sectional view of the semiconductor device according to a fifth embodiment of the present invention, which shows a structure thereof.

FIG. 18 is a diagrammatic sectional view of the semiconductor device according to the present embodiment, which shows a structure thereof. FIGS. 19A-19D and 20A-20C are sectional views of the semiconductor device according to the present embodiment in the steps of the method for fabricating the same, which explain the method.

In the semiconductor device and the method for fabricating the same according to the third and the fourth embodiments, the etching stopper film 76 covering the bit lines 74 are formed of silicon nitride film but are not essentially formed of an insulation film. The etching stopper film 76 may be formed of a conducting film, such as polycrystalline silicon film or others, along as the conducting film can have etching selectivity with respect to the inter-layer insulation film 64.

In the present embodiment, the semiconductor device and the method for fabricating the same according to the fourth embodiment includes the etching stopper film 76 covering the upper surface of the bit lines 74, which is formed of polycrystalline silicon film.

First, a structure of the semiconductor device according to the present embodiment will be explained with reference to FIG. 18. The plan view of the semiconductor device according to the present embodiment is the same as that of the semiconductor device according to the third embodiment shown in FIGS. 7A and 7B.

The semiconductor device according to the present embodiment is the same in the basic structure as the semiconductor device according to the fourth embodiment shown in FIG. 15 but is characterized in that the etching stopper film 76 covering the upper surfaces of the bit lines 74 is provided by an etching stopper film 96 of polycrystalline silicon film.

Then, the method for fabricating the semiconductor device according to the present embodiment will be explained with reference to FIGS. 19A-19D and 20A-20C. FIGS. 19A-19D and 20A-20C are sectional views of the semiconductor device according to the present embodiment along the line Y-Y' in FIG. 7B in the steps of the method for fabricating the semiconductor device.

Figure 19A:
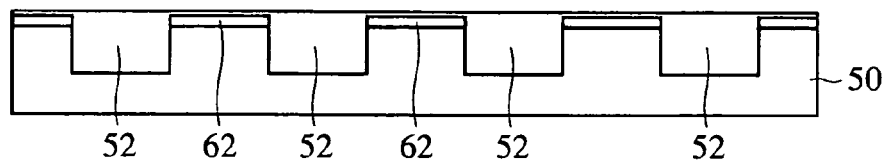
FIGS. 19A-19D and 20A-20C are sectional views of the semiconductor device according to the fifth embodiment of the present invention in the steps of the method for fabricating the semiconductor device, which show the method.
Figure 19B:
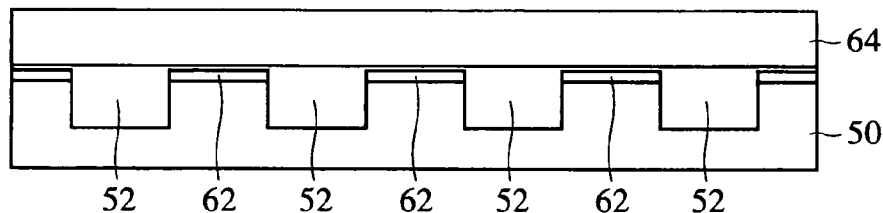
Figure 19C:
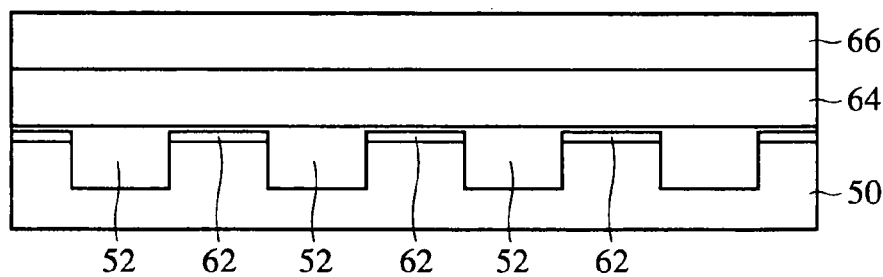

First, in the same way as in the method for fabricating the semiconductor device according to, e.g., the third embodiment shown in FIGS. 9A-9D and FIGS. 11A-11C a bit line contact holes 70 opened in an inter-layer insulation film 64, and a sidewall insulation film 72 are formed (FIGS. 19A-19C).

Subsequently, an about 50 nm-thick phosphorus-doped polycrystalline silicon film, an about 100 nm-thick WSi film, an insulation film 94 of an about 100 nm-thick silicon oxide film, and an about 50 to 100 nm-thick polycrystalline silicon film are continuously deposited.

Subsequently, the laminated film of the polycrystalline silicon film, the insulation film 94, the WSi film and the polycrystalline silicon film is patterned by the usual lithography and etching to form bit lines 74 of the polycide structure having the upper surfaces covered with the etching stopper film 96 of the polycrystalline silicon film and the insulation film 94.

Then, an about 50 nm-thick silicon oxide film and an 200 nm-thick BPSG film are deposited on the entire surface by, e.g., CVD method and then are thermally treated for 10 minutes at 850° C. in a nitrogen atmosphere to reflow the BPSG film. The thus-formed silicon oxide film and the BPSG film are films to be the inter-layer insulation film.

Figure 19D:
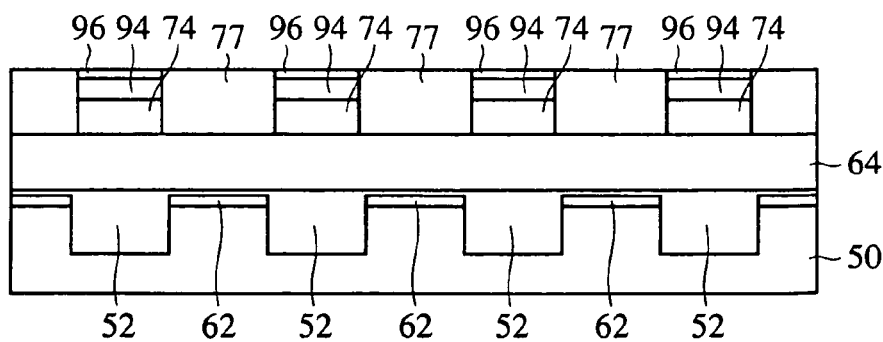

Then, the BPSG film and the silicon oxide film are polished by, e.g., CMP method until the etching stopper film 96 is exposed to leave the silicon oxide film and the BPSG film between the bit lines 74. Thus, the inter-layer insulation film 77 is formed, buried between the bit lines 74 (FIG. 19D).

Subsequently, a photoresist 78 for opening a contact hole for exposing the impurity diffused layer 62 is formed on the inter-layer insulation film 77 and the etching stopper film 96 by the usual lithography technique (see FIG. 10A). As shown in FIG. 14A, the photoresist 78 has a pattern having an opening 80 in a region where the storage electrode and the diffused layer 62 are connected to each other.

Figure 20A:
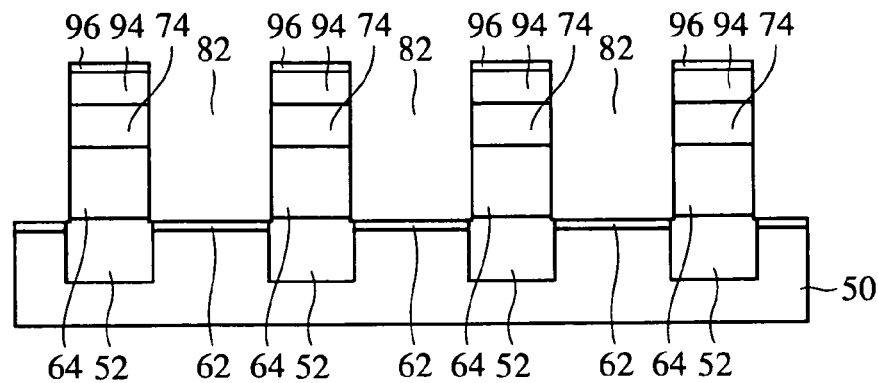

Then, the inter-layer insulation film 64 is anisotropically etched with the photoresist 78 and the etching stopper film 96 as a mask under conditions which make an etching rate of the polycrystalline silicon film sufficiently low to form the contact hole 82 opened on the impurity diffused layer 62 (FIG. 20A).

Next, a thermal treatment is performed at 800° C. in a dry oxygen atmosphere for oxidation by an about 3 nm-film thickness to recover the gate insulation film 56 on the ends of the word lines 56 from etching damages.

Figure 20B:
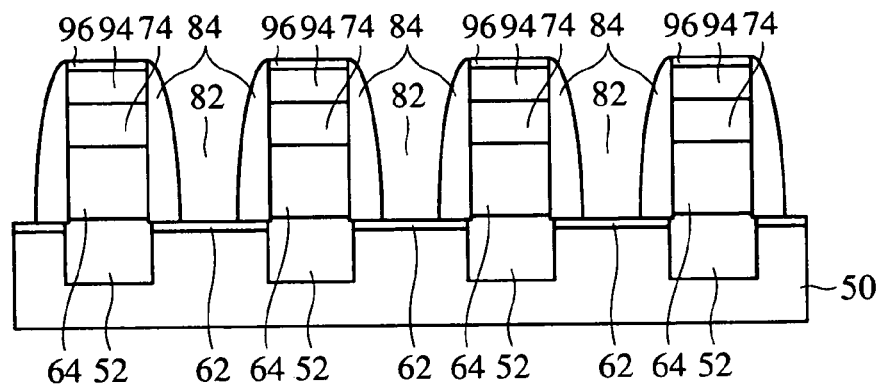

Subsequently, an about 80 nm-thick silicon oxide film is deposited on the entire surface by, e.g., CVD method and then anisotropically etched to form the sidewall insulation film 84 on the side walls of the contact hole 82 (FIG. 20B).

Then, an about 1500 nm-thick phosphorus-doped polycrystalline silicon film is deposited by, e.g., CVD method and is patterned by the usual lithography to form the storage electrode 86 connected to the impurity diffused layer 62 through the contact hole 82. At this time, the etching stopper film 96 of the polycrystalline silicon film on the bit lines 74 is concurrently removed. The etching stopper film 96 is left in a region where the pattern of the bit lines 74 overlap the pattern of the storage electrode 86.

Then, an about 4 nm-thick silicon nitride film is deposited by, e.g., CVD method and then is thermal treated for 10 minutes at 800° C. in a wet oxygen atmosphere to oxidize the surface of the silicon nitride film to form a dielectric film 88 of a silicon oxynitride film of an about 4 nm-thick converted to a thickness of the silicon oxide film.

Figure 20C:
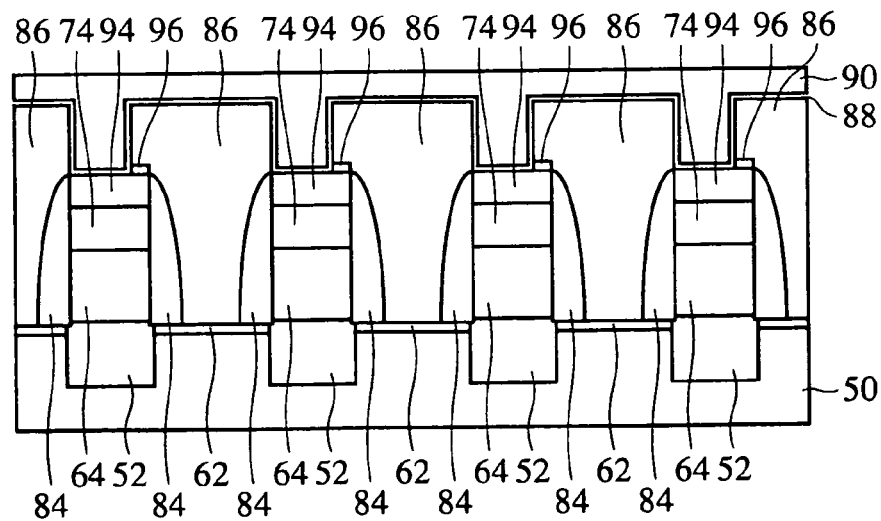

Subsequently, an about 100 nm-thick phosphorus-doped polycrystalline silicon film is deposited by, e.g., CVD method and is patterned by the usual lithography to form an opposed electrode 90 for the capacitor (FIG. 20C).

Thus, a DRAM comprising memory cells each including one transistor and one capacitor is constituted.

As described above, according to the present embodiment, the etching stopper film 96 used in opening the storage electrode contact hole 82 is formed of a conducting film, such as polycrystalline silicon film to form the storage electrode contact hole 82 by the use of the contact hole forming technique of the second embodiment.

A Sixth Embodiment

The semiconductor device and the method for fabricating the same according to a sixth embodiment of the present invention will be explained with reference to FIGS. 21 and 22A-22E. The same members of the present embodiment as the semiconductor device and the method for fabricating the semiconductor device according to the third to the fifth embodiments shown in FIGS. 7A to 20C are represented by the same reference numbers not to repeat or to simplify their explanation.

Figure 21:
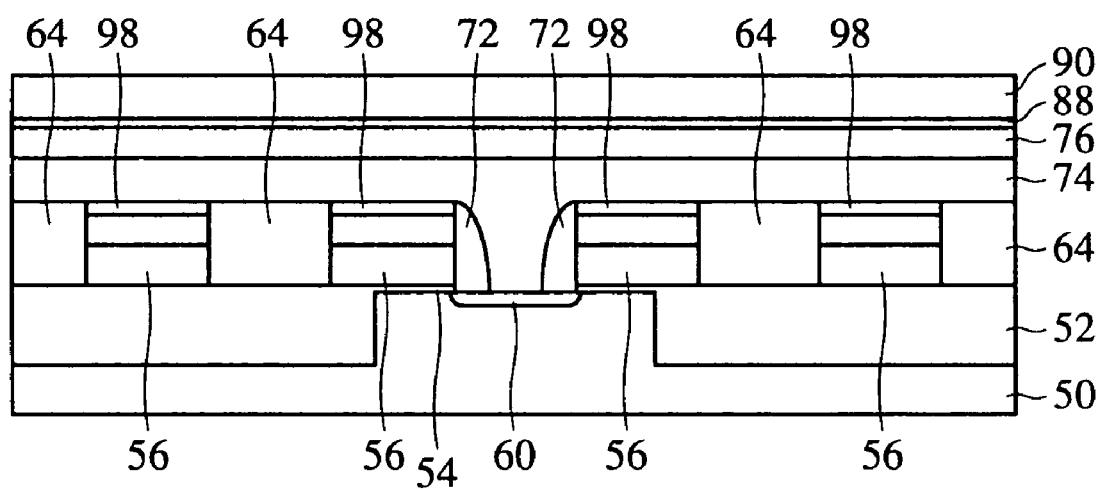
FIG. 21 is a diagrammatic sectional view of the semiconductor device according to a sixth embodiment of the present invention, which shows a structure thereof.

FIG. 21 is a diagrammatic sectional view of the semiconductor device according to the present embodiment, which shows a structure thereof. FIGS. 22A-22E are sectional views of the semiconductor device according to the present embodiment in the steps of the method for fabricating the same, which explain the method.

In the semiconductor device and the method for fabricating the same according to the fifth embodiment, the etching stopper film 96 covering the bit lines 74 are formed of polycrystalline silicon film, but the etching stopper film formed of a conducting film, such as polycrystalline silicon film, may be used as the etching stopper film 58 covering the upper surfaces of the word lines 56.

In the present embodiment, the semiconductor device and the method for fabricating the same according to the fourth embodiment includes the etching stopper film 58 covering the upper surfaces of the word lines 56, which is formed of polycrystalline silicon film First, the structure of the semiconductor device according to the present embodiment will be explained with reference to FIG. 21. The plan view of the semiconductor device according to the present embodiment is the same as that of the semiconductor device according to the third embodiment as shown in FIGS. 7A and 7B.

The semiconductor device according to the present embodiment is the same in the basic structure as the semiconductor device according to the fourth embodiment shown in FIG. 15 but is characterized in that the etching stopper film 58 covering the upper surfaces of the word lines 56 is formed of the etching stopper film 98 of polycrystalline silicon film.

Next, the method for fabricating the semiconductor device according to the present embodiment will be explained with reference to FIGS. 22A-22E. FIGS. 22A-22E are sectional views of the semiconductor device according to the present embodiment along the line X-X' in FIG. 7A in the steps of the method for fabricating the semiconductor device, which explain the method.

First, trenches are formed, by the usual lithography and etching in regions of, e.g., a p-type silicon substrate 50 which are to be device isolation regions.

Then, a silicon oxide film is deposited by, e.g., CVD method, and then the surface of the silicon oxide film is polished to leave the silicon oxide film only in the trenches formed in the silicon substrate 50. Thus, a device isolation film 52 is formed, buried in the silicon substrate 50.

Subsequently, the silicon substrate 50 with the device isolation film 52 formed in is thermally oxidized to form a gate insulation film 54 of, e.g., an about 6 nm-thick silicon oxide film on the surface of the silicon substrate 50.

Then, an about 100 nm-thick polycrystalline silicon film and an about 100 nm-thick WSi film are deposited on the gate insulation film 54 by, e.g., CVD method. The polycide film of the thus-deposited polycrystalline silicon film and WSi film is to be word lines.

An insulation film 92 of an about 200 nm-thick silicon oxide film is deposited on the polycide film by, e.g., CVD method.

Subsequently, a polycrystalline silicon film of an about 50 to 100 nm-thick is deposited on the insulation film 92 by, e.g., CVD method. The polycrystalline silicon film is to be an etching stopper film 98 used in etching an inter-layer insulation film.

Then, the laminated film of the polycrystalline silicon film, the insulation film 92 and the polycide film is patterned by the usual lithography and etching to form the word lines 56 of the polycide structure having the upper surfaces covered with the etching stopper film 98 of the polycrystalline silicon film and the insulation film 92.

Figure 22A:
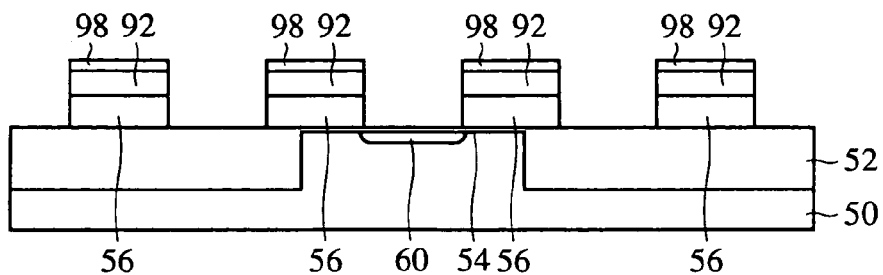
FIGS. 22A-22E are sectional views of the semiconductor device according to the sixth embodiment of the present invention in the steps of the method for fabricating the semiconductor device, which show the method.

Then, phosphorus ions, for example, are implanted into the silicon substrate 50 to form impurity diffused layers 60, 62 in an active region (FIG. 22A).

Subsequently, an about 50 nm-thick silicon oxide film and an about 200 nm-thick BPSG film are deposited on the entire surface by, e.g., CVD method and then is thermal treated for 10 minutes at 850° C. in a nitrogen atmosphere to reflow the BPSG film. The thus-formed silicon oxide film and BPSG film are to be the inter-layer insulation film.

Figure 22B:
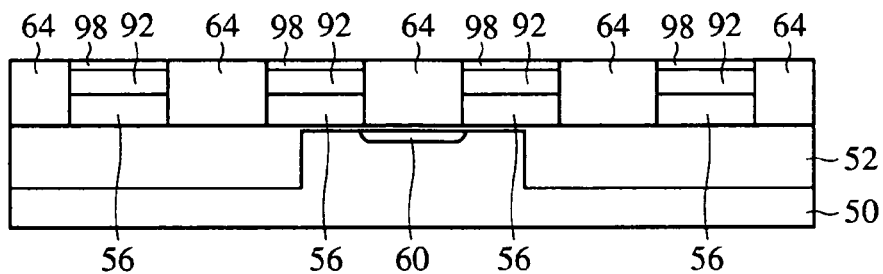

Then, the BPSG film and the silicon oxide film are polished by, e.g., CMP method until the etching stopper film 98 is exposed to leave the silicon oxide film and the BPSG film only between the word lines 56. Thus, the inter-layer insulation film 64 is formed, buried between the word lines 56 (FIG. 22B).

Figure 22C:
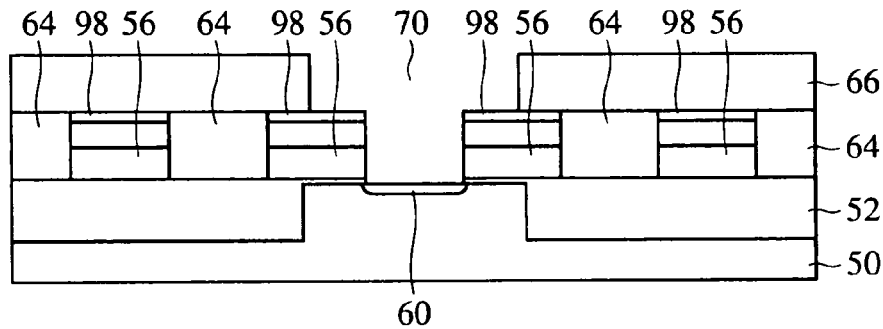

Then, a photoresist 66 for forming a contact hole for exposing the impurity diffused layer 60 is formed on the inter-layer insulation film 64 by the usual lithography technique (FIG. 22C).

Subsequently, with the photoresist 66 and the etching stopper film 98 as a mask, the inter-layer insulation film 64 is anisotropically etched under conditions which allow the polycrystalline silicon film to have a sufficiently low etching rate to form the contact hole 70 opened on the impurity diffused layer 60.

Then, a thermal treatment is performed at 800° C. in a dry oxygen atmosphere for oxidation by an about 3 nm-thick to recover the gate insulation film 54 on the ends of the word lines 56 from etching damages.

Figure 22D:
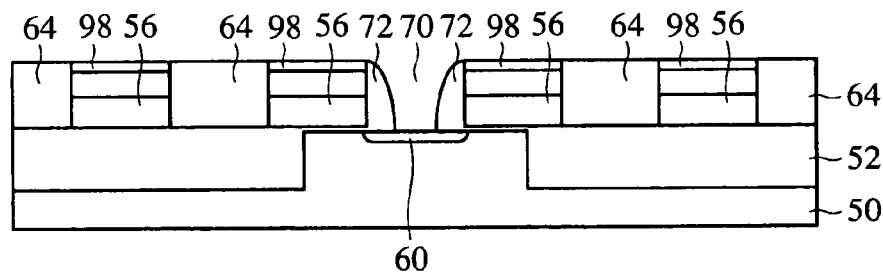

Then, an about 80 nm-thick silicon oxide film is deposited on the entire surface by, e.g., CVD method and then anisotropically etched to form a sidewall insulation film 72 on the side walls of the contact holes 70 (FIG. 22D).

Subsequently, an about 50 nm-thick phosphorus-doped polycrystalline silicon film, an about 100 nm-thick WSi film and an about 200 nm-thick silicon nitride film are continuously deposited by, e.g., CVD method.

Figure 22E:
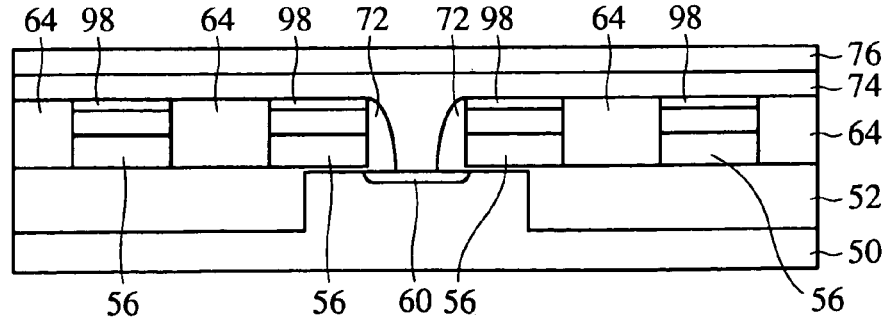

Then, the laminated film of the silicon nitride film, the WSi film and the polycrystalline silicon film is patterned by the usual lithography and etching to form bit lines 74 of the polycide structure having the upper surfaces covered with the etching stopper film 76 of the silicon nitride film. At this time, the etching stopper film 98 covering the upper surfaces of the word lines 56 is removed concurrently with patterning of the bit lines 74. The etching stopper film 98 is left in a region where the pattern of the bit lines 74 crosses the pattern of the word lines 56 (FIG. 22E).

Then, in the same way as in the usual DRAM fabrication method, a capacitor connected to the impurity diffused layer 62 is formed, and a DRAM comprising memory cells each including 1 transistor and 1 capacitor is constituted.

In the method for fabricating the semiconductor device according to the present embodiment, the etching stopper film 98 is absent between the bit lines 74 after the bit lines 74 are patterned. Accordingly, the self-aligned contact forming technique of the second embodiment is inapplicable to the step of opening a storage electrode contact hole, but the storage electrode contact hole can be opened by the alignment of the usual lithography technique.

In a case that plugs are used in a seventh embodiment which will be described later, it is not necessary that the storage electrode contact hole is in self-aligned contact with the word lines 56. Accordingly, the above-described partial removal of the etching stopper film 98 on the word lines 56 causes no inconvenience.

As described above, according to the present embodiment, even in a case that the etching stopper film 98 used in opening the bit line contact hole 70 is formed of a conducting film, such as polycrystalline silicon film or others, the contact hole forming technique of the second embodiment can be used in forming the bit line contact hole 70.

A Seventh Embodiment

The semiconductor device and the method for fabricating the same according to a seventh embodiment of the present invention will be explained with reference to FIGS. 23A-23B, 24A-24E, 25A-25C, 26A-26E, 27A-27C, 28A-28B, 29A-29B and 30. The same members of the present embodiment as the semiconductor device according to the third to the sixth embodiments and the method for fabricating the semiconductor device shown in FIGS. 7A to 22E are represented by the same reference numbers not to repeat or to simplify their explanation.

Figure 23A:
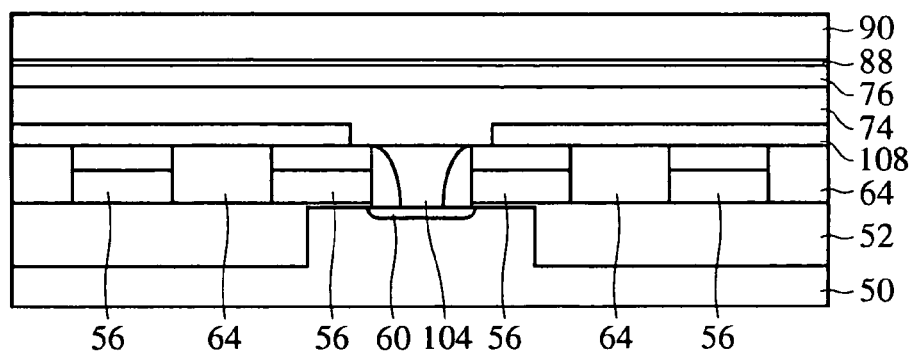
FIGS. 23A and 23B are diagrammatic sectional views of the semiconductor device according o a seventh embodiment of the present invention, which show a structure thereof.
Figure 23B:
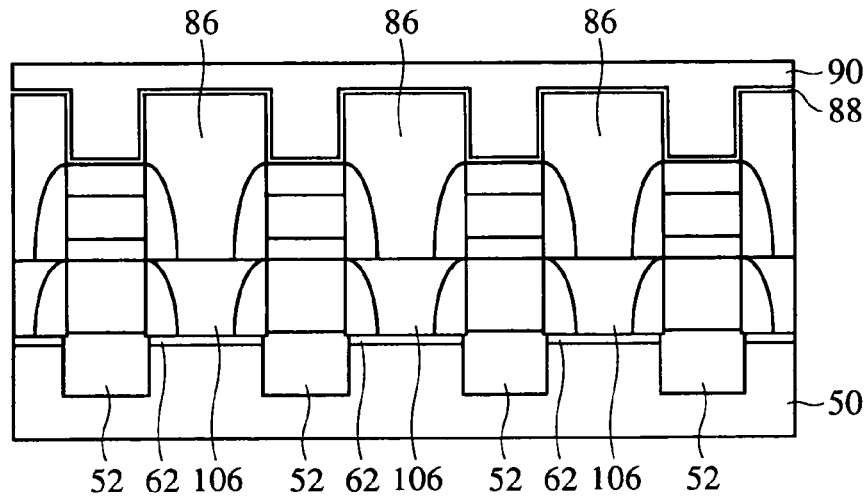
Figure 28A:
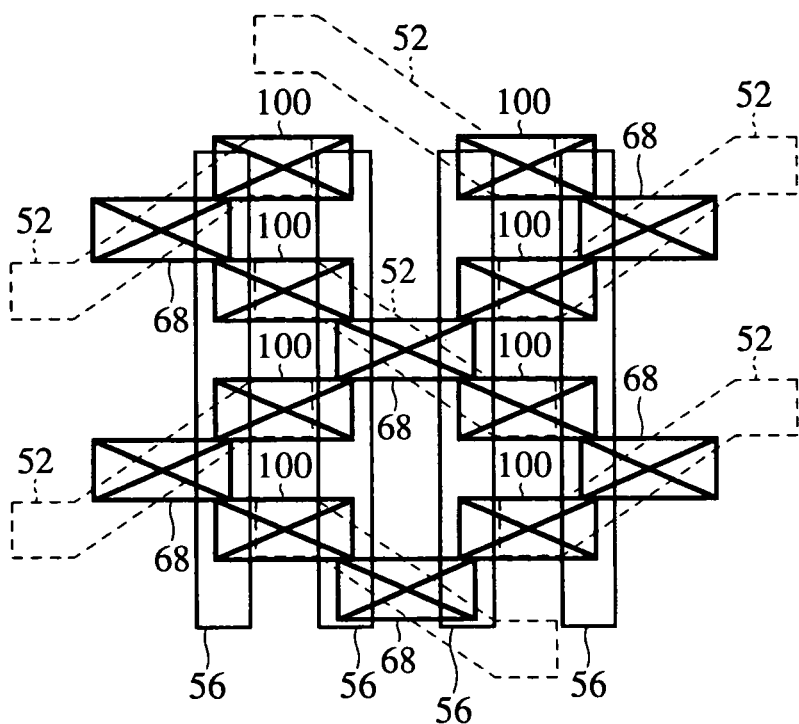
FIGS. 28A and 28B are plan views of a resist pattern for forming bit line contact holes of the semiconductor device according to the seventh embodiment of the present invention, and the opened contact holes.
Figure 28B:
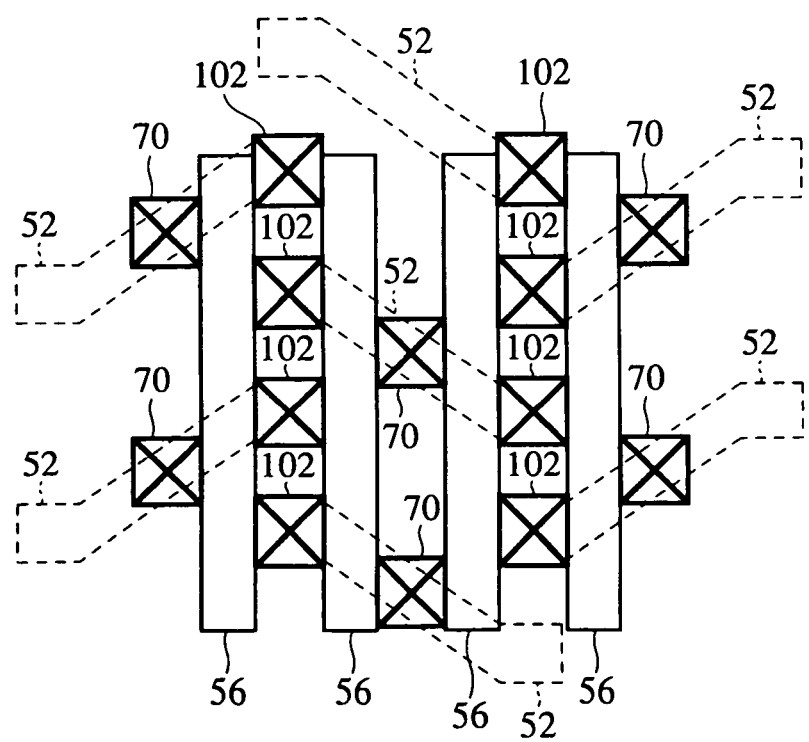
Figure 29A:
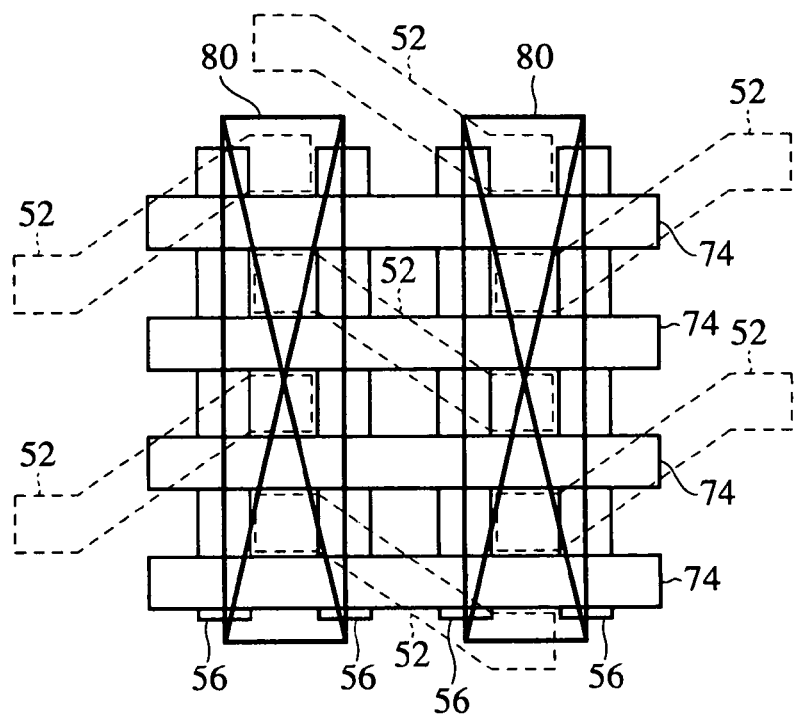
FIGS. 29A and 29B are plan views of a resist pattern for forming storage electrode contact holes of the semiconductor device according to the seventh embodiment of the present invention, and the opened contact holes.
Figure 29B:
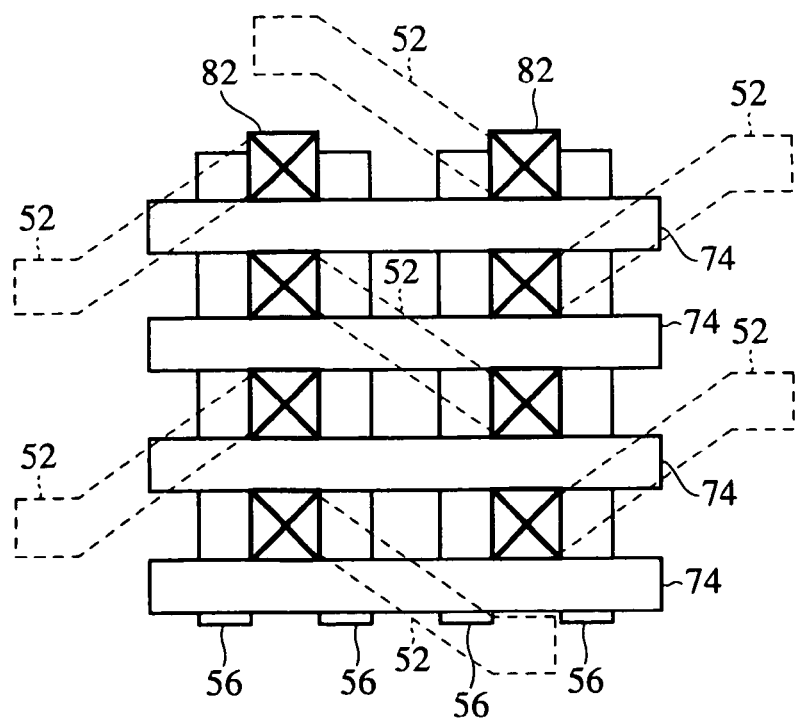
Figure 30:
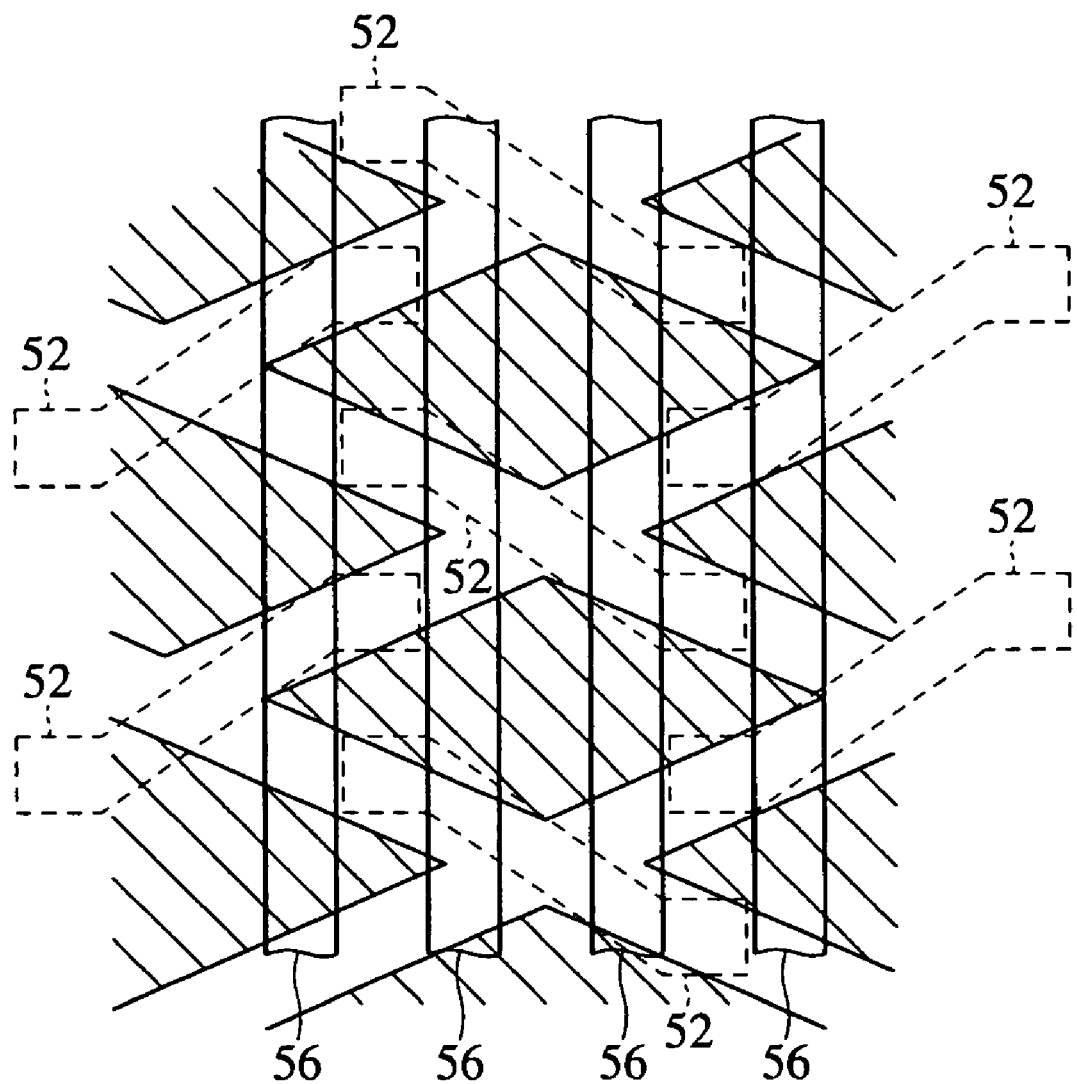
FIG. 30 is a plan view of a resist pattern for forming bit line contact holes of one modification of the semiconductor device according to the seventh embodiment of the present invention.

FIGS. 23A and 23B are diagrammatic sectional views of the semiconductor device according to the present embodiment, which show a structure thereof. FIGS. 24A-24E, 25A-25C, 26A-26E and 27A-27C are sectional views of the semiconductor device according to the present embodiment in the steps of the method for fabricating the same, which explain the method. FIGS. 28A and 28B are plan views of a resist pattern for forming a bit line contact hole of the semiconductor device according to the present embodiment and of the opened contact hole. FIGS. 29A and 29B are plan views of a resist pattern for forming a storage electrode contact hole of the semiconductor device according to the present embodiment and of the opened contact hole. FIG. 30 is a plan view of a resist pattern for forming a bit line contact hole of a modification of the semiconductor device according to the present embodiment.

In the semiconductor device according to the third to the sixth embodiment, the storage electrode contact hole 82 for exposing the silicon substrate 10 is formed. However, the contact size becomes extremely small as the device is increasingly micronized, and the contact hole have a higher aspect ratio, which consequently makes the etching of the contact hole itself difficult.

The semiconductor device and the method for fabricating the same according to the present embodiment can suppress aspect ratio increase of the contact holes.

First, the structure of the semiconductor device according to the present embodiment will be explained with reference to FIGS. 23A and 23B. The plan view of the semiconductor device according to the present embodiment is the same as that of the semiconductor device according to the third embodiment shown in FIGS. 7A and 7B. FIG. 23A is a sectional view of the semiconductor device according to the present embodiment along the line X-X' in FIG. 7A. FIG. 23B is a sectional view of the semiconductor device according to the present embodiment along the line Y-Y' in FIG. 7B.

As shown in FIGS. 23A and 23B, the semiconductor device according to the present embodiment is characterized in that plugs 104. 106 having substantially the same height as an inter-layer insulation film 64 are formed respectively on the bottom of a bit line contact hole 70 and a storage electrode contact hole 82.

In accordance with the method for fabricating the semiconductor device according to the present embodiment, the semiconductor device and the method for fabricating the same according to the present embodiment will be detailed. FIGS. 24A-24E and 25A-25C are sectional views of the semiconductor device according to the present embodiment along the line X-X' in FIG. 7A in the steps of the method for fabricating the semiconductor device. FIGS. 26A-26E and 27A-27C are sectional views of the semiconductor device according to the present embodiment along the line Y-Y' in FIG. 7B in the steps of the method for fabricating the semiconductor device.

First, in the same way as in the method for fabricating the semiconductor device according to, e.g., the third embodiment shown in FIGS. 9A-9B and FIGS. 11A-11B, the inter-layer insulation film 64 is buried between the word lines 56 (FIGS. 24A-24B and 26A-26B).

Figure 24A:
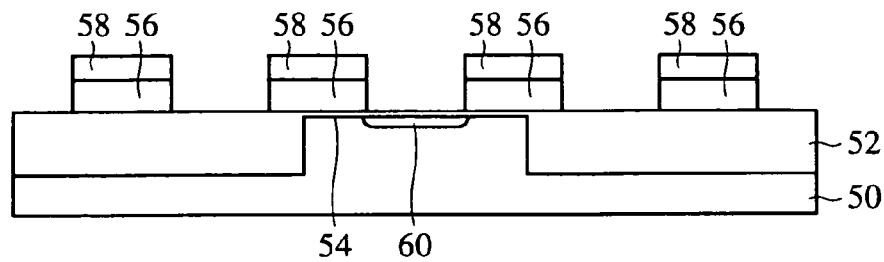
FIGS. 24A-24E, 25A-25C, 26A-26E and 27A-27C are sectional views of the semiconductor device according to the seventh embodiment of the present invention in the steps of the method for fabricating the semiconductor device, which show the method.
Figure 24B:
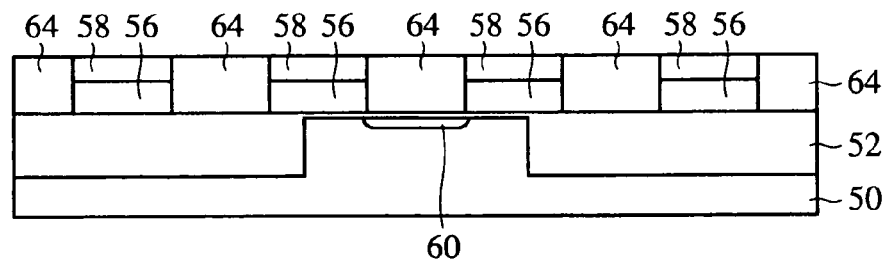
Figure 24C:
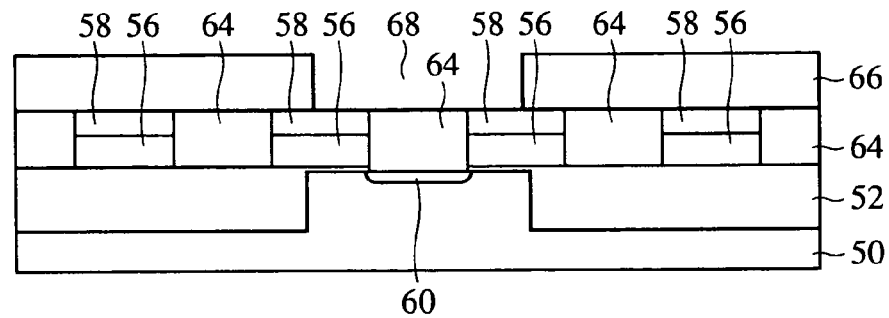

Then, contact holes for exposing impurity diffused layers 60, 62 are formed on the inter-layer insulation film 64 by the usual lithography technique (FIG. 24C). As shown in FIG. 28A, the photoresist 66 has a pattern including an opening 68 in a region where bit lines 74 and the impurity diffused layer 60 are connected to each other, and an opening 100 in a region where a storage electrode 86 and the impurity diffused layer 62 are connected to each other.

The etching stopper film 58 is disposed on the word lines 56, which allows the openings 68, 100 to be extended over the word lines 56. Accordingly, the photoresist 66 can have not only the pattern shown in FIG. 28A, but also the pattern exemplified in FIG. 30, in which the opening 68 and the opening 100 are connected to each other in a mesh. The mask pattern shown in FIG. 30 makes it unnecessary to form a fine hole pattern, which simplifies the lithography step.

Subsequently, the inter-layer insulation film 64 is anisotropically etched with the photoresist 68 and the etching stopper film 58 as a mask under conditions which permit the silicon nitride film to have a sufficiently low etching rate to form the contact hole 70 opened on the impurity diffused layer 60 and the contact hole 102 opened on the impurity diffused layer 62. By the use of the photoresist 66 and the etching stopper film 58 as a mask, the contact holes 70, 102 are opened as shown in FIG. 28B.

Subsequently, a thermal treatment is performed at 800° C. in a dry oxygen atmosphere for oxidation by an about 3 nm-thick to recover the gate insulation film 54 on the ends of the word lines 56 from etching damages.

Figure 24D:
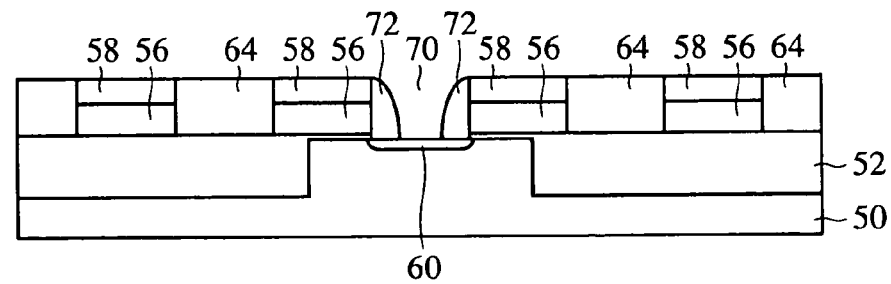
Figure 26A:
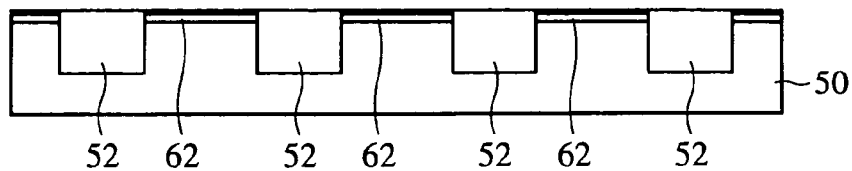
Figure 26B:
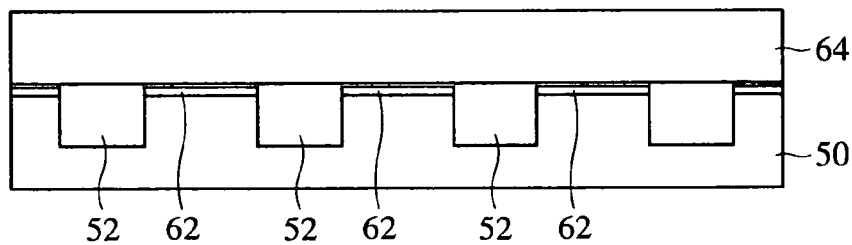
Figure 26C:
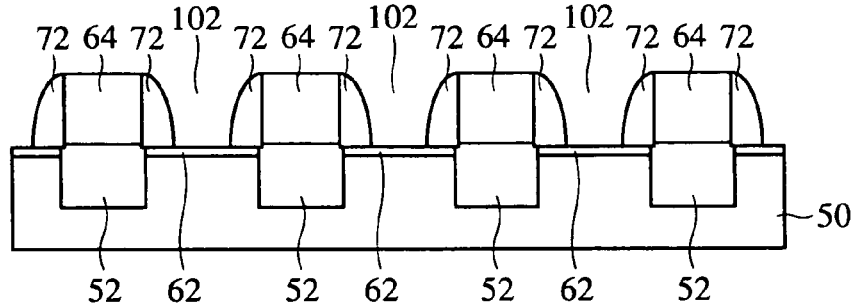

Then, an about 80 nm-thick silicon oxide film is deposited on the entire surface by, e.g., CVD method and then anisotropically etched to form a sidewall insulation film 72 on the side walls of the contact holes 70, 102 (FIG. 24D, FIG. 26C).

Figure 24E:
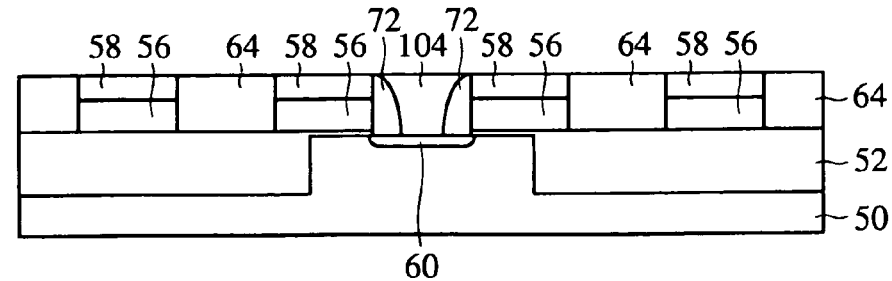
Figure 26D:
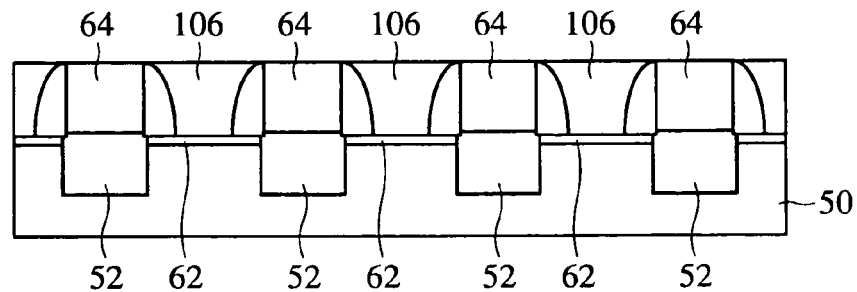

Next, a phosphorus-doped polycrystalline silicon film is deposited on the entire surface by, e.g., CVD method, and then the surface of the polycrystalline silicon film is polished by, e.g., CMP method until the surface of the etching stopper film 58 is exposed to leave the polycrystalline silicon film in the contact holes 70, 102. Thus, a plug 104 buried in the contact hole 70, and a plug 106 buried in the contact hole 102 are formed (FIG. 24E, FIG. 26D). The plug 104 plays a role of elevating the bottom of the bit line contact, and the plug 106 plays a role of elevating the bottom of a storage electrode contact.

In the semiconductor device and the method for fabricating the same according to the present embodiment, the surface of the etching stopper film 58 and the surface of the inter-layer insulation film 64 are substantially flush with each other to thereby retain flatness of the surface of the substrate, which facilitates formation of the plugs 104, 106 by polishing, such as CMP method or others.

In forming a metallization layer by the usual lithography in place of the polishing, the surface flatness of the substrate enables fine patterning without considering a problem of DOF (depth of focus).

Subsequently, a silicon oxide film is deposited on the entire surface by, e.g., CVD method to form an inter-layer insulation film 108 of the silicon oxide film.

Then, a contact hole 110 is opened in the inter-layer insulation film 108 on the plug 104 by the usual lithography and etching.

Then, an about 50 nm-thick phosphorus-doped polycrystalline silicon film, an about 100 nm-thick WSi film and an about 200 nm-thick silicon nitride film are continuously deposited.

Subsequently, the laminated film of the silicon nitride film, the WSi film and the polycrystalline silicon film is patterned by the usual lithography and etching to form a bit line 74 of the polycide structure having the upper surface covered with the etching stopper film formed of the silicon nitride film. The bit line 74 is connected to the plug 104 through a contact hole 110 formed in the inter-layer insulation film 108.

Then, an about 50 nm-thick silicon oxide film and an about 200 nm-thick BPSG film are deposited on the entire surface by, e.g., CVD method and then is thermal treated for 10 minutes at 850° C. in a nitrogen atmosphere to reflow the BPSG film. The thus-formed silicon oxide film and the BPSG film are to be an inter-layer insulation film.

Figure 26E:
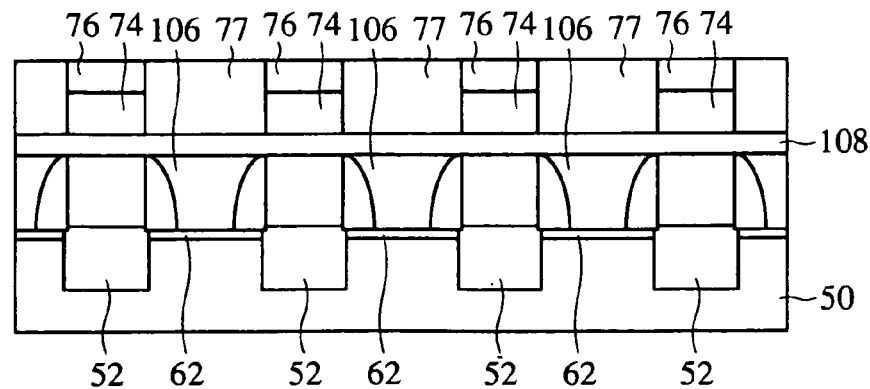

Then, the BPSG film and the silicon oxide film are polished by, e.g., CMP method until the etching stopper film 76 is disposed to leave the silicon oxide film and the BPSG film only between the bit lines 74. Thus, the inter-layer insulation film 77 buried between the bit lines 74 is formed (FIG. 26E).

Figure 25A:
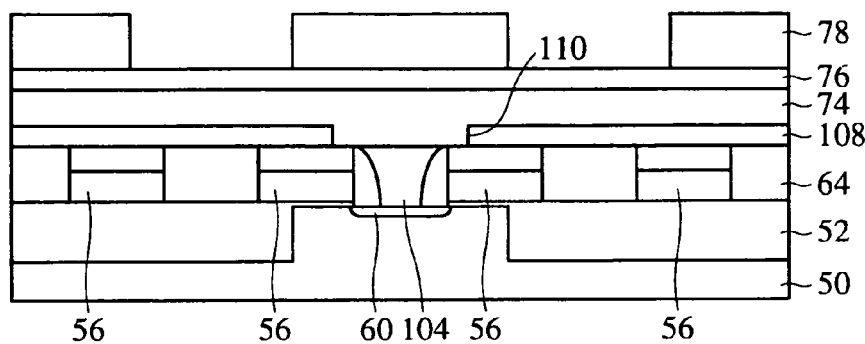

Subsequently, a photoresist 78 for forming a contact hole for exposing the plug 106 is formed on the inter-layer insulation film 77 and the etching stopper film 76 by the usual lithography (FIG. 25A). Because of the etching stopper film 76 is formed on the bit line 74, an opening 80 can be extended over the bit lines 74. As shown in FIG. 29A, a stripe pattern covering a region between the word lines alternately by the bit lines 74, is applicable for the pattern of the photoresist 78.

Figure 27A:
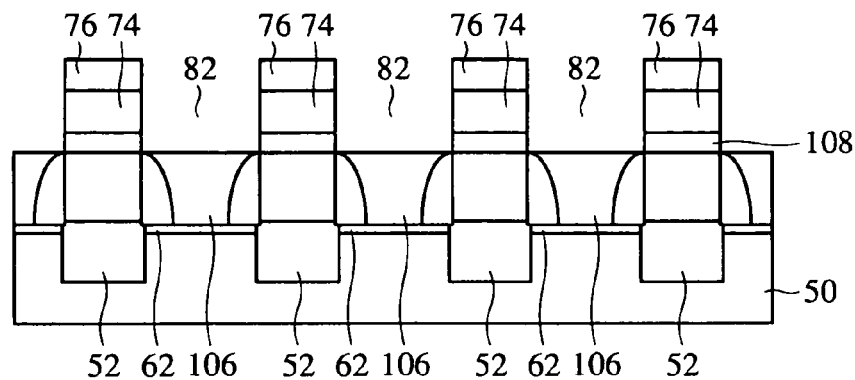

Subsequently, with the photoresist 78 and the etching stopper film 76 as a mask, the inter-layer insulation film 77 is anisotropically etched under conditions which allow the silicon nitride film to have a sufficiently low etching rate to form a contact hole 82 opened on the plug 106 (FIG. 27A). By the use of the photoresist 78 and the etching stopper film 76 as a mask, the contact hole 82 is opened as shown in FIG. 29B.

Figure 25B:
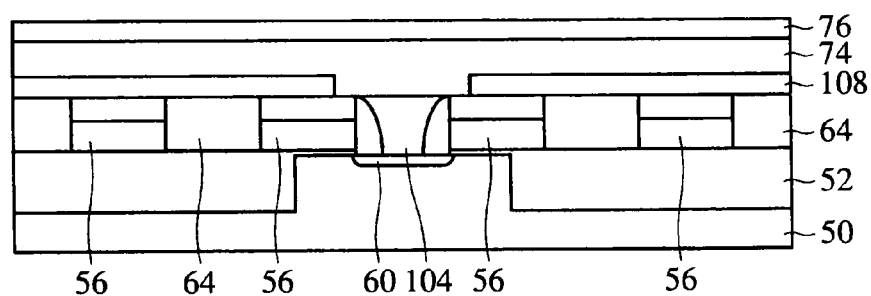
Figure 27B:
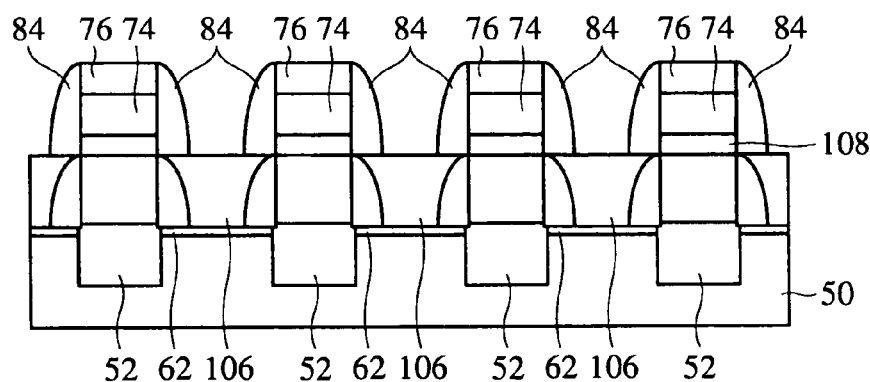

Subsequently, an about 80 nm-thick silicon oxide film is deposited on the entire surface by, e.g., CVD method and is anisotropically etched to form a sidewall insulation film 84 on the side walls of the contact hole 82 (FIG. 25B, FIG. 27B).

Then, an about 1500 nm-thick phosphorus-doped polycrystalline silicon film is deposited by, e.g., CVD method and is patterned by the usual lithography to form a storage electrode 86 connected to the impurity diffused layer 62 through the plug 106. The contact interconnecting the storage electrode 86 and the impurity diffused layer 62 is elevated by the plug 106. Accordingly, in the semiconductor device according to the present embodiment it is not necessary that the contact hole 82 has a high aspect ratio, which facilitates etching of the contact hole 82.

Then, an about 4 nm-thick silicon nitride film is deposited by, e.g., CVD method and then is thermal treated for 10 minutes at 800° C. in a wet oxygen atmosphere to oxidize the silicon nitride film, and a dielectric film 88 of the silicon oxynitride film of an about 4 nm-thick converted to a thickness of the silicon oxide film.

Figure 25C:
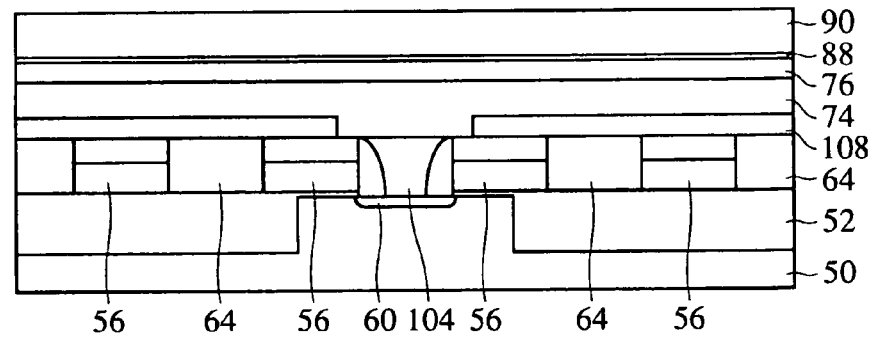
Figure 27C:
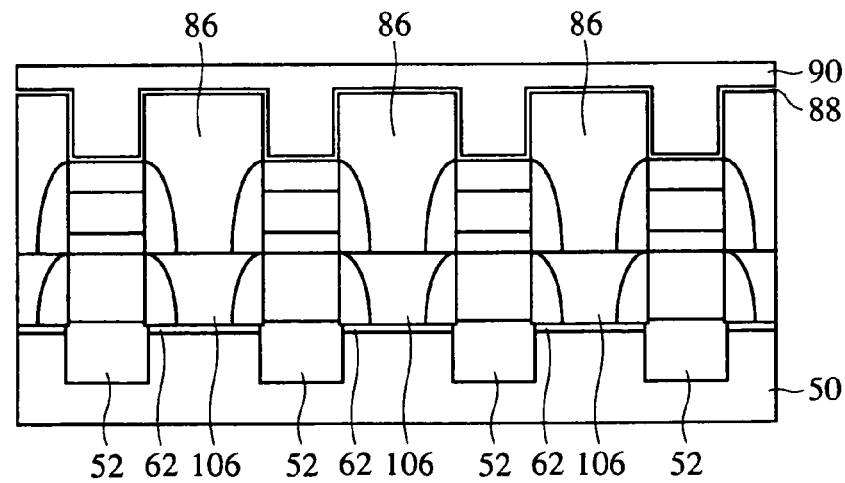

Subsequently, an about 100 nm-thick phosphorus-doped polycrystalline silicon film is deposited by, e.g., CVD method and patterned by the usual lithography to form an opposed electrode 90 for the capacitor (FIG. 25C, FIG. 27C).

Thus, a DRAM comprising memory cells each including 1 transistor and 1 capacitor is constituted.

As described above, according to the present embodiment, the contact for interconnecting the bit lines 74 and the impurity diffused layer 60, and the contact for interconnecting the storage electrode 86 and the impurity diffused layer 62 are elevated by the plugs 104, 106, which the contact holes 70, 82 can be easily opened.

In the present embodiment, the contact elevation is applied to the semiconductor device and the method for fabricating the same according to the third embodiment, but is similarly applicable to the semiconductor device according to the other embodiments and the method for fabricating the same.

An Eighth Embodiment

The semiconductor device and the method for fabricating the same according to an eighth embodiment of the present invention will be explained with reference to FIGS. 31A-31B, 32A-32E, 33A-33C, 34A-34D and 35A-35C. The same members of the present embodiment as the semiconductor device and the method for fabricating the same according to the third to the seventh embodiments shown in FIGS. 7A-30 are represented by the same reference numbers not to repeat or to simplify their explanation.

Figure 31A:
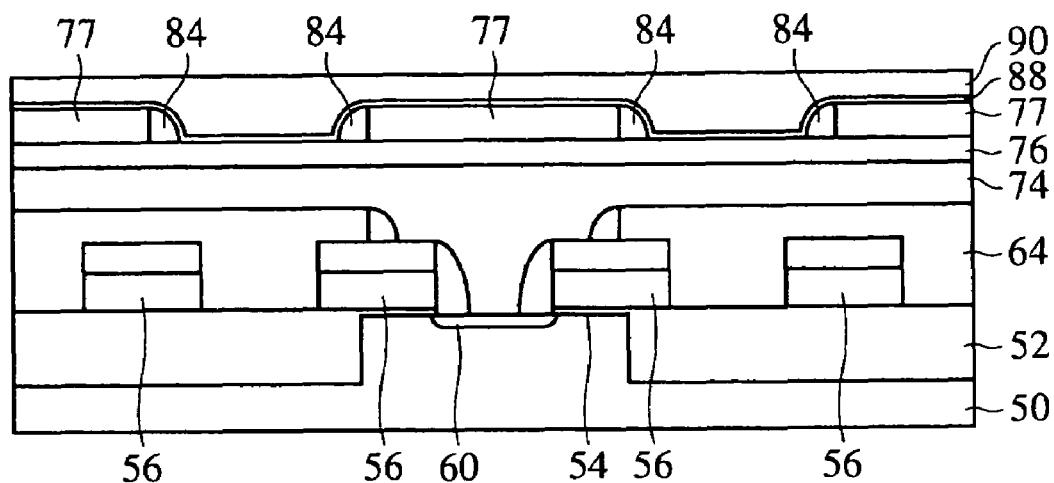
FIGS. 31A and 31B are diagrammatic sectional views of the semiconductor device according to an eighth embodiment of the present invention, which show a structure thereof.
Figure 31B:
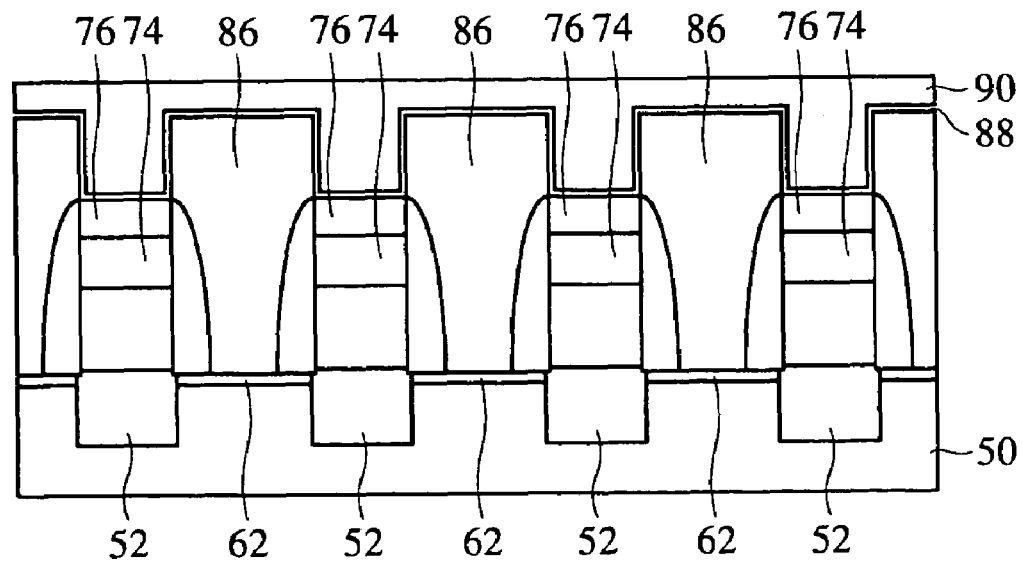

FIGS. 31A and 31B are diagrammatic sectional views of the semiconductor device according to the present embodiment. FIGS. 32A-32E, 33A-33C, 34A-34D and 35A-35C are sectional view of the semiconductor device according to the present embodiment in the steps of the method for fabricating the same, which explain the method.

In the semiconductor device and the method for fabricating the same according to the present embodiment, the self-aligned contact forming method is applied to formation of a bit line contact hole and a storage electrode contact hole of the semiconductor device according to the third embodiment and the method for fabricating the same.

First, a structure of the semiconductor device according to the present embodiment will be explained with reference to FIGS. 31A and 31B. The plan view of the semiconductor device according to the present embodiment is the same as that of the semiconductor device according to the third embodiment shown in FIGS. 7A and 7B. FIG. 31A is a sectional view of the semiconductor device according to the present embodiment along the line X-X' in FIG. 7A. FIG. 31B is a sectional view of the semiconductor device according to the present embodiment along the line Y-Y' in FIG. 7B.

A device isolation film 52 for isolating devices is formed, buried in a silicon substrate 50. A plurality of word lines 56 are formed through a gate insulation film 54 on the silicon substrate 50 with the device isolation film 52 formed on, extended parallel with each other vertically of the sheet of the drawing. An etching stopper film 58 is formed on the word lines 56. Impurity diffused layers 60, 62 are formed in the silicon substrate 50 on both sides of the word lines 56. The gate electrodes provided by the word lines 56, and the impurity diffused layers 60, 62 constitute a transfer transistor. An inter-layer insulation film 64 is formed on the word lines 56. A plurality of bit lines 74 are formed on the inter-layer insulation film 64, extended parallel with each other horizontally of the sheet of the drawing. The bit lines 74 are connected to the impurity diffused layer 60 in positions where the bit lines 74 intersect an active region defined by the device isolation film 52. A storage electrode 86 is formed on the impurity diffused layer 62. An opposed electrode 90 is formed on the storage electrode 86 through a dielectric film 88. The storage electrode 86, the dielectric film 88 and the opposed electrode 90 constitute a capacitor.

In a DRAM thus comprising memory cells each including 1 transistor and 1 capacitor, the semiconductor device according to the present embodiment uses the self-aligned contact in the step of opening the contact hole for connecting the impurity diffused layer 60 to the bit lines 74 and the step of opening the contact hole for connecting the impurity diffused layer 62 to the storage electrode 86.

The semiconductor device and the method for fabricating the same according to the present embodiment will be detailed in accordance with the method for fabricating the semiconductor device according to the present embodiment. FIGS. 32A-32E and 33A-33C are sectional views of the semiconductor device according to the present embodiment along the line X-X' in FIG. 7A in the steps of the method for fabricating the semiconductor device, which explain the method. FIGS. 34A-34D and 35A-35C are sectional views of the semiconductor device according to the present embodiment along the line Y-Y' in FIG. 7B in the steps of the method for fabricating the semiconductor device, which explain the method.

First, trenches are formed in, e.g., a p-type silicon substrate 50 in regions to be device isolation regions by the usual lithography and etching.

Then, a silicon oxide film is deposited by, e.g., CVD method, and then the surface of the silicon oxide film is polished to be left only in the trenches formed in the silicon substrate 50. Thus, the device isolation film 52 is formed, buried in the silicon substrate 50.

Subsequently, the silicon substrate 50 with the device isolation film 52 formed on is thermally oxidized to form the gate insulation film 54 of, e.g., an about 6 nm-thick of silicon oxide film is formed on the surface of the silicon substrate 50.

Then, an about 100 nm-thick polycrystalline silicon film and an about 100 nm-thick WSi film are deposited on the gate insulation film 54. The polycide film of the thus-deposited polycrystalline silicon film and the WSi film is to be the word lines.

Then, an about 200 nm-thick silicon nitride film is deposited on the polycide film by, e.g., CVD method. The silicon nitride film is to be the etching stopper film to be used in etching the inter-layer insulation film.

Subsequently, the laminated film of the silicon nitride film and the polycide film is patterned by the usual lithography and etching to form the word lines 56 of the polycide structure having the upper surface covered with the etching stopper film 58 formed of the silicon nitride film.

Figure 32A:
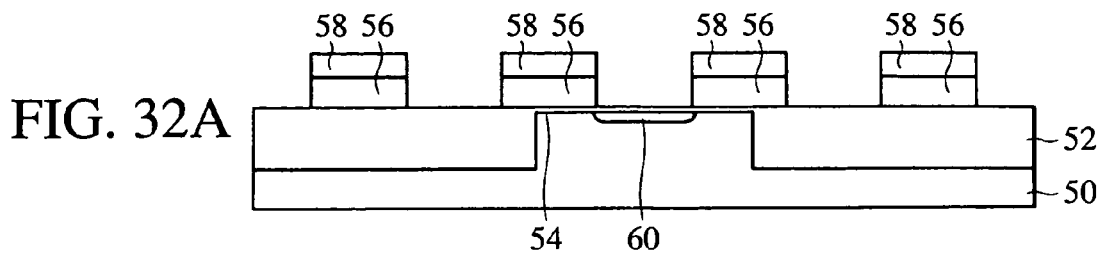
FIGS. 32A-32E, 33A-33C, 34A-34D and 35A-35C are sectional views of the semiconductor device according to the eighth embodiment of the present invention in the steps of the method for fabricating the semiconductor device, which show the method.
Figure 34A:
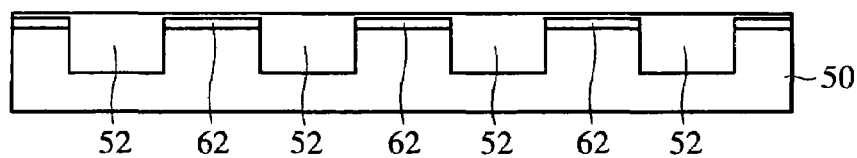

Then, phosphorus ions, for example, are implanted into the silicon substrate 50 with the word lines 56 as a mask to form the impurity diffused layers 60, 62 in an active region (FIG. 32A, FIG. 34A). Phosphorus ions are implanted under conditions of, e.g., a 30 keV acceleration energy and a $2 \times 10^{13}$ cm$^{-2}$ dose to form the impurity diffused layers 60, 62.

Figure 32B:
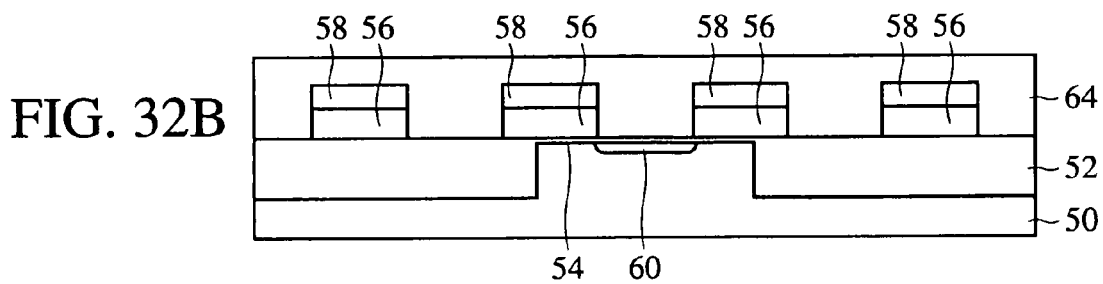
Figure 34B:
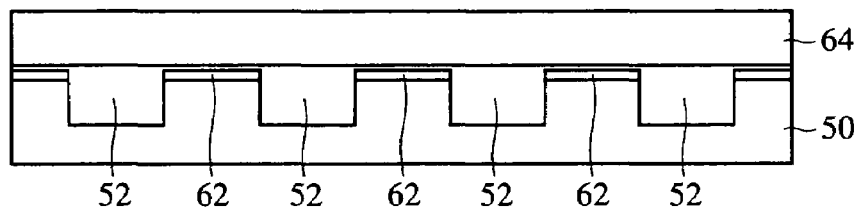

Then, a silicon oxide film is deposited on the entire surface by, e.g., CVD method, and then the surface of the silicon oxide film is polished by, e.g., CMP method and planarized to form the inter-layer insulation film 64 of the silicon oxide film (FIG. 32B, FIG. 34B). The inter-layer insulation film 64 can be also formed by forming a BPSG film on the entire surface by, e.g., CVD method and reflowing the thus-formed BPSG film.

Subsequently, a photoresist 66 for forming a contact hole for exposing the impurity diffused layer 60 is formed on the inter-layer insulation film 64 by the usual lithography technique. As shown in FIG. 13A, the photoresist 66 is formed so that the ends of an opening 68 are extended over the word lines 56, whereby a size of the opening in the photoresist 66 may be large, and a large alignment allowance can be obtained.

Figure 32C:
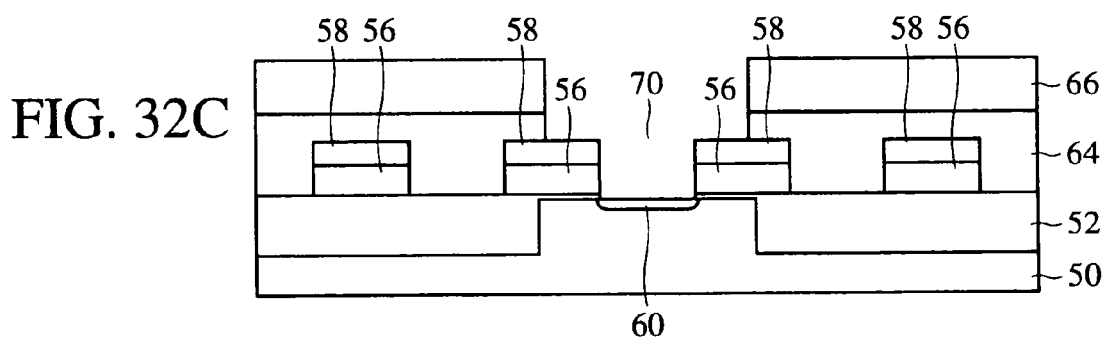
Figure 34C:
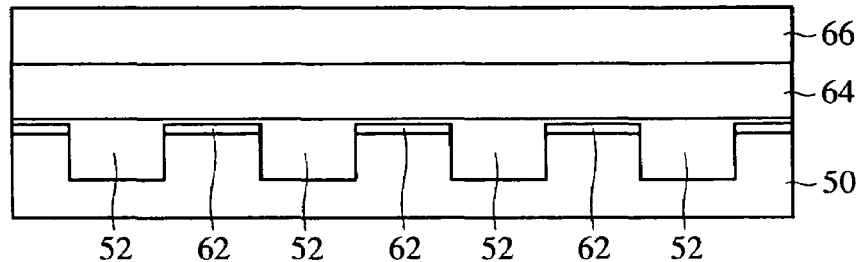
Figure 34D:
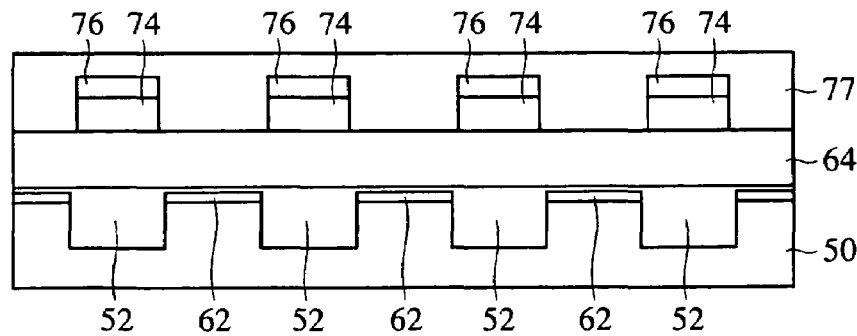

Then, the inter-layer insulation film 64 is anisotropically etched with the photoresist 66 and the etching stopper film 58 as a mask under conditions which permit the silicon nitride film to have a sufficiently low etching rate to form the contact hole 70 opened on the impurity diffused layer 60 (FIG. 32C, FIG. 34C).

Subsequently, a thermal treatment is performed at 800° C. in a dry oxygen atmosphere for oxidation by an about 3 nm-thick to recover the ends of the gate insulation film 54 from etching damages.

Figure 32D:
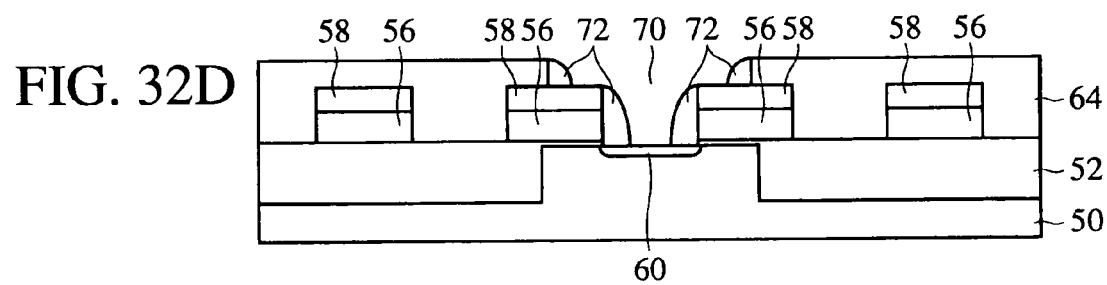

Then, an about 80 nm-thick silicon oxide film is deposited on the entire surface by, e.g., CVD method and then is anisotropically etched to form a sidewall insulation film 72 on the side walls of the inter-layer insulation film 64 in the contact hole 70 and the side walls of the word lines 56 and of the etching stopper film 58 (FIG. 32D).

Then, an about 50 nm-thick phosphorus-doped polycrystalline silicon film, an about 100 nm-thick WSi film and an about 200 nm-thick silicon nitride film are continuously deposited by, e.g., CVD method.

Figure 32E:
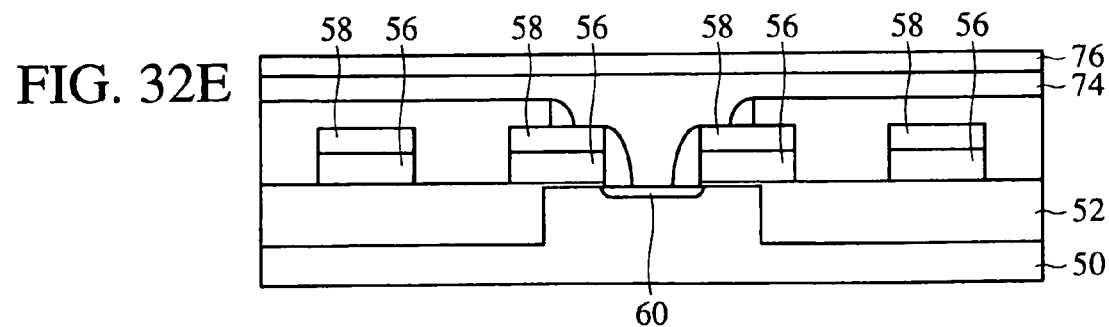

Subsequently, the laminated film of the silicon nitride film, the WSi film and the polycrystalline silicon film is patterned by the usual lithography and etching to form the bit lines 74 of the polycide structure having the upper surface covered with the etching stopper film 76 formed of the silicon nitride film (FIG. 32E).

Then, a silicon oxide film is deposited on the entire surface by, e.g., CVD method, and the surface of the silicon oxide film is polished by, e.g., CMP method to be planarized to form the inter-layer insulation film 77 of the silicon oxide film (FIG. 32B, FIG. 34B). The inter-layer insulation film 77 can be also formed by forming a BPSG film on the entire surface by, e.g., CVD method and reflowing the thus-formed BPSG film.

Figure 33A:
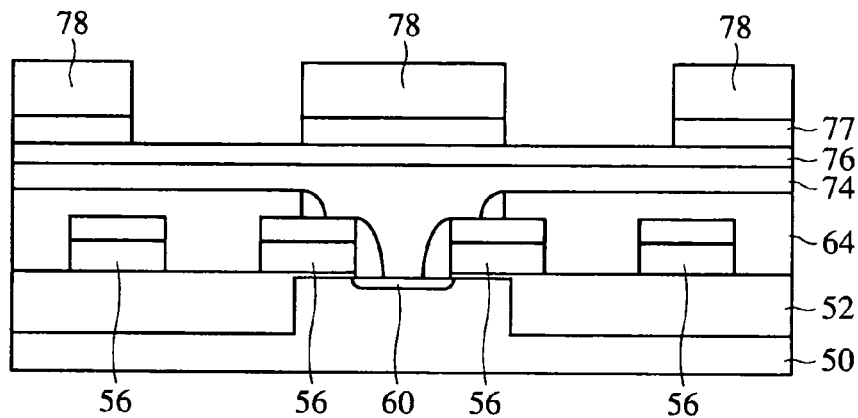

Then, a photoresist 78 for forming a contact hole for exposing the impurity diffused layer 62, on the inter-layer insulation film 77 by the usual lithography (FIG. 33A). Because of the etching stopper film 76 on the bit lines 74, the opening can be extended over the bit lines 74, and as shown in FIG. 14A, the stripe pattern in which the region between the word lines 56 is covered alternately by the bit lines can be formed. The stripe pattern of the photoresist 78 makes fine alignment and sizing unnecessary, which simplifies the lithography step.

Figure 35A:
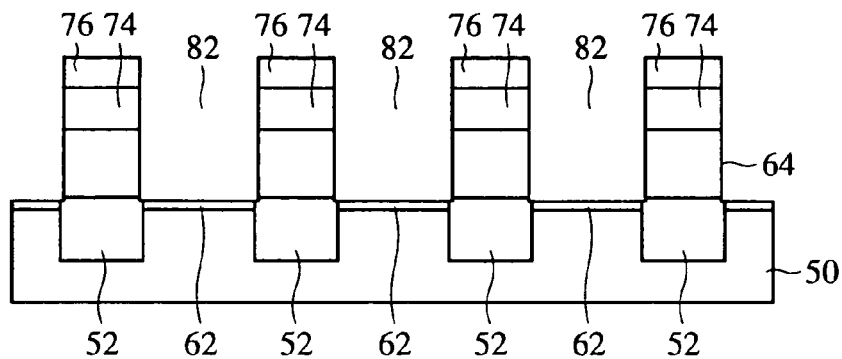

Then, the inter-layer insulation film 64 is anisotropically etched with the photoresist 78 and the etching stopper film 76 as a mask under conditions which allows the silicon nitride film to have a sufficiently low etching speed to form the contact hole 82 opened on the impurity diffused layer 62 (FIG. 35A).

Subsequently, a thermal treatment is performed at 800° C. in a dry oxygen atmosphere for oxidation by an about 3 nm-thick to recover the ends of the gate insulation film 156 from etching damages.

Figure 33B:
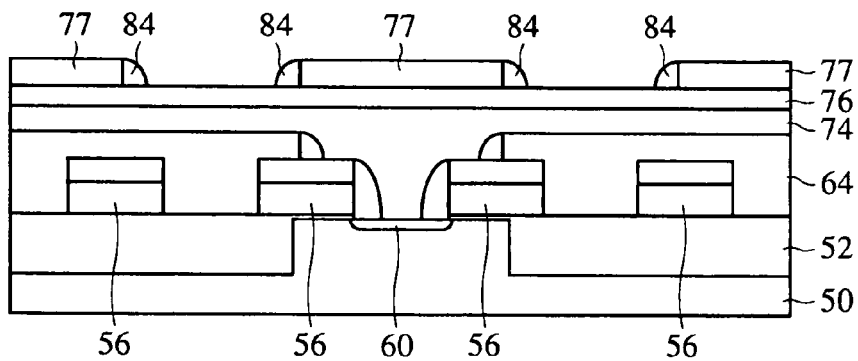
Figure 35B:
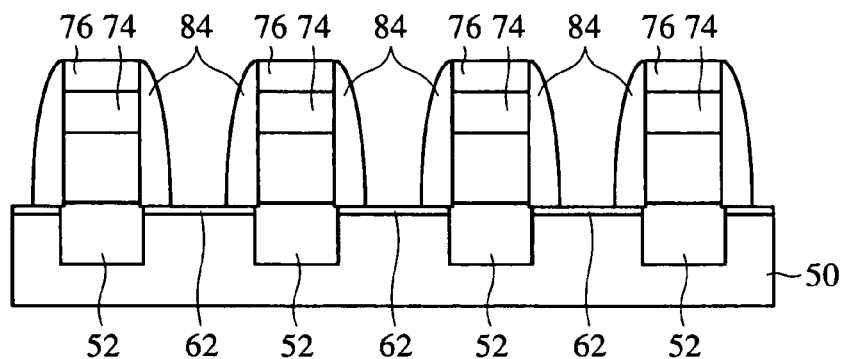

Then, an about 80 nm-thick silicon oxide film is deposited on the entire surface by, e.g., CVD method and then anisotropically etched to form the sidewall insulation film 84 on the side walls of the contact hole 82 and of the inter-layer insulation film 77 (FIG. 33B, FIG. 35B).

Next, an about 1500 nm-thick phosphorus-doped polycrystalline silicon film is deposited by, e.g., CVD method and patterned by the usual lithography to form the storage electrode 86 connected to the impurity diffused layer 62 through the contact hole 82. As exemplified in FIG. 7B, the storage electrode 86 can be formed in the region between the bit lines 74.

In patterning for forming the storage electrode 86, it is necessary that no etching residue is present on the steps of the inter-layer insulation film 77. In the method for fabricating the semiconductor device according to the present embodiment, however, the steps of the inter-layer insulation film 77 are smoothed by the sidewall insulation film 84 formed on the steps such as FIG. 33B, which facilitates removal the etching residue in comparison with the removal from steep steps.

Subsequently, an about 4 nm-thick silicon nitride film is deposited by, e.g., CVD method, and then a thermal treatment is performed for 10 minutes a 800° C. in a wet oxygen atmosphere to oxidize the surface of the silicon nitride film to form a dielectric film 88 of the silicon oxynitride film of an about 4 nm-thick converted to a thickness of the silicon oxide film.

Figure 33C:
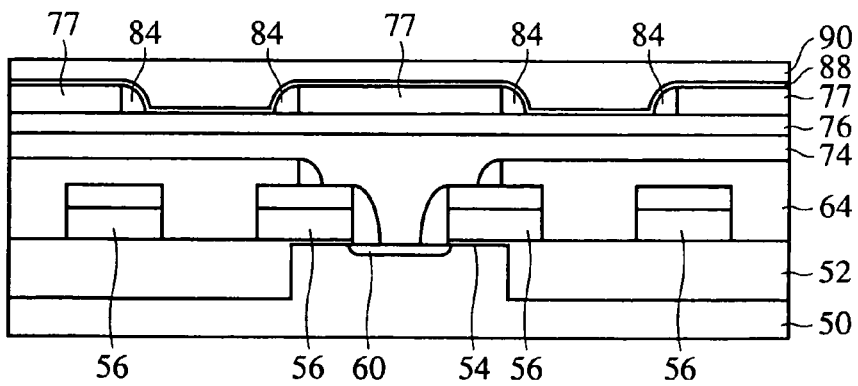
Figure 35C:
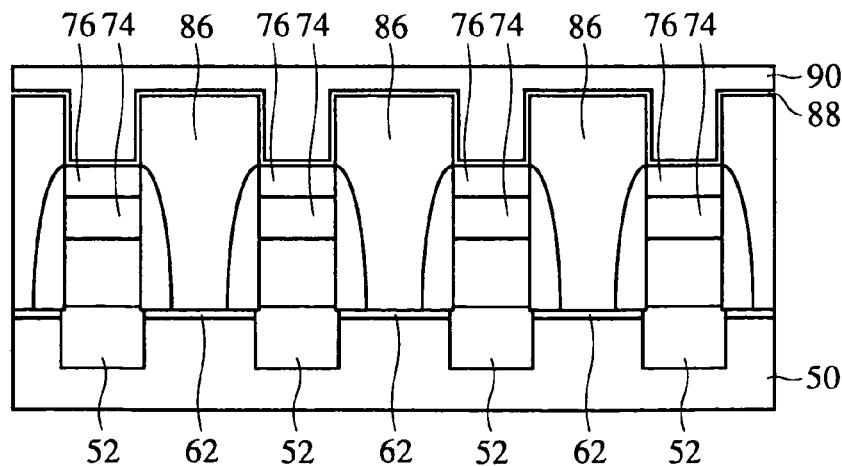

Then, an about 100 nm-thick phosphorus-doped polycrystalline silicon film is deposited by, e.g., CVD method and then patterned by the usual lithography to be the opposed electrode 90 for a capacitor (FIG. 33C, FIG. 35C).

Thus, a DRAM comprising memory cells each including 1 transistor and 1 capacitor is constituted.

As described above, according to the present embodiment, the word lines or the bit lines having the surfaces covered with the etching stopper film, then the inter-layer insulation film extended over the etching stopper film, and then a contact hole extended over the word lines or the bit lines is formed in the inter-layer insulation film, whereby in the lithography step of forming the contact hole it is not necessary that the hole pattern is fine, and a large alignment allowance can be used. Thus, the lithography step of forming the contact hole can be simplified.

The opening in the photoresist for forming the contact hole is extended over the word lines or the bit lines, whereby a size of the contact hole does not vary even when disalignment takes place in the lithography.

The sidewall insulation film 72 is formed after the contact hole 70 is opened, whereby it is not necessary to open the contact hole 70 in the sidewall insulation film by self-alignment, which allows silicon oxide film to form the sidewall insulation film 72. Accordingly, in comparison with the conventional method in which the sidewall insulation film 72 is formed of silicon nitride film, the transistor can have improved hot carrier immunity.

A Ninth Embodiment

The semiconductor device and the method for fabricating the same according to a ninth embodiment of the present invention will be explained with reference to FIGS. 36A-36B, 37A-37C, 38A-38B, 39A-39B, 40A-40C, 41A-41B and 42A-42B. The same members of the present embodiment as the semiconductor device and the method for fabricating the same according to the eighth embodiment shown in FIGS. 7A to 35C will be represented by the same reference numbers not to repeat or to simplify their explanation.

Figure 36A:
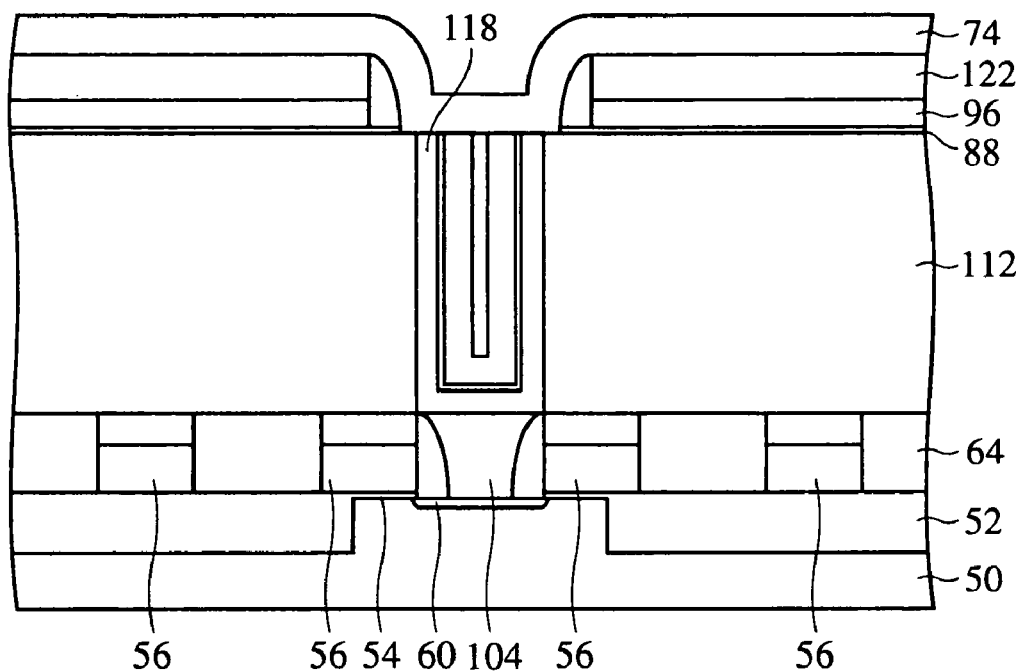
FIGS. 36A and 36B are diagrammatic sectional views of the semiconductor device according to a ninth embodiment of the present invention, which show a structure thereof.
Figure 36B:
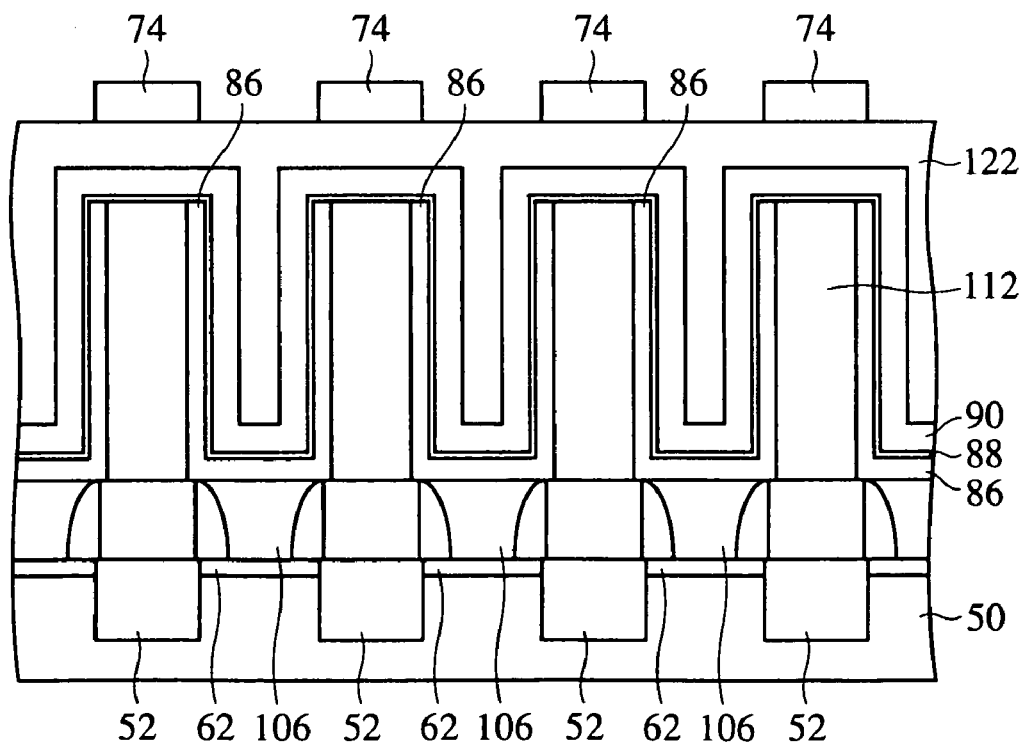

FIGS. 36A and 36B are diagrammatic sectional views of the semiconductor device according to the present embodiment, which show a structure thereof. FIGS. 37A-37C, 38A-38B, 39A-39B, 40A-40C, 41A-41B and 42A-42B are sectional views of the semiconductor device according to the present embodiment in the steps of the method for fabricating the same, which explain the method.

The third to the eighth embodiments of the semiconductor device and the method for fabricating the same were DRAMs having the capacitors above the bit lines. However, the present invention is applicable to DRAMs having bit lines above capacitors.

The present embodiment is one example of applying the present invention to a DRAM having bit lines above capacitors.

First, the structure of the semiconductor device according to the present embodiment will be explained with reference to FIGS. 36A and 36B. The plan view of the semiconductor device according to the present embodiment is the same as that of the semiconductor device according to the third embodiment shown in FIGS. 7A and 7B. FIG. 36A is a diagrammatic sectional view of the semiconductor device according to the present embodiment along the line X-X' in FIG. 7A, and FIG. 36B is a diagrammatic sectional view of the semiconductor device according to the present embodiment along the line Y-Y' in FIG. 7B.

A device isolation film 52 for isolating devices is formed, buried in a silicon substrate 50. On the silicon substrate 50 with the device isolation film 52 formed in, a plurality of word lines 56 are formed through a gate insulation film 54, extended parallel with each other and vertically of the sheet of the drawing. An etching stopper film 58 is formed on the word lines 56. Impurity diffused layers 60, 62 are formed in the silicon substrate 50 on both sides of the word lines 56. The gate electrodes provided by the word lines 56, and the impurity diffused layers 60, 62 constitute a transfer transistor. An inter-layer insulation film 64 having substantially the same height as the etching stopper film 58 is buried between the word lines 56. An inter-layer insulation film 112 is formed on the etching stopper film 58 and the inter-layer insulation film 64. In the inter-layer insulation film 112 there are formed a contact conducting film 118, connected to the impurity diffused layer 60 through a plug 104, which formed on an inside wall of a contact hole formed in the inter-layer insulation film 112, and a storage electrode 86 connected to the impurity diffused layer 60 through a plug 106, which formed on an inside wall of a contact hole formed in the inter-layer insulation film 112. An opposed electrode 90 is formed on the surface of the storage electrode 86 through a dielectric film 88. An inter-layer insulation film 122 is formed on the opposed electrode 90. On the inter-layer insulation film 122 there are formed bit lines 74 connected to the impurity diffused layer 60 through the contact conducting film 118 and the plug 106. Thus, the storage electrode 86, the dielectric film 88 and the opposed electrode 90 constitute a capacitor.

Thus, a DRAM comprising memory cells each including 1 transistor and 1 capacitor is constituted.

The semiconductor device and the method for fabricating the same according to the present embodiment will be detailed in accordance with the steps of the method for fabricating the semiconductor device according to the present embodiment. FIGS. 37A-37C, 38A-38B and 39A-39B are sectional views of the semiconductor device according to the present embodiment along the line X-X' in FIG. 7A, which are in the steps of the method for fabricating the same. FIGS. 40A-40C, 41A-41B and 42A-42B are sectional views of the semiconductor device according to the present embodiment along the line Y-Y' in FIG. 7B, which are in the steps of the method for fabricating the same.

Figure 37A:
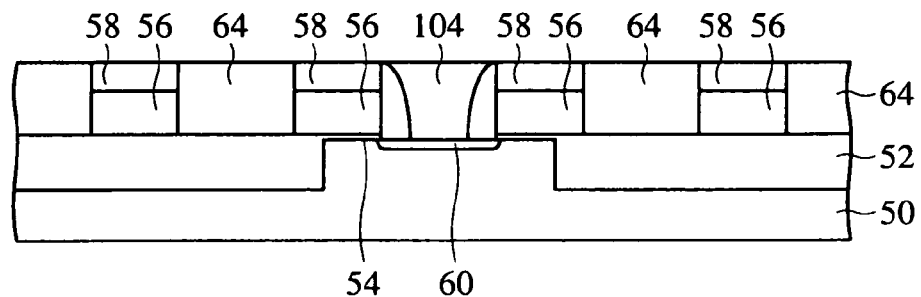
Figure 40A:
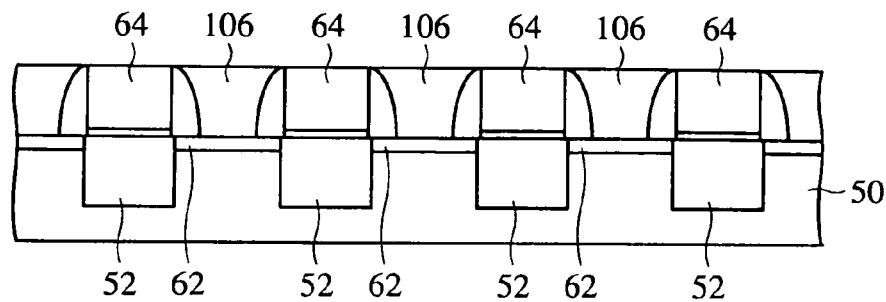

In the same way as in the method for fabricating the semiconductor device according to the seventh embodiment, for example, shown in FIGS. 24A-24D and FIGS. 26A-26D, the plug 104 connected to the impurity diffused layer 60 and the plug 106 connected to the impurity diffused layer 62 are formed (FIG. 37A, FIG. 40A).

Then, an about 2 82 m-thick silicon oxide film is deposited on the entire surface by, e.g., CVD method, and the surface of the silicon oxide film is polished by e.g., CMP method and planarized. Thus, the inter-layer insulation film 112 of silicon oxide film is formed.

Figure 37B:
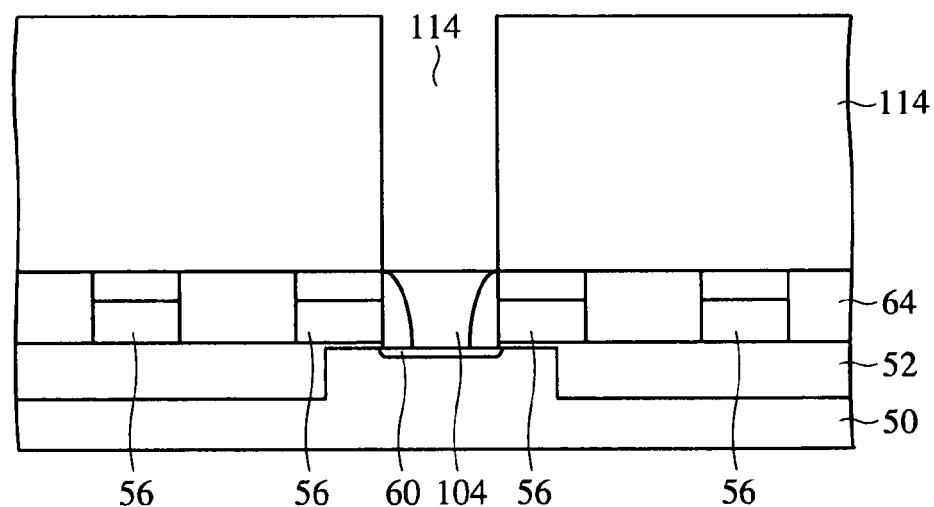
Figure 40B:
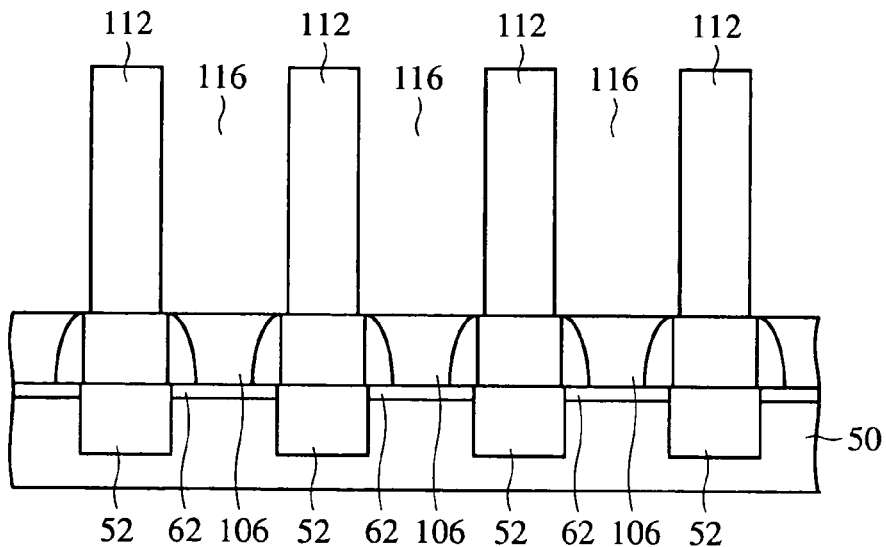

Then, a through-hole 114 and a through-hole 116 are formed in the inter-layer insulation film 112, opened respectively on the plug 104 and the plug 106 (FIG. 37B, FIG. 40B).

Figure 37C:
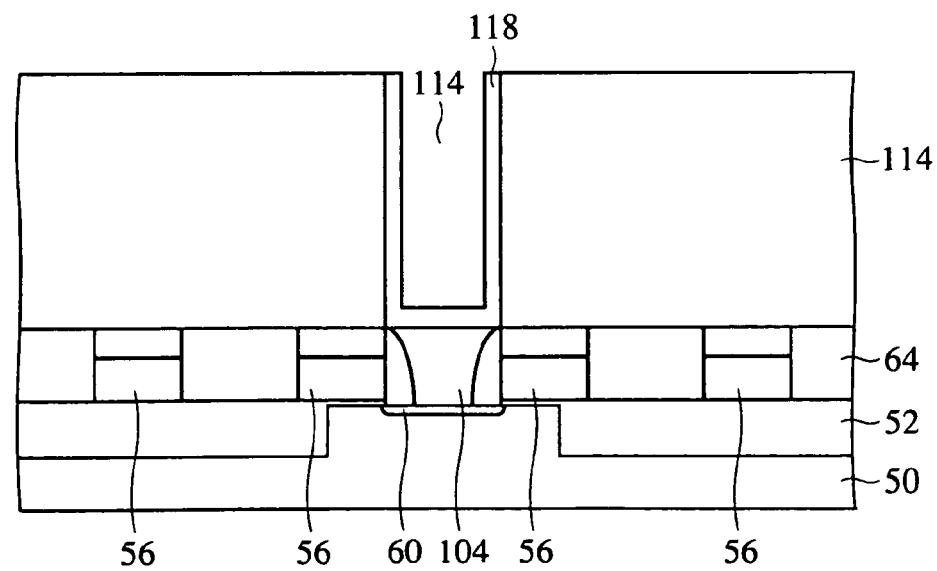
Figure 40C:
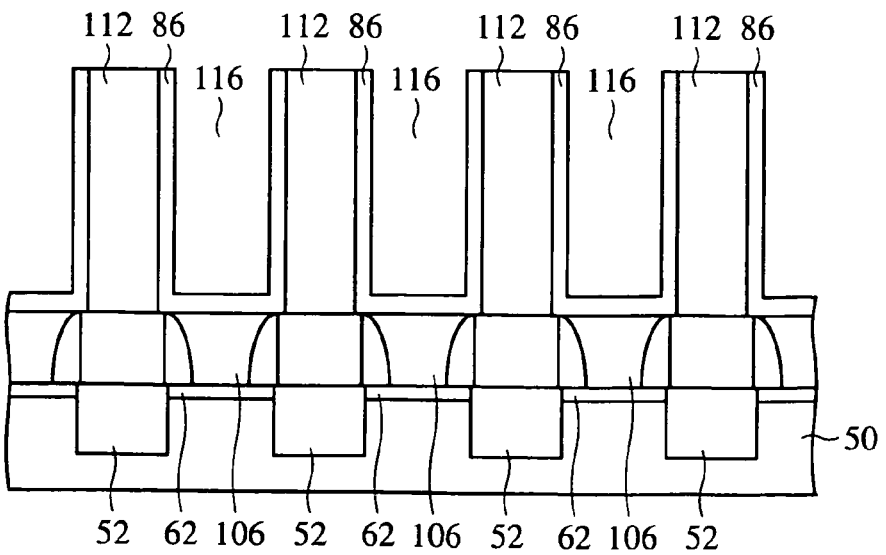

Subsequently, an about 50 nm-thick highly phosphorus-doped polycrystalline silicon film is formed by, e.g., CVD method, and the polycrystalline silicon film on the inter-layer insulation film 112 is completely removed by CMP method. Thus, the contact conducting film 118 and the storage electrode 86 can be formed by self-alignment respectively in the through-hole 114 and the through-hole 116 (FIG. 37C, FIG. 40C).

Then, an about 4 nm-thick silicon nitride film is deposited by, e.g. CVD method and then thermally treated for 10 minutes at 800° C. in a wet oxygen atmosphere to oxidize the surface of the silicon nitride film to form the dielectric film 88 of a silicon oxynitride film of an about 4 nm-thick converted to silicon oxide film.

Figure 38A:
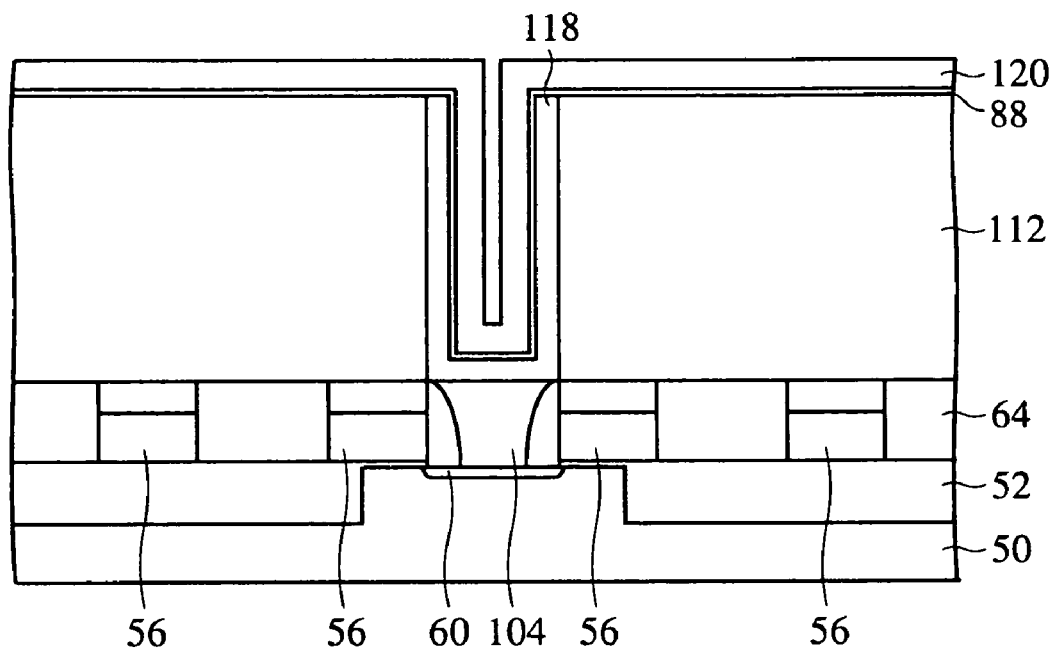
Figure 41A:
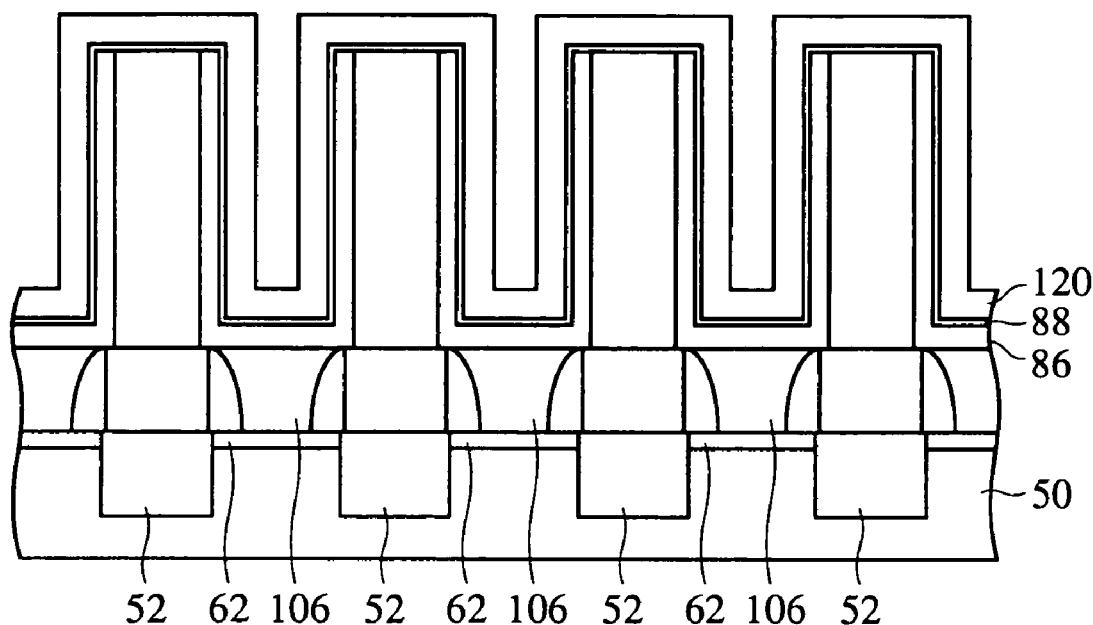

Then, an about 100 nm-thick phosphorus-doped polycrystalline silicon film 120 is deposited by, e.g., CVD method (FIG. 38A, FIG. 41A).

Figure 38B:
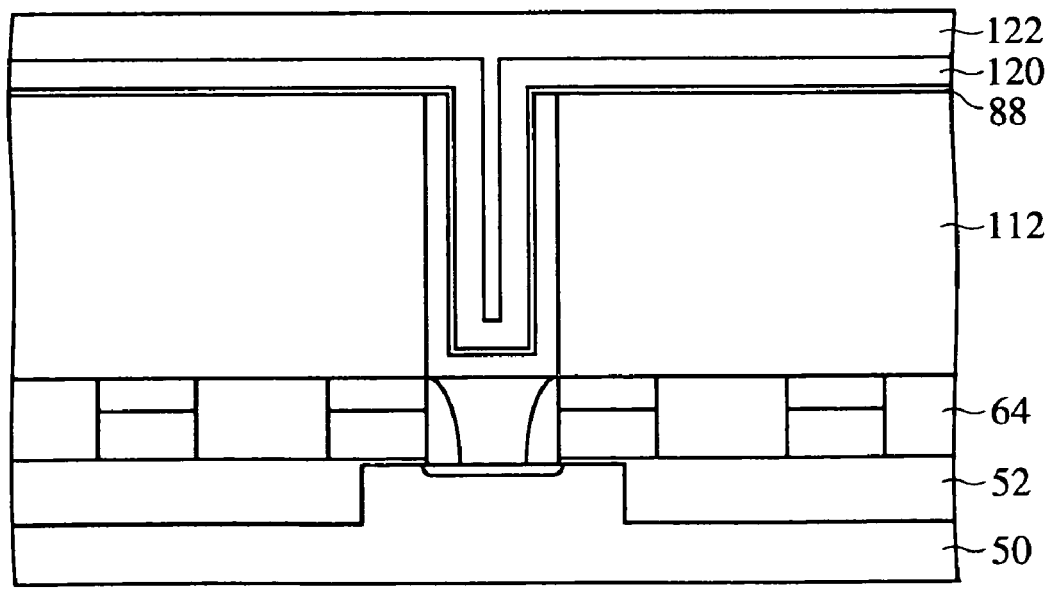
Figure 41B:
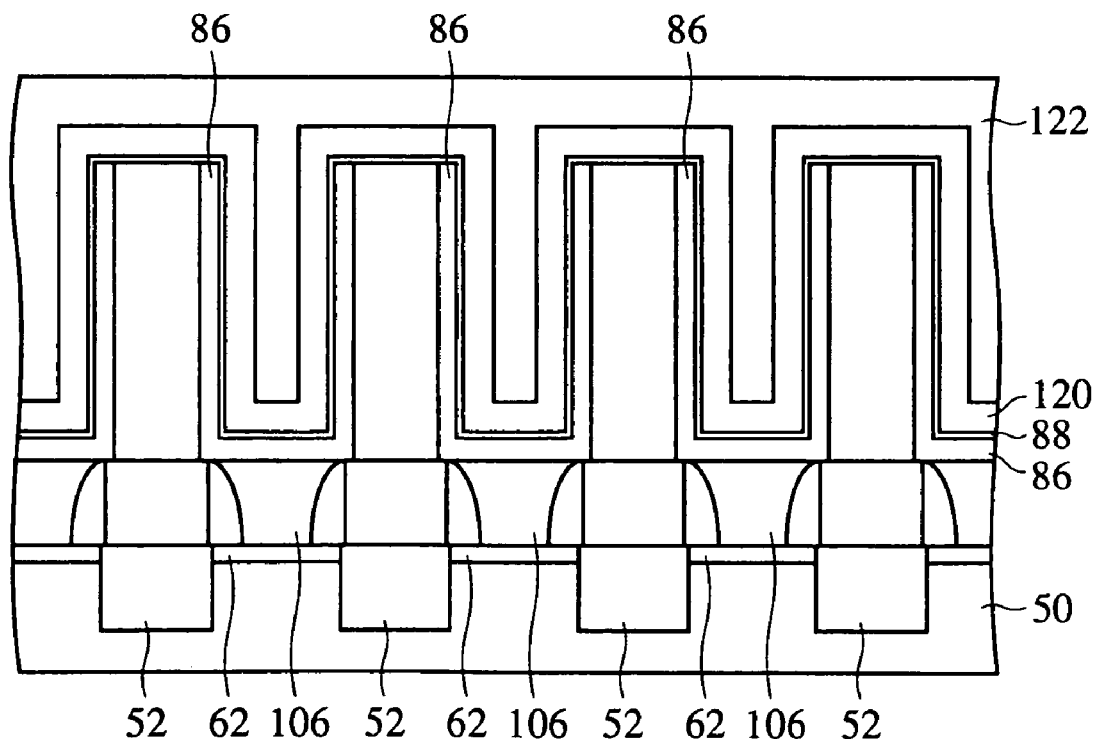

Subsequently, a silicon oxide film is deposited by, e.g., CVD method to form the inter-layer insulation film 122 (FIG. 38B, FIG. 41B).

Then, the inter-layer insulation film 122 and the polycrystalline silicon film 120 are patterned to form the opposed electrode 90 formed of the polycrystalline silicon film 120.

Figure 39A:
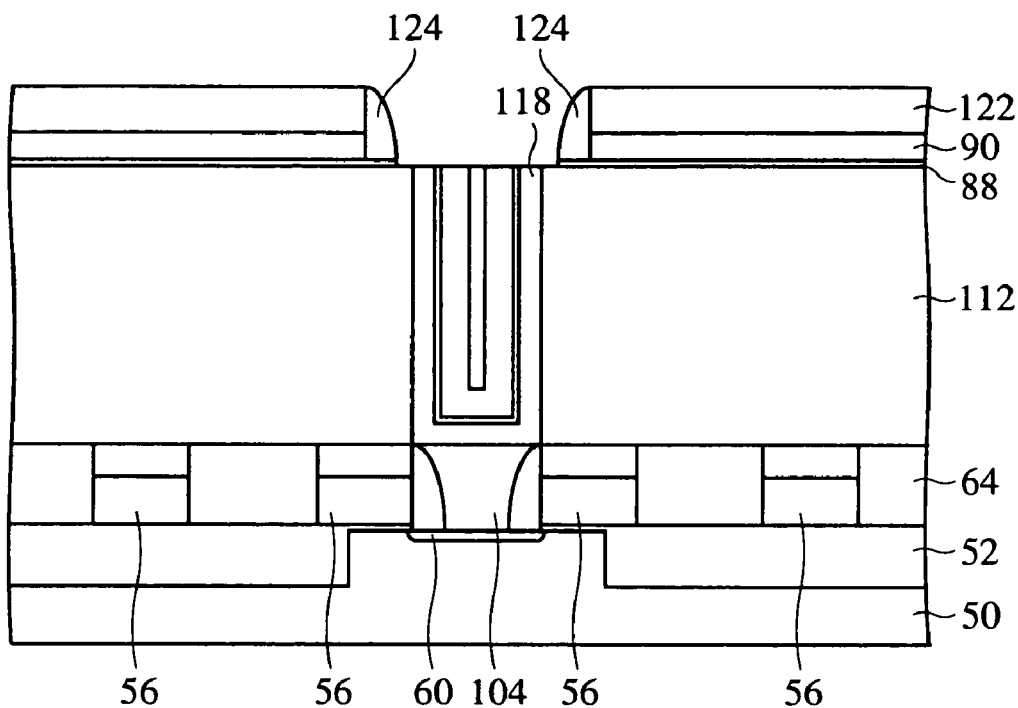
Figure 39B:
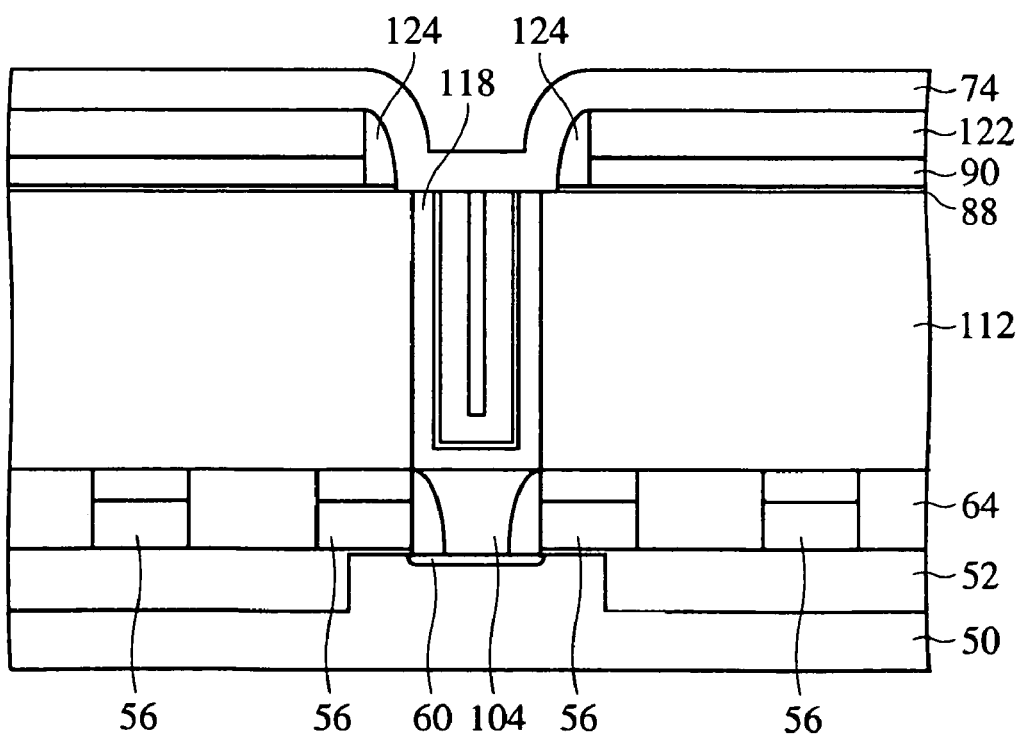
Figure 42A:
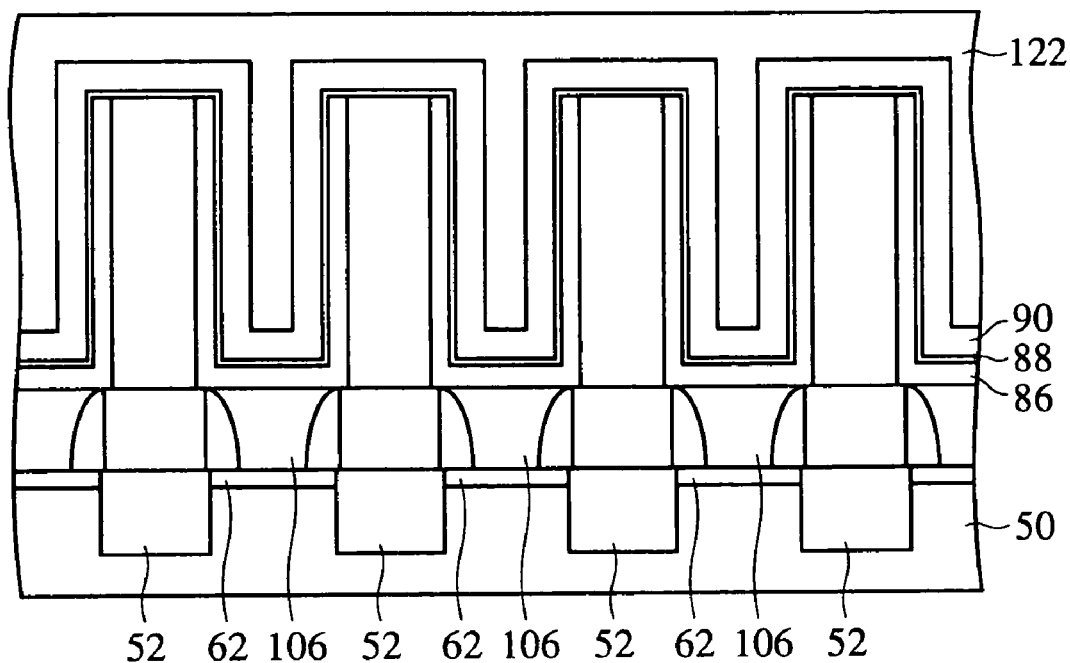

Then, a silicon oxide film is deposited on the entire surface by, e.g., CVD method and then anisotropically etched to form the sidewall insulation film 124 on the side walls of the inter-layer insulation film 122 and of the opposed electrode 90 (FIG. 39A, FIG. 42A). At this time, the dielectric film 88 on the contact conducting film 118 is removed to expose the contact conducting film 118.

Figure 42B:
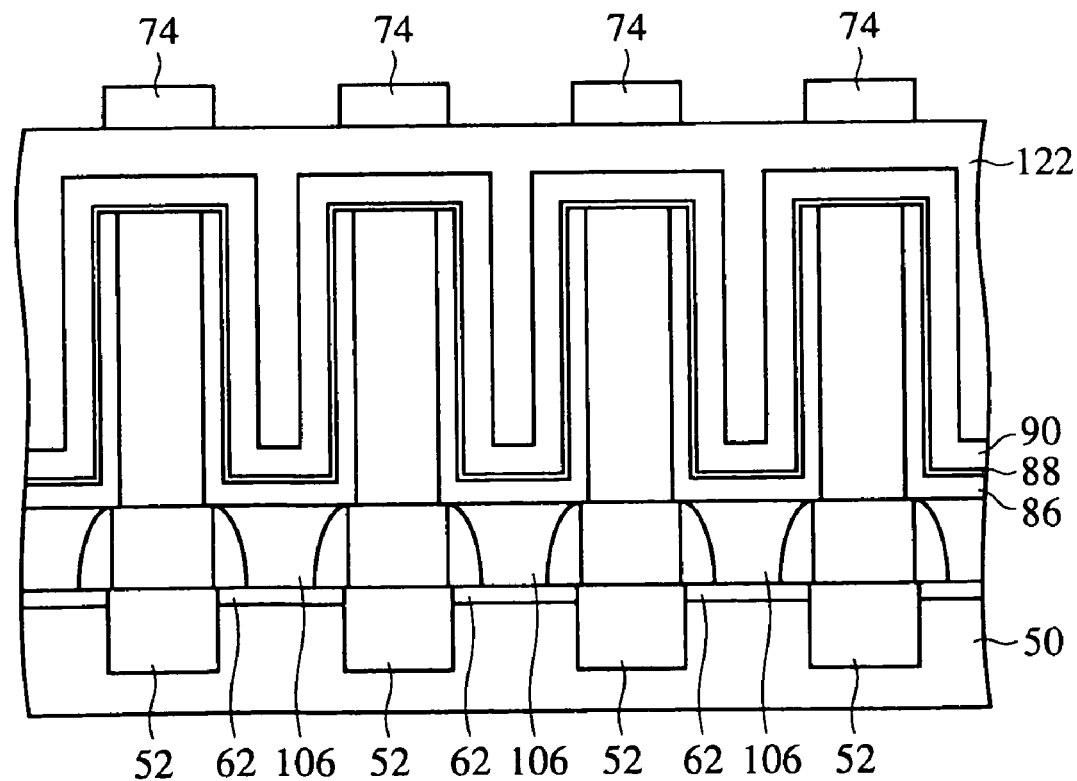

Next, continuously an about 50 nm-thick titanium film is deposited by, sputtering, and an about 50 nm-thick TiN film and an about 200 nm-thick tungsten film are deposited by, e.g., CVD method. Then, the laminated film of the W film/TiN film/Ti film is patterned by the usual lithography and etching to form the bit lines 74 (FIG. 38B, FIG. 42B).

Thus, a DRAM comprising memory cells each including 1 transistor and 1 capacitor is constituted.

As described above, according to the present embodiment, by the use of the method for forming the self-aligned contact of the second embodiment, a DRAM including the bit lines above the capacitors can be also formed.

Figure 43:
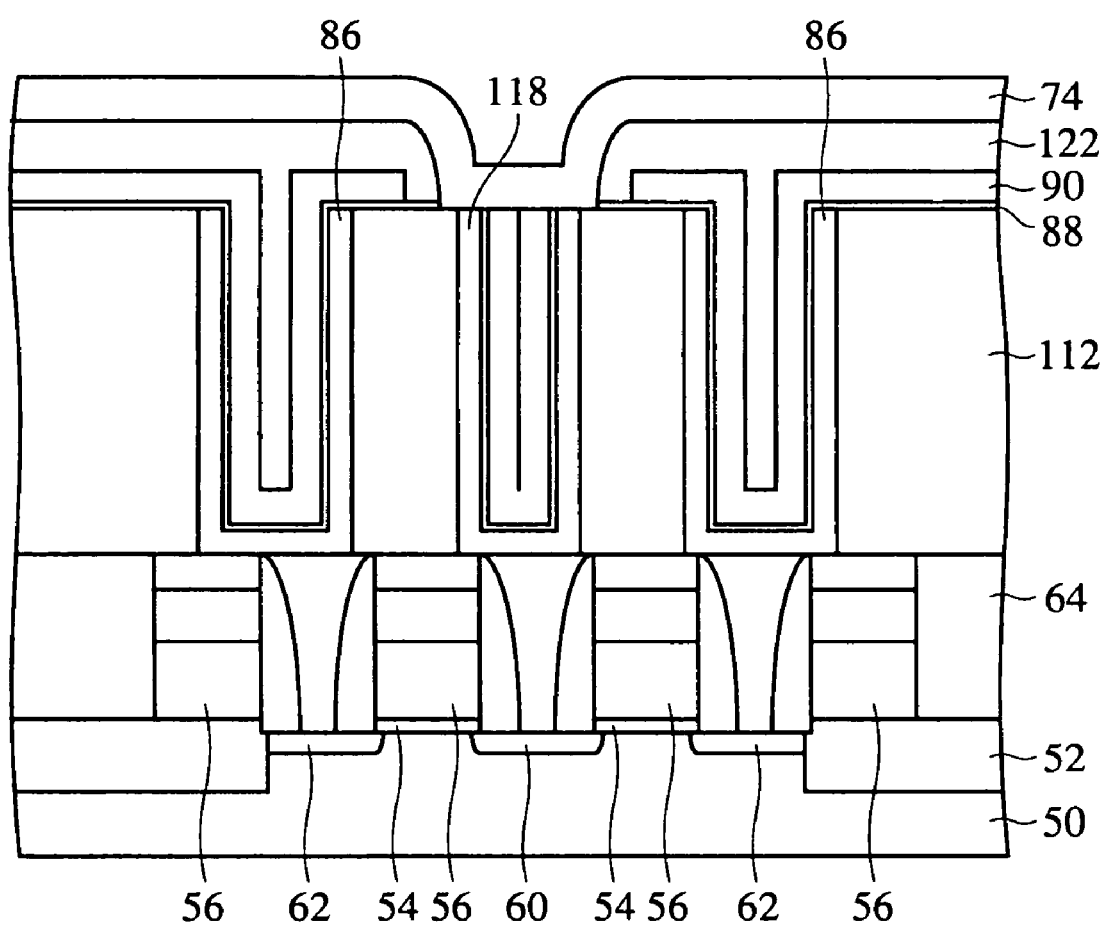
FIG. 43 is a diagrammatic sectional view of the semiconductor device according to one modification of the ninth embodiment of the present invention, which show a structure thereof.

In the present embodiment, the DRAM is constituted based on the layout of FIGS. 7A and 7B, and it is also possible to constitute the DRAM shown in FIG. 43, based on the layout of, e.g., FIGS. 3A and 3B. The DRAM of FIG. 43 can be fabricated by the fabrication method according to the present embodiment by using the layout of FIGS. 3A and 3B.

The present embodiment is applied to the DRAM described in, e.g., Japanese Patent Laid-Open Publication No. 274278/1996 filed by the applicant of the present application but is applicable to devices of other structures.

A Tenth Embodiment

The semiconductor device and the method for fabricating the same according to a tenth embodiment of the present invention will be explained with reference to FIGS. 44, 45A-45C and 46A-46C. The same members of the present embodiment as the semiconductor device according to the third to the ninth embodiments shown in FIGS. 7A to 43 and the method for fabricating the same are represented by the same reference numbers not to repeat or to simplify their explanation.

Figure 44:
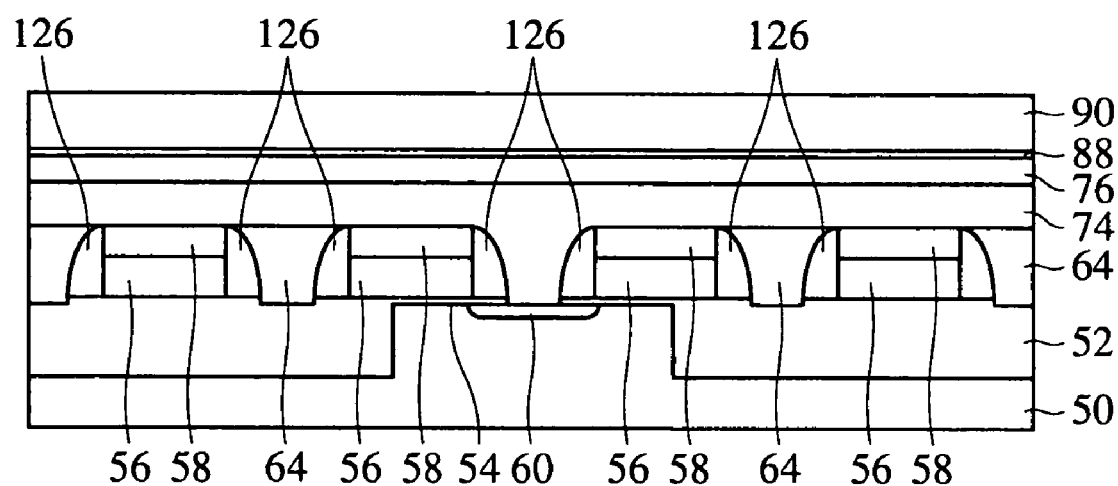
FIG. 44 is a sectional view of the semiconductor device according to a tenth embodiment of the present invention, which shows the structure thereof.

FIG. 44 is a diagrammatic sectional view of the semiconductor device according to the present embodiment, which shows a structure thereof. FIGS. 45A-45C and 46A-46C are sectional views of the semiconductor device according to the present embodiment in the steps of the method for fabricating the same, which explain the method.

In the semiconductor device and the method for fabricating the same according to the third to the ninth embodiments, DRAMs fabricated by using the techniques for forming the self-aligned contacts of the first or the second embodiment have been explained. Even by the use of the method for fabricating the conventional semiconductor device shown in FIGS. 51A-51D, it is possible to make a photoresist size for opening the contact holes large and make alignment allowance large.

The semiconductor device and the method for fabricating the same according to the present embodiment can simplify lithography for the conventional self-aligned contact forming technique.

First, the structure of the semiconductor device according to the present embodiment will be explained with reference to FIG. 44. The plan view of the semiconductor device according to the present embodiment is the same as that of the semiconductor device according to the third embodiment shown in FIGS. 7A and 7B. FIG. 44 is a diagrammatic sectional view of the semiconductor device according to the present embodiment along the line X-X' in FIG. 7A. The sectional view of the semiconductor device according to the present embodiment along the line Y-Y' in FIG. 7B is the same as that of the semiconductor device according to the third embodiment.

A device isolation film 52 for isolating devices is formed, buried in a silicon substrate 50. A plurality of word lines 56 are formed, through a gate insulation film 54, on the silicon substrate 50 with the device isolation film 52 buried in, extended parallel with each other and vertically of the sheet of the drawing. The word lines 56 have the upper surfaces covered with an etching stopper film 58 and the side walls covered with a sidewall insulation film 126 etching characteristics of which are substantially equal to those of the etching stopper film 58. Impurity diffused layers 60, 62 are formed in the silicon substrate 50 on both sides of the word lines 56. The gate electrodes provided by the word lines 56, and the impurity diffused layers 60, 62 constitute a transfer transistor. An inter-layer insulation film 64 having a substantially equal height as the etching stopper film 58 is buried between the word lines 56. On the etching stopper film 58 and the inter-layer insulation film 64, there are formed a plurality of bit lines 74 extended parallel with each other and horizontally of the sheet of the drawing. The bit lines 74 are connected to the impurity diffused layer 60 at locations where the bit lines 74 intersect an active region defined by the device isolation film 52. A storage electrode 86 is formed on the impurity diffused layer 62. An opposed electrode 90 is formed on the storage electrode 86 through a dielectric film 88. Thus, the storage electrode 86, the dielectric film 88 and the opposed electrode 90 constitute a capacitor.

Thus, a DRAM comprising memory cells each including 1 transistor and 1 capacitor is constituted.

Then, the semiconductor device and the method for fabricating the same according to the present embodiment will be detailed in accordance with the method for fabricating the semiconductor device according to the present embodiment. FIGS. 45A-45C and 46A-46C are sectional views of the semiconductor device according to the semiconductor device along the line X-X' in FIG. 7A in the steps of the method for fabricating the same.

First, trenches are formed in regions of, e.g., a p-type silicon substrate 50, where a device isolation film is formed are formed by the usual lithography and etching.

Then, a silicon oxide film is deposited by, e.g., CVD method, and then the surface of the silicon oxide film is polished to leave the silicon oxide film only in the trenches formed in the silicon substrate 50. Thus, the device isolation film 52 is formed, buried in the silicon substrate 50.

Subsequently, the silicon substrate 50 with the device isolation film 52 formed in is thermally oxidized to form the gate insulation film 54 of, e.g., an about 6 nm-thick silicon oxide film on the surface of the silicon substrate 50.

Then, an about 100 nm-thick polycrystalline silicon film and an about 100 nm-thick WSi film are formed on the gate insulation film 54 by, e.g., CVD method. The polycide film of the thus-deposited polycrystalline silicon film and WSi film are to be the word lines.

Then, an about 200 nm-thick silicon nitride film is deposited on the polycide film by, e.g., CVD method. The silicon nitride film is to be the etching stopper film to be used in etching the inter-layer insulation film.

Subsequently, the laminated film of the silicon nitride film and the polycide film is patterned by the usual lithography and etching to form the word lines 56 of the polycide structure having the upper surface covered with the etching stopper film 58 of the silicon nitride film.

Then, with the word lines 56 as a mask phosphorus ions, for example, are implanted into the silicon substrate 50 to form the impurity diffused layers 60, 62 in an active region. The ions are implanted under conditions of, e.g., a 30 keV acceleration energy and a $2\times10_{13}$ cm$_{-2}$ dose.

Figure 45A:
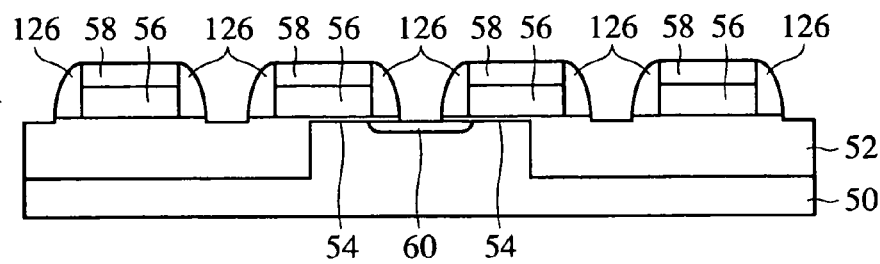
FIGS. 45A-45C and 46A-46C are sectional views of the semiconductor device according to the tenth embodiment of the present invention in the steps of the method for fabricating the semiconductor device, which show the method.

Next, an about 80 nm-thick silicon nitride film is deposited on the entire surface by, e.g., CVD method and then anisotropically etched to form the sidewall insulation film 126 on the side walls of the word lines 56 and the etching stopper film 58 (FIG. 45A). The word lines 56 are completely covered with the etching stopper film 58 and the sidewall insulation film 126.

Figure 45B:
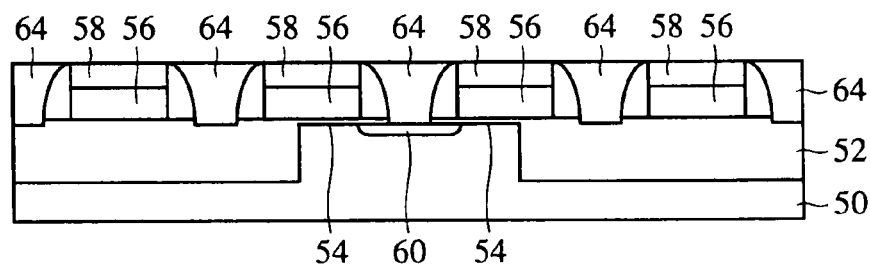

Subsequently, an about 50 nm-thick silicon oxide film and an about 200 nm-thick BPSG film are deposited on the entire surface by, e.g., CVD method and then is polished by, e.g., CMP method until the etching stopper film 58 is exposed on the surface to form the inter-layer insulation film 64 buried between the word lines 56 (FIG. 45B).

Figure 45C:
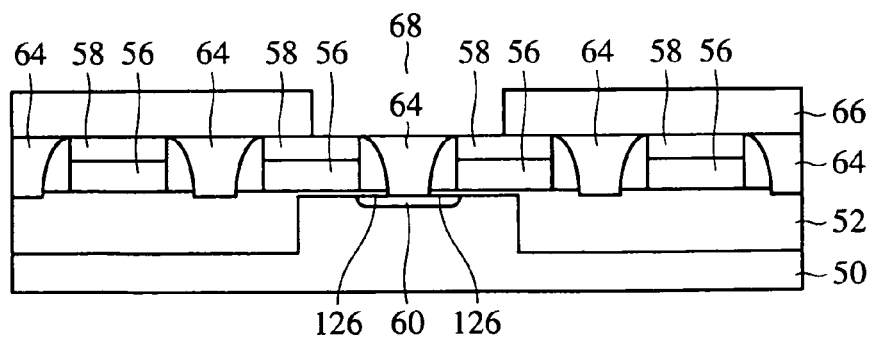

Then, a photoresist 66 for forming a contact hole for exposing the impurity diffused layer 60 on the inter-layer insulation film 64 by the usual lithography technique (FIG. 45C). Because of the etching stopper film 58 on the word lines 56, an opening 68 can be extended over the word lines 56. Accordingly, the photoresist 66 can have the same pattern as that used in the method for fabricating the semiconductor device according to, e.g., the third embodiment shown in FIG. 13A. As a result, the lithography for forming the photoresist 66 can have a large alignment allowance and have a large pattern size, which simplifies the lithography.

Figure 46A:
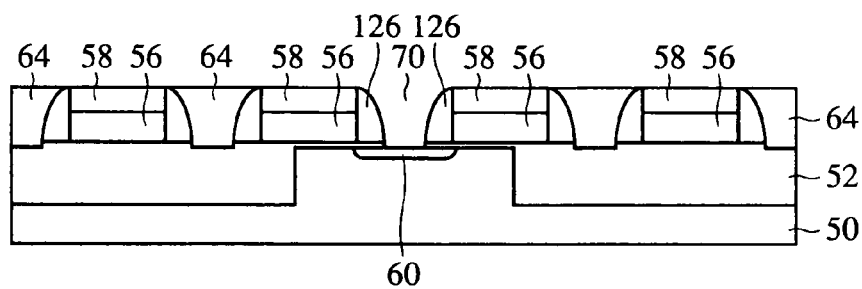
Figure 46B:
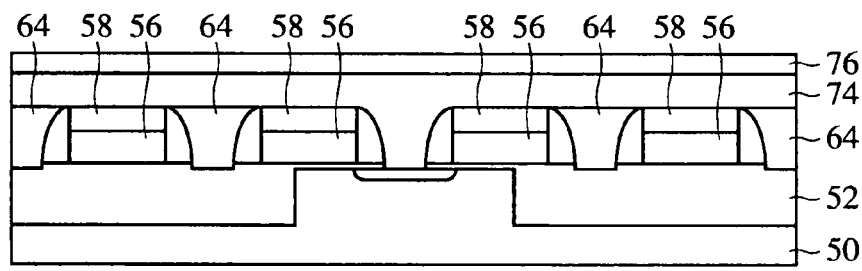

Subsequently, with the etching stopper film 58 and the sidewall insulation film 128 as a mask, the inter-layer insulation film 64 is anisotropically etched under conditions which allows the silicon nitride film has a sufficiently low etching rate to form a contact hole 70 opened on the impurity diffused layer 60 (FIG. 46A). The contact hole 70 is opened as shown in FIG. 13B by using the photoresist 66 and the etching stopper film 58 as a mask.

Then, an about 50 nm-thick phosphorus-doped polycrystalline silicon film, an about 100 nm-thick WSi film and an about 200 nm-thick silicon nitride film are continuously deposited by, e.g., CVD method.

Figure 46C:
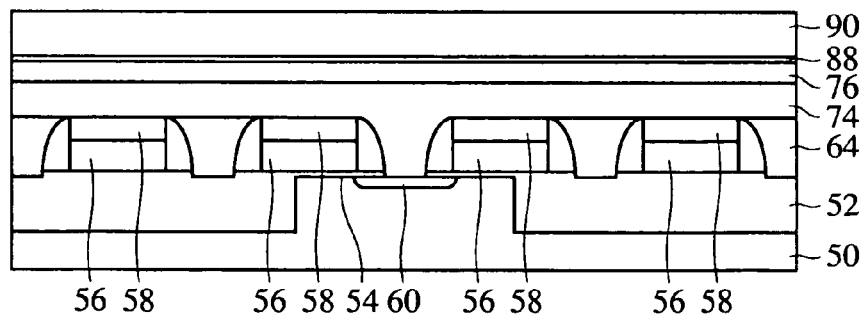
Figure 47A:
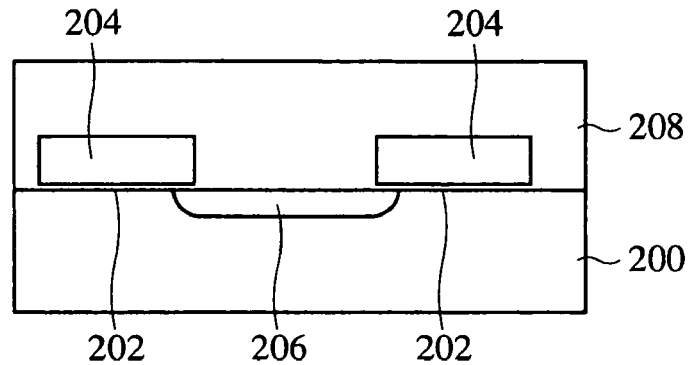
FIGS. 47A-47C are sectional views of the first conventional semiconductor device in the steps of the method for fabricating the semiconductor device, which show the method.
Figure 47B:
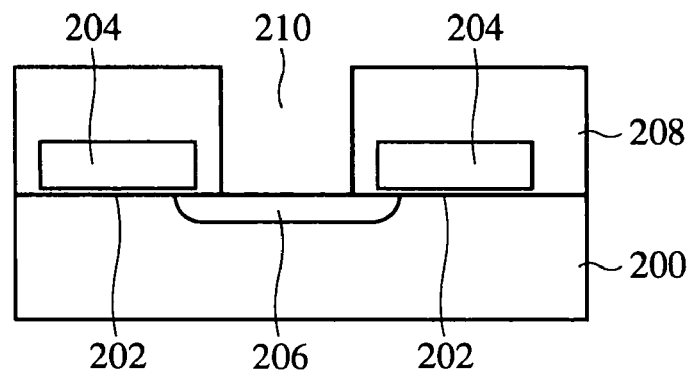
Figure 47C:
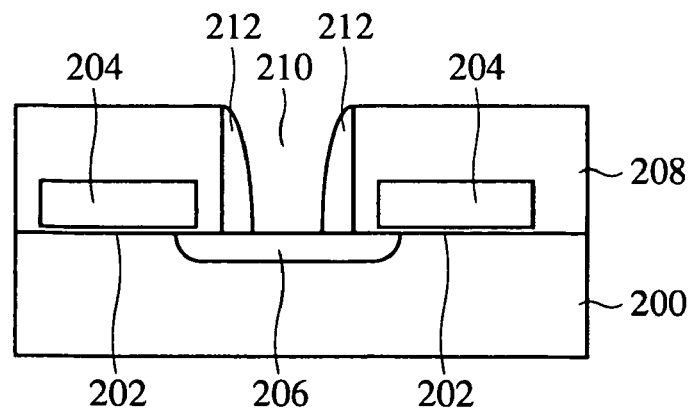
Figure 48A:
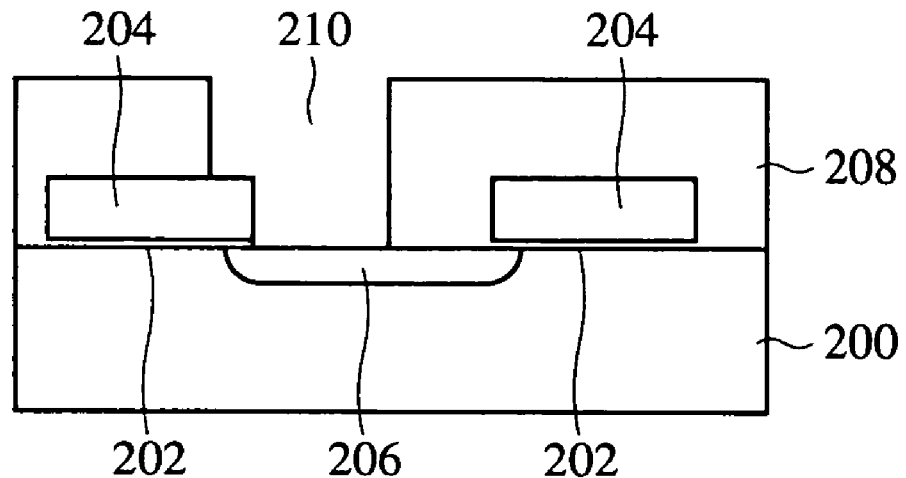
FIGS. 48A and 48B are views explaining the problems of the method for fabricating the first conventional semiconductor device.
Figure 48B:
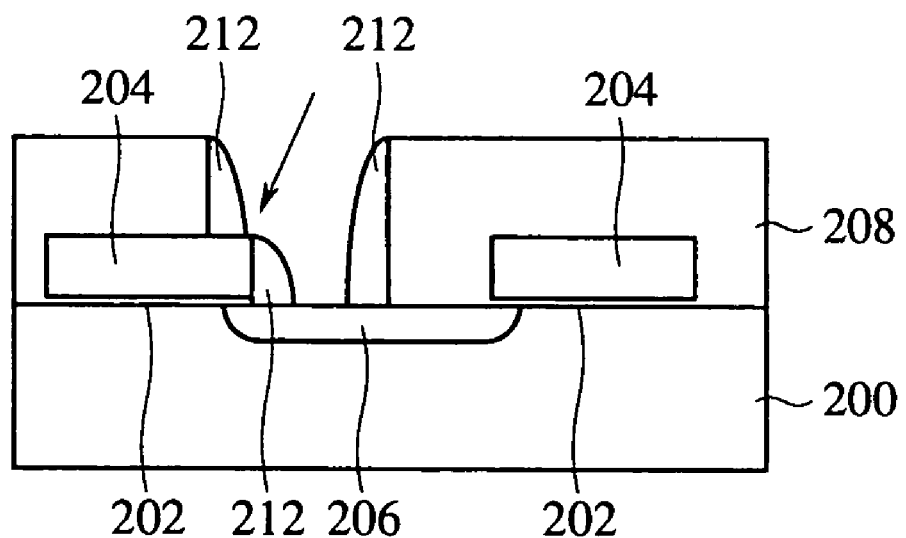
Figure 49A:
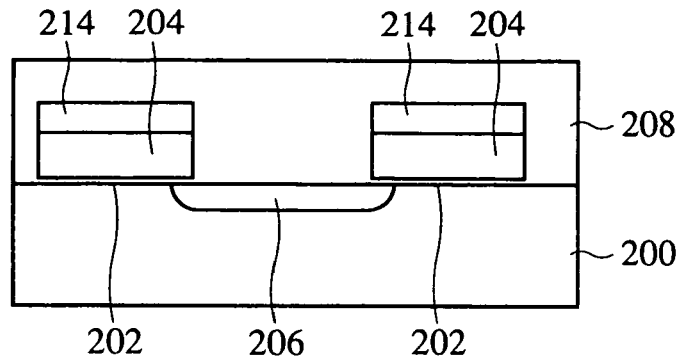
FIGS. 49A-49C are sectional views of the second conventional semiconductor device in the steps of the method for fabricating the semiconductor device, which show the method.
Figure 49B:
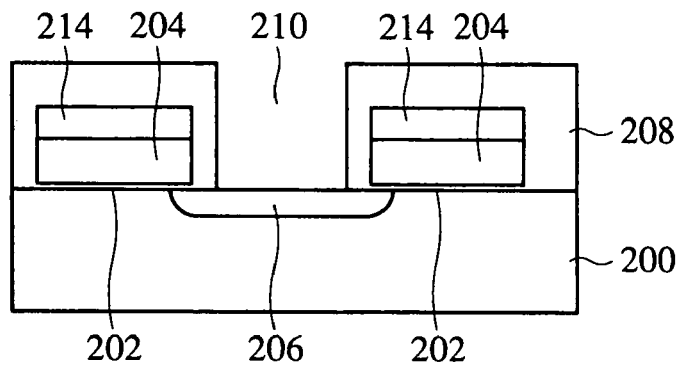
Figure 49C:
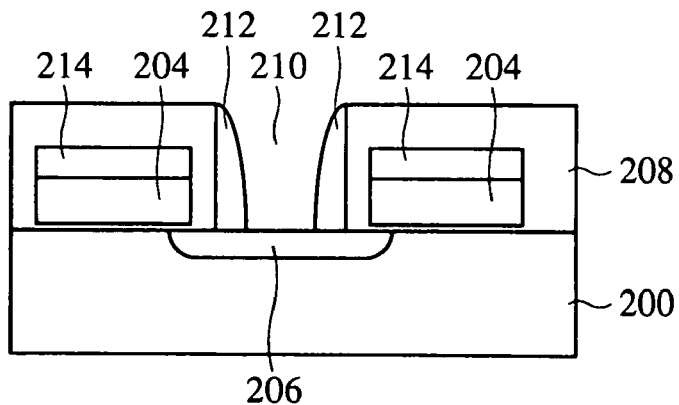
Figure 50A:
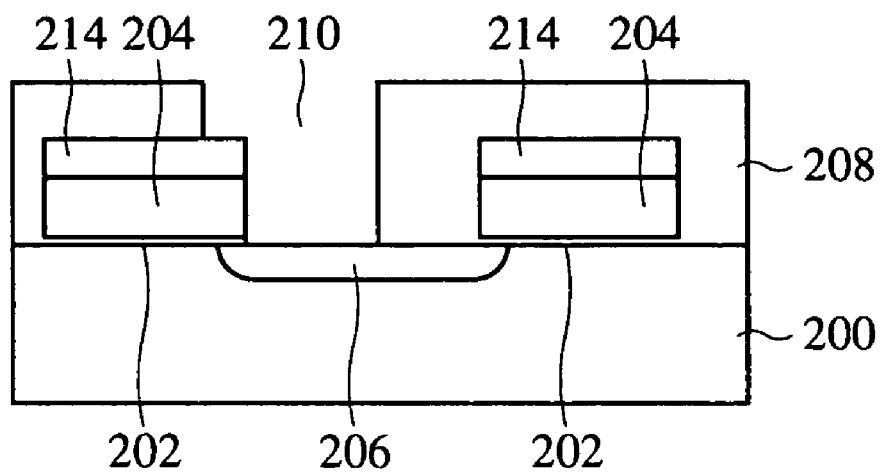
FIGS. 50A and 50B are views explaining the effect of the method for fabricating the second conventional semiconductor device.
Figure 50B:
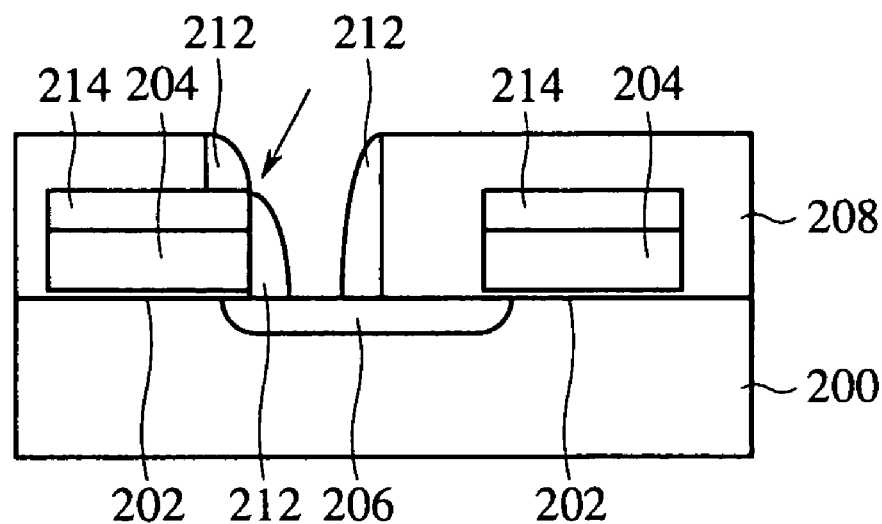
Figure 51A:
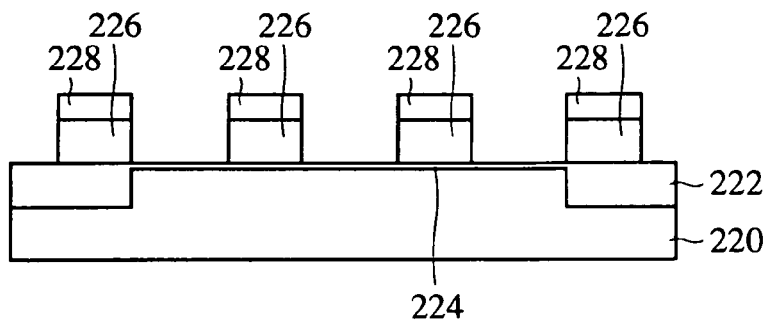
FIGS. 51A-51D are sectional views of the third conventional semiconductor device in the steps of the method for fabricating the semiconductor device, which show the method.
Figure 51B:
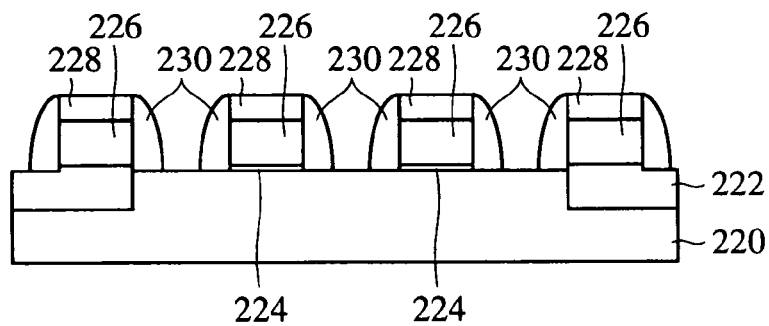
Figure 51C:
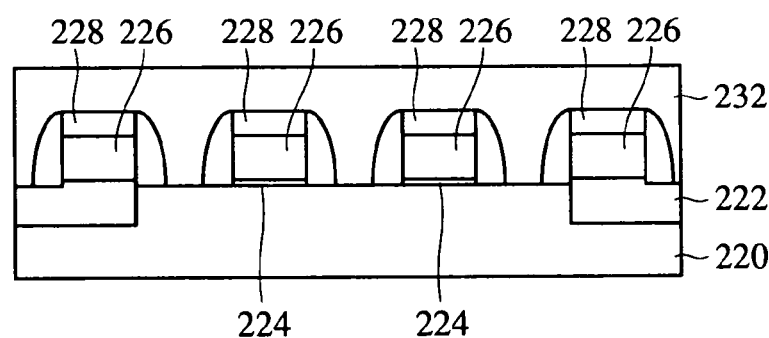
Figure 51D:
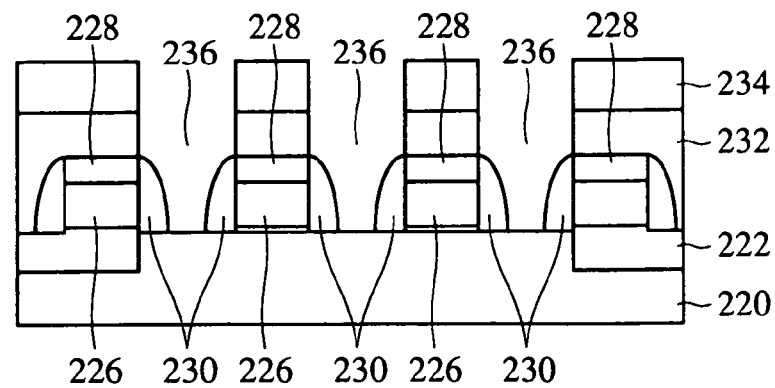
Figure 52A:
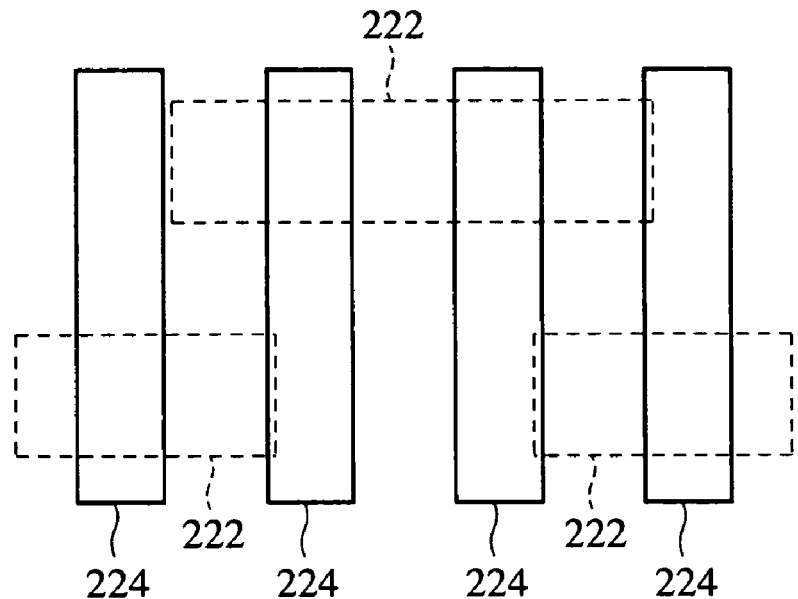
FIGS. 52A and 52B are plan views of a pattern layout used in the method for fabricating the third conventional semiconductor device.
Figure 52B:
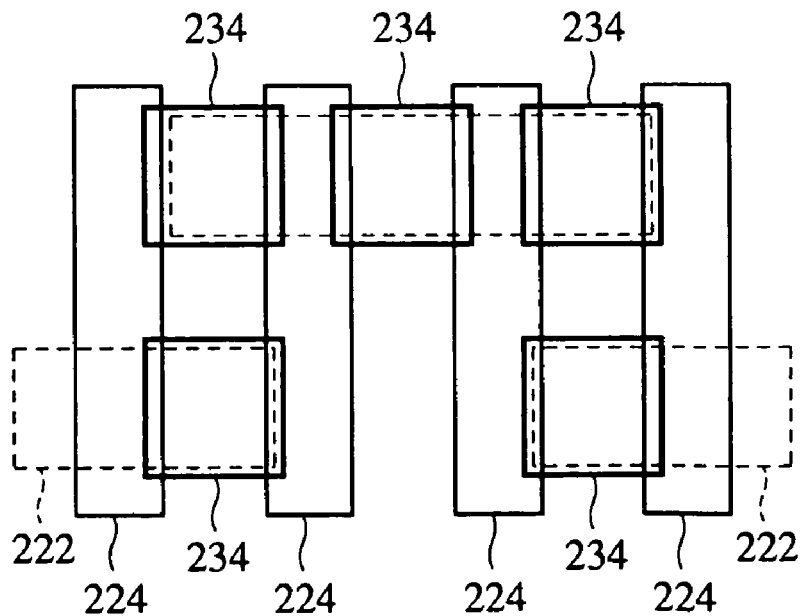
Figure 53:
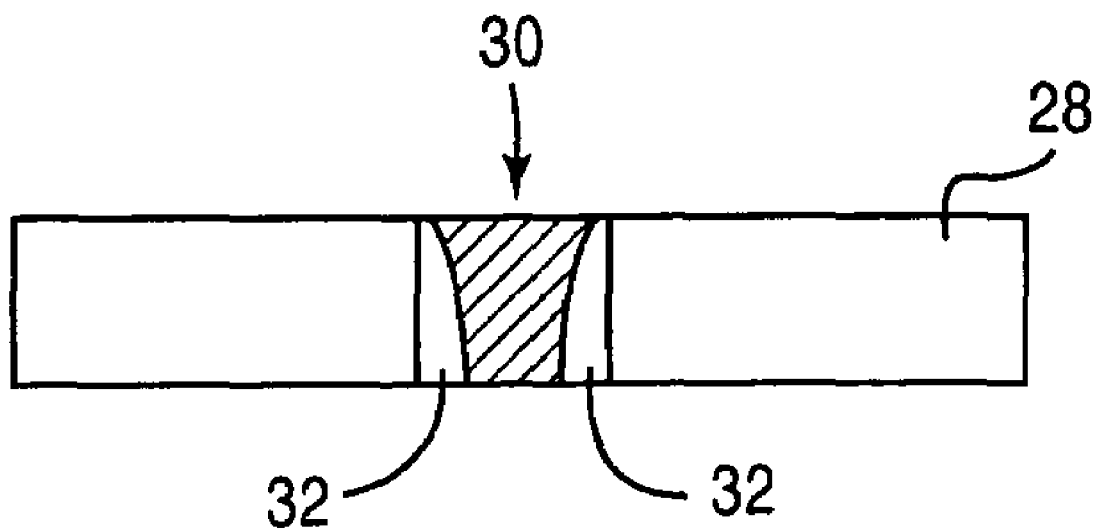
FIG. 53 is a cross-sectional view along the extending direction of the conductor patterns of the semiconductor device according to the second embodiment of the present invention, which shows a structure thereof.

Then, the laminated film of the silicon nitride film the WSi film and the polycrystalline silicon film is patterned by the usual lithography and etching to form bit lines 74 of the polycide structure having the upper surface covered with the etching stopper film 76 of the silicon nitride film (FIG. 46C).

Subsequently, in the same way as in the method for fabricating the semiconductor device according to, e.g., the third embodiment shown in FIG. 10A to FIG. 10C, a capacitor comprising the storage electrode 86, the dielectric film 88 and the opposed electrode 90 is formed (FIG. 46C).

Thus, a DRAM comprising memory cells each including 1 transistor and 1 capacitor is constituted.

As described above, according to the present embodiment, even in a case that the structure used in the conventional self-aligned contact is used, a photoresist size for opening the contact holes can be large, and a large disalignment allowance is possible. Accordingly, the lithography step of opening the bit line contact hole can be simple.

In the present embodiment, the etching stopper film 58 is formed directly on the word lines 56, but as in the semiconductor device according to the fourth embodiment, the insulation film 94 of low dielectric constant is disposed between the word lines 56 and the etching stopper film 58.

What is claimed is:

1. A semiconductor device comprising:
   a semiconductor substrate;
   a plurality of word lines formed on the semiconductor substrate and extended in a first direction;
   a first insulation film formed on the word lines and the semiconductor substrate;
   a plurality of bit lines formed on the first insulation film and extended in a second direction;
   an etching stopper film covering upper surfaces of the bit lines;
   a contact hole located in a part of a region between the adjacent bit lines, having ends thereof defined by the bit lines;
   a second insulation film which film apace between said plurality of bit lines where the contact hole is not formed and not exceeding over the etching stopper film;
   a sidewall insulation film, formed in the contact hole, covering a side wall of the second insulation film, side walls of the bit lines and side walls of the etching stopper film; and
   a capacitor having one electrode connected to the semiconductor substrate through the contact hole.

2. A semiconductor device according to claim 1, wherein said one electrode of the capacitor is connected to the semiconductor substrate through a plug buried in the first insulation film.

* * * * *